(12) United States Patent
Ye et al.

(10) Patent No.: US 7,233,874 B2
(45) Date of Patent: Jun. 19, 2007

(54) METHOD AND APPARATUS FOR MONITORING INTEGRATED CIRCUIT FABRICATION

(75) Inventors: Jun Ye, Palo Alto, CA (US); Xun Chen, Palo Alto, CA (US)

(73) Assignee: Brion Technologies, Inc., Santa Clara, CA (US)

( * ) Notice: Subject to any disclaimer, the term of this patent is extended or adjusted under 35 U.S.C. 154(b) by 243 days.

(21) Appl. No.: 11/041,807

(22) Filed: Jan. 24, 2005

(65) Prior Publication Data

US 2005/0125184 A1 Jun. 9, 2005

Related U.S. Application Data

(62) Division of application No. 10/756,718, filed on Jan. 13, 2004, now Pat. No. 6,959,255, which is a division of application No. 10/677,563, filed on Oct. 2, 2003, now Pat. No. 6,807,503.

(60) Provisional application No. 60/423,488, filed on Nov. 4, 2002.

(51) Int. Cl.
*G06F 19/00* (2006.01)

(52) U.S. Cl. .......................... 702/117; 438/18
(58) Field of Classification Search ................ 702/117, 702/118, 182–185; 438/5, 10, 11, 14, 17, 438/18, 400, 200
See application file for complete search history.

(56) References Cited

U.S. PATENT DOCUMENTS

| 4,251,160 A | 2/1981 | Bouwhuis et al. |
| 4,585,342 A | 4/1986 | Lin et al. |

(Continued)

FOREIGN PATENT DOCUMENTS

| EP | 0 628 806 | 4/1994 |
| EP | 1 139 174 | 10/2001 |

(Continued)

OTHER PUBLICATIONS

"A New Mask Evaluation Tool, the Microlithography Simulation Microscope Aerial Image Measurement System", Budd, et al., SPIE vol. 2197, 1994, pp. 530-540.

(Continued)

*Primary Examiner*—Edward Raymond
(74) *Attorney, Agent, or Firm*—Neil A. Steinberg

(57) ABSTRACT

In one aspect, the present invention is a sensor unit for sensing process parameters of a process to manufacture an integrated circuit using integrated circuit processing equipment. In one embodiment, the sensor unit includes a substrate having a wafer-shaped profile and a first sensor, disposed on or in the substrate, to sample a first process parameter. The sensor unit of this embodiment also includes a second sensor, disposed on or in the substrate, to sample a second process parameter wherein the second process parameter is different from the first process parameter. In one embodiment, the sensor unit includes a first source, disposed on or in the substrate, wherein first source generates an interrogation signal and wherein the first sensor uses the interrogation signal from the first source to sample the first process parameter. The sensor unit may also include a second source, disposed on or in the substrate, wherein second source generates an interrogation signal and wherein the second sensor uses the interrogation signal from the second source to sample the second process parameter. The first sensor and the first source may operate in an end-point mode or in a real-time mode. In this regard, the first sensor samples the first parameter periodically or continuously while the sensor unit is disposed in the integrated circuit processing equipment and undergoing processing. In one embodiment, the first sensor is a temperature sensor and the second sensor is a pressure sensor, a chemical sensor, a surface tension sensor or a surface stress sensor.

22 Claims, 37 Drawing Sheets

U.S. PATENT DOCUMENTS

| | | | |
|---|---|---|---|
| 4,639,590 A | 1/1987 | Butterwick et al. |
| 4,684,884 A | 8/1987 | Soderlund |
| 4,701,606 A | 10/1987 | Tanimoto et al. |
| 4,929,083 A | 5/1990 | Brunner |
| 5,191,200 A | 3/1993 | van der Werf et al. |
| 5,202,748 A | 4/1993 | MacDonald et al. |
| 5,235,400 A | 8/1993 | Terasawa et al. |
| 5,316,896 A | 5/1994 | Fukuda et al. |
| 5,348,837 A | 9/1994 | Fukuda et al. |
| 5,418,598 A | 5/1995 | Fukuda et al. |
| 5,444,637 A | 8/1995 | Smesny et al. |
| 5,481,624 A | 1/1996 | Kamon |
| 5,491,724 A | 2/1996 | Altes |
| 5,594,328 A | 1/1997 | Lukaszek |
| 5,595,857 A | 1/1997 | Fukuda et al. |
| 5,597,868 A | 1/1997 | Kunz |
| 5,629,772 A | 5/1997 | Ausschnitt |
| 5,631,731 A | 5/1997 | Sogard |
| 5,638,211 A | 6/1997 | Shiraishi |
| 5,683,562 A | 11/1997 | Schaffar et al. |
| 5,700,601 A | 12/1997 | Hasegawa et al. |
| 5,746,513 A | 5/1998 | Renken |
| 5,795,688 A | 8/1998 | Burdorf et al. |
| 5,795,993 A | 8/1998 | Pfeifer et al. |
| 5,828,455 A | 10/1998 | Smith et al. |
| 5,830,372 A | 11/1998 | Hierold |
| 5,866,935 A | 2/1999 | Sogard |
| 5,888,675 A | 3/1999 | Moore et al. |
| 5,891,959 A | 4/1999 | Kunz |
| 5,895,741 A | 4/1999 | Hasegara et al. |
| 5,898,479 A | 4/1999 | Hubbard et al. |
| 5,907,820 A | 5/1999 | Pan |
| 5,914,774 A | 6/1999 | Ota |
| 5,967,661 A | 10/1999 | Renken et al. |
| 5,969,639 A | 10/1999 | Lauf et al. |
| 5,973,316 A | 10/1999 | Ebbesen et al. |
| 5,978,085 A | 11/1999 | Smith et al. |
| 6,002,740 A | 12/1999 | Cerrina et al. |
| 6,005,682 A | 12/1999 | Wu et al. |
| RE36,509 E | 1/2000 | Shigihara |
| 6,033,922 A | 3/2000 | Rowland et al. |
| 6,040,936 A | 3/2000 | Kim et al. |
| 6,046,398 A | 4/2000 | Foote et al. |
| 6,051,443 A | 4/2000 | Ghio et al. |
| 6,052,238 A | 4/2000 | Ebbesen et al. |
| 6,140,689 A | 10/2000 | Scheiter et al. |
| 6,160,621 A | 12/2000 | Perry et al. |
| 6,236,033 B1 | 5/2001 | Ebbesen et al. |
| 6,240,219 B1 | 5/2001 | Gregory |
| 6,244,121 B1 | 6/2001 | Hunter |
| 6,268,093 B1 | 7/2001 | Kenan et al. |
| 6,278,101 B1 | 8/2001 | Puyot |
| 6,285,020 B1 | 9/2001 | Kim et al. |
| 6,329,112 B1 | 12/2001 | Fukuda et al. |
| 6,335,220 B1 | 1/2002 | Shioyama et al. |
| 6,356,345 B1 | 3/2002 | McArthur et al. |
| 6,360,012 B1 | 3/2002 | Kreuzer |
| 6,362,907 B1 | 3/2002 | Stone et al. |
| 6,368,763 B2 | 4/2002 | Drksen et al. |
| 6,432,729 B1 | 8/2002 | Mundt et al. |
| 6,451,490 B1 | 9/2002 | Advocate et al. |
| 6,459,823 B2 | 10/2002 | Altunbasak et al. |
| 6,515,272 B1 | 2/2003 | Fontaine et al. |
| 6,534,798 B1 | 3/2003 | Scherer et al. |
| 6,542,835 B2 | 4/2003 | Mundt |
| 6,549,277 B1 | 4/2003 | Narushima et al. |
| 6,562,185 B2 | 5/2003 | Avanzino et al. |
| 6,582,619 B1 | 6/2003 | Mundt |
| 6,630,995 B1 | 10/2003 | Hunter |
| 6,642,063 B2 | 11/2003 | Mundt et al. |
| 6,671,660 B2 | 12/2003 | Freed |
| 6,693,708 B1 | 2/2004 | Hunter |
| 6,707,545 B1 | 3/2004 | Hunter |
| 6,721,045 B1 | 4/2004 | Hunter |
| 7,135,852 B2 * | 11/2006 | Renken et al. ........... 324/158.1 |
| 2001/0055415 A1 | 12/2001 | Nozaki |
| 2002/0003216 A1 | 1/2002 | Kida et al. |
| 2002/0005947 A1 | 1/2002 | Golberg et al. |
| 2002/0036775 A1 | 3/2002 | Wolleschensky et al. |
| 2002/0041377 A1 | 4/2002 | Hagiware et al. |
| 2002/0062206 A1 | 5/2002 | Liebchen |
| 2002/0067478 A1 | 6/2002 | Karpol et al. |
| 2002/0070355 A1 | 6/2002 | Ota |
| 2002/0105629 A1 | 8/2002 | Sandstrom et al. |
| 2002/0122187 A1 | 9/2002 | Bruce et al. |
| 2002/0134912 A1 | 9/2002 | Veneklasen et al. |
| 2002/0145717 A1 | 10/2002 | Baselmans et al. |
| 2002/0161557 A1 | 10/2002 | Freed |
| 2002/0165678 A1 | 11/2002 | Mundt |
| 2002/0167651 A1 | 11/2002 | Boonman et al. |
| 2002/0172876 A1 | 11/2002 | Baselmans |
| 2002/0177916 A1 | 11/2002 | Poolla et al. |
| 2002/0177917 A1 | 11/2002 | Polla et al. |
| 2002/0192598 A1 | 12/2002 | Hirayanagi |
| 2002/0193957 A1 | 12/2002 | Freed |
| 2003/0001107 A1 | 1/2003 | Kroon et al. |
| 2003/0017805 A1 | 1/2003 | Yeung et al. |
| 2003/0020917 A1 | 1/2003 | Mundt et al. |
| 2003/0027057 A1 | 2/2003 | Schroeder et al. |
| 2003/0027366 A1 | 2/2003 | Dulman et al. |
| 2003/0042433 A1 | 3/2003 | Kamijo |
| 2003/0047694 A1 | 3/2003 | Van Der Laan |
| 2003/0222049 A1 | 12/2003 | Mundt |
| 2004/0211922 A1 | 10/2004 | Kroon et al. |
| 2005/0117148 A1 | 6/2005 | Dirksen et al. |

FOREIGN PATENT DOCUMENTS

| | | |
|---|---|---|
| JP | 58079757 | 5/1983 |
| WO | WO 00/59206 | 10/2000 |
| WO | WO 02/17030 | 2/2002 |
| WO | WO 02/29495 | 4/2002 |

OTHER PUBLICATIONS

"Characterization of Lithographic System Performance Through Direct Aerial Image Measurements", C.H. Fields, SRC/SEMATECH, 1996 (96-MC-500).

"Aerial Image Measurements on a Commercial Stepper", Fields, et al., SPIE vol. 2197, 1994, pp. 585-595.

"A Novel High-Resolution Large-Field Scan-and-Repeat Projection Lithography System", K. Jain, SPIE vol. 1463 Optical/Laser Microlithography IV, 1991, pp. 666-677.

"Direct Aerial Image Measurements to Evaluate the Performance of an Extreme Ultraviolet Projection Lithography System", Fields, et al., J. Vac. Sci. Technol. B, vol. 14, No. 6, Microelectronics and Nanometer Structures, Nov./Dec. 1996, pp. 4000-4003.

"In Situ Measurement of an Image During Lithographic Exposure", Brunner et al., IEEE Electron Device Letters, vol. EDL-6, No. 7, Jul. 1985, pp. 329-331.

"Improving Photomask Linewidth Measurement Accuracy via Emulated Stepper Aerial Image Measurement", J. Potzick, SPIE vol. 2322, Photomask Technology and Management, 1994, pp. 353-359.

"Pattern Shape Analysis Tool for Quantitative Estimate of Photomask and Process", Yonekura, et al., Proceedings of SPIE vol. 4409, Photomask and Next-Generation Lithography Mask Technology VIII, 2001, pp. 204-211.

"Meeting the Challenge of Advanced Lithography Reticle Inspection", Zurbrick et al., SPIE vol. 2322, Photomask Technology and Management, 1994, pp. 7-15.

"In Situ Resolution and Overlay Measurement on a Stepper", Brunner et al., SPIE vol. 565, Micron and Submicron Integrated Circuit Metrology, 1985, pp. 6-13.

"Application of the Aerial Image Measurement System (AIMS™) to the Analysis of Binary Mask Imaging and Resolution Enhancement Techniques", Martino et al., SPIE vol. 2197, 1994, pp. 573-584.

"Optical Limitations to Cell Size Reduction in IT-CCD Image Sensors", Satoh et al., IEEE, Transactions on Electron Devices, vol. 44, No. 10, Oct. 1997, pp. 1599-1603.

"Direct Aerial Image Monitoring for Extreme Ultraviolet Lithography Systems", C.H. Fields, Ph.D. Dissertation Thesis, University of California, Berkeley, Spring 1997.

"Extraordinary optical transmission through sub-wavelength hole arrays", Ebbesen et al., Nature, vol. 391, Feb. 1998, pp., 1994, pp. 667-669.

"Control of Optical Transmission Through Metals Perforated with Subwavelength Hole Arrays", Kim et al., Optics Letters, vol. 24, No. 4, Feb. 1999, pp. 256-258.

"Image Monitor for Markle-Dyson Optics", Grenville et al., Journal of Vacuum Science Technology B, vol. 6, No. 11, Nov./Dec. 1993, pp. 2700-2704.

"A General Simulator for VLSI Lithography and Etching Processes: Part I—Application to Projection Lithography", Oldham et al., IEEE Transactions on Electron Devices, vol. ED-26, No. 4, Apr. 1979, pp. 717-722.

"High-Resolution Lithography with Projection Printing", H. Moritz, IEEE Transactions on Electron Devices, vol. ED-26, No. 4, Apr. 1979, pp. 705-710.

"Contrast Studies in High-Performance Projection Optics", Oldham et al., IEEE Transactions on Electron Devices, vol. ED-30, No. 11, Nov. 1983, pp. 1474-1479.

"High Resolution, Low-Voltage Probes from a Field Emission Source Close to the Target Plane", McCord and Pease, Journal of Vacuum Science Technology B, vol. 1, No. 3, Jan./Feb. 1985, pp. 198-201.

"Near-Field Optics: Microscopy, Spectroscopy, and Surface Modification Beyond the Diffraction Limit", Betzig and Trautman, Science, vol. 257, Jul. 1992, pp. 189-195.

"Direct Aerial Image Measurement as a Method of Testing High Numerical Aperture Microlithographic Lenses", Partlo et al., Journal of Vacuum Science Technology B, vol. 6, No. 11, Nov./Dec. 1993, pp. 2686-2691.

"Moire Technique for Overlay Metrology", Brunner and Smith, SPIE Integrated Circuit Metrology II, vol. 480, 1984, pp. 164-170.

"Growth of Low-Defect Density in 0.25Ga0.75As on GaAs by Molecular Beam Epitaxy", Pickrell et al., Journal of Vacuum Science Technology B, vol. 6, No. 18, Nov./Dec. 2000, pp. 2611-2614.

"Super-Resolved Surface Reconstruction From Multiple Images", Cheeseman et al., Technical Report FIA-94-12, NASA Ames Research Center, Dec. 1994.

"Monolithic Detector Array Comprised of >1000 Aerial Image Sensing Elements", Kunz et al., To be published in the SPIE Proceeding of the Microlithography, 2003.

"Initial Experiments on Direct Aerial Image Measurements in the Extreme Ultraviolet", Fields et al., Proc. OSA Trends in Optics and Photonics, Extreme Ultraviolet Lithography, Boston, MA, 1996.

"Autonomous On-Wafer Sensors for Process Modeling, Diagnosis, and Control", Freed et al., IEEE Transactions on Semiconductor Manufacturing, vol. 14, No. 3, Aug. 2001, pp. 255-264.

"Smart Dummy Wafers", Freed and Fisher, University of California, Berkeley, Presentation, May 1998.

"A Multi-Blanker for Parallel Electron Beam Lithography", G. Winograd, Ph.D. Dissertation, Stanford University, May 2001.

"Wafer-Mounted Sensor Arrays for Plasma Etch Processes", M. Freed, Ph.D. Dissertation, University of California, Berkeley, Fall 2001.

* cited by examiner

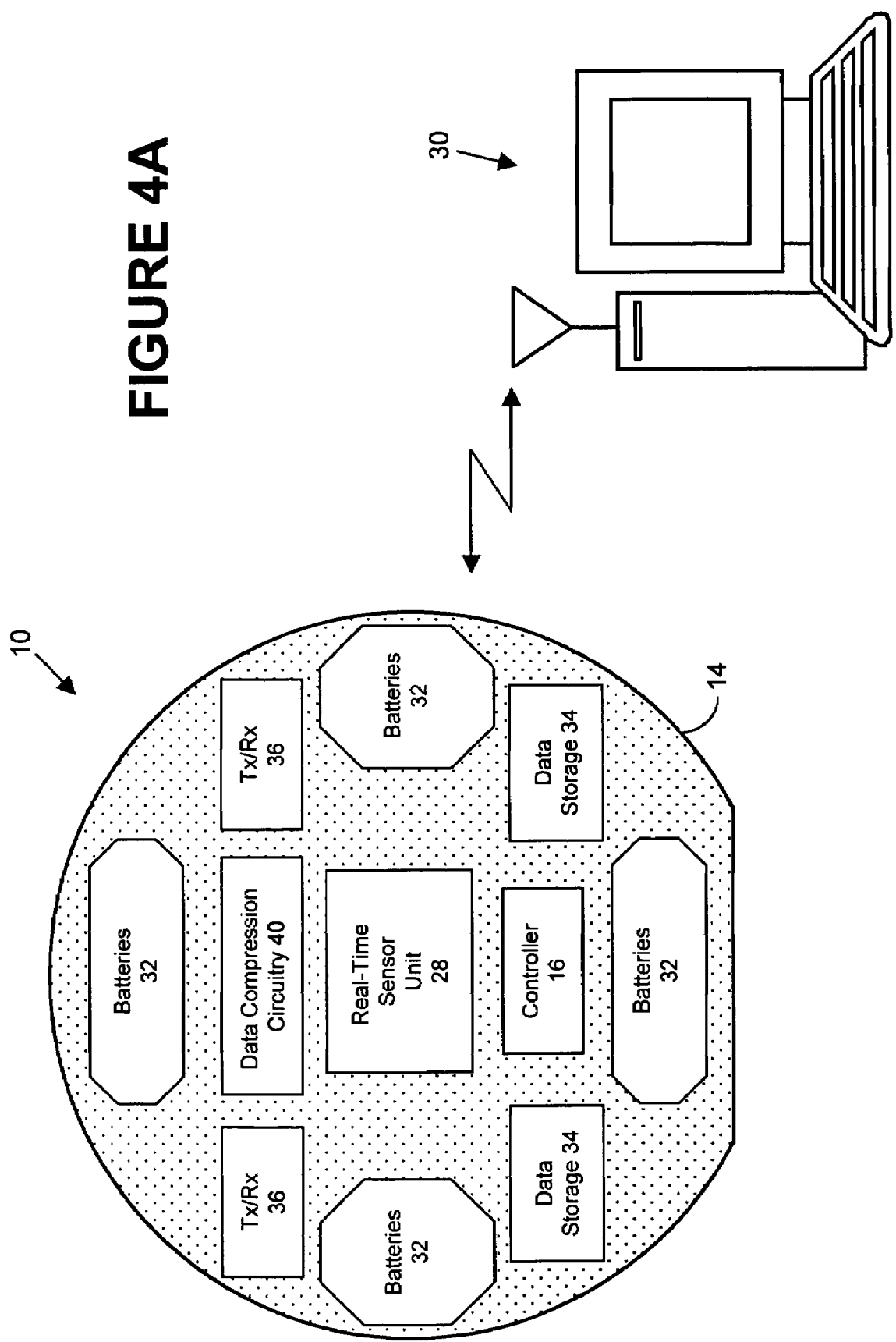

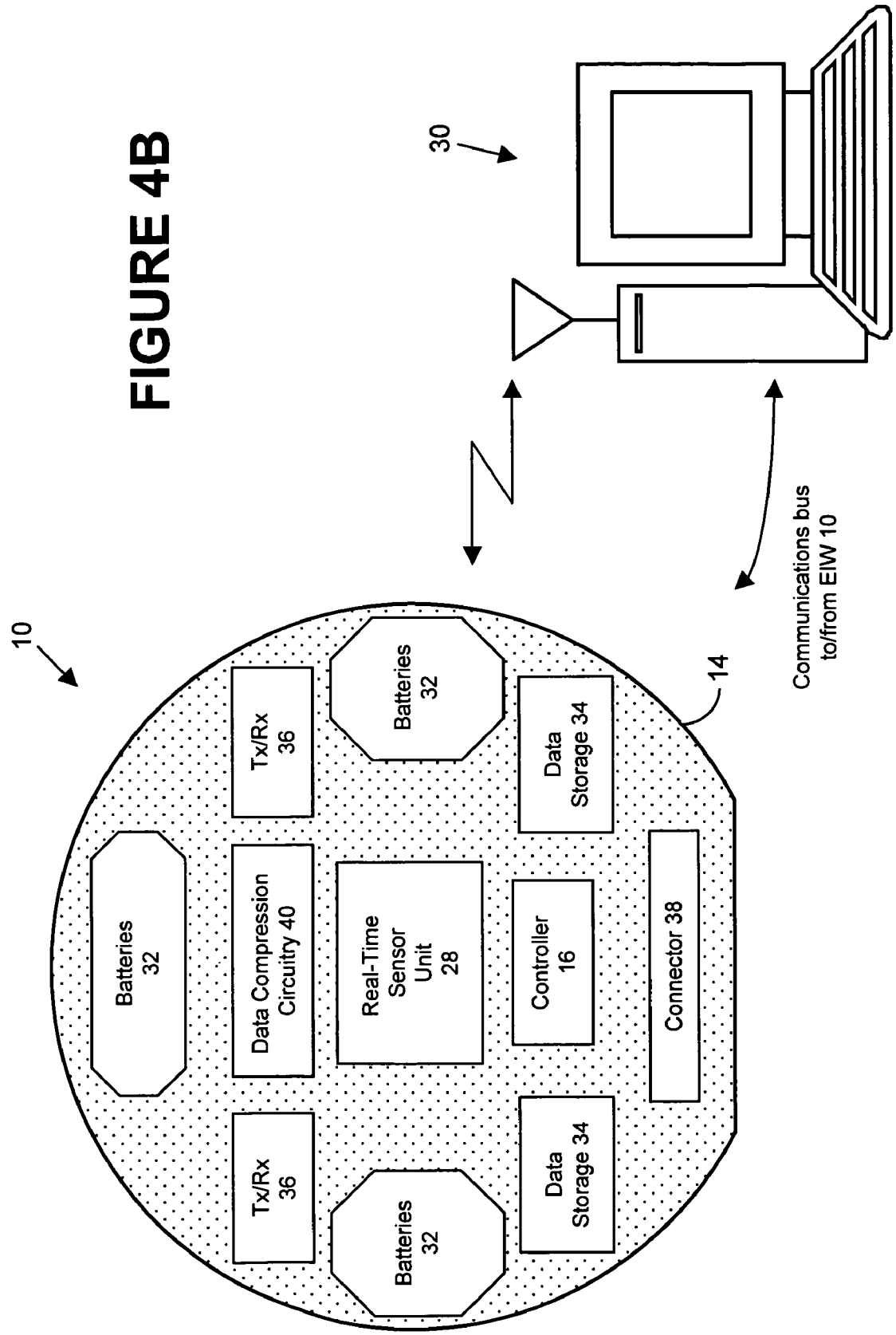

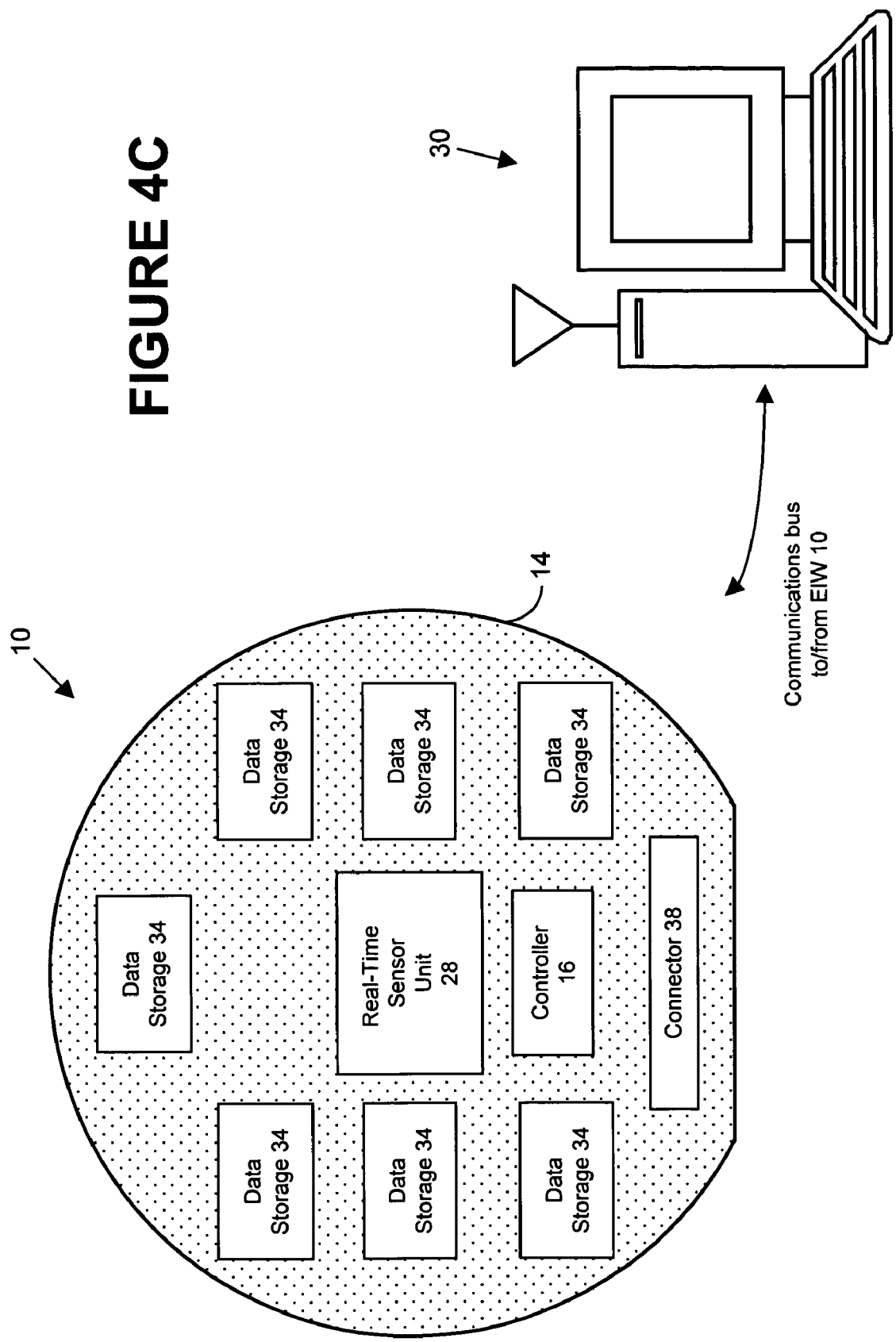

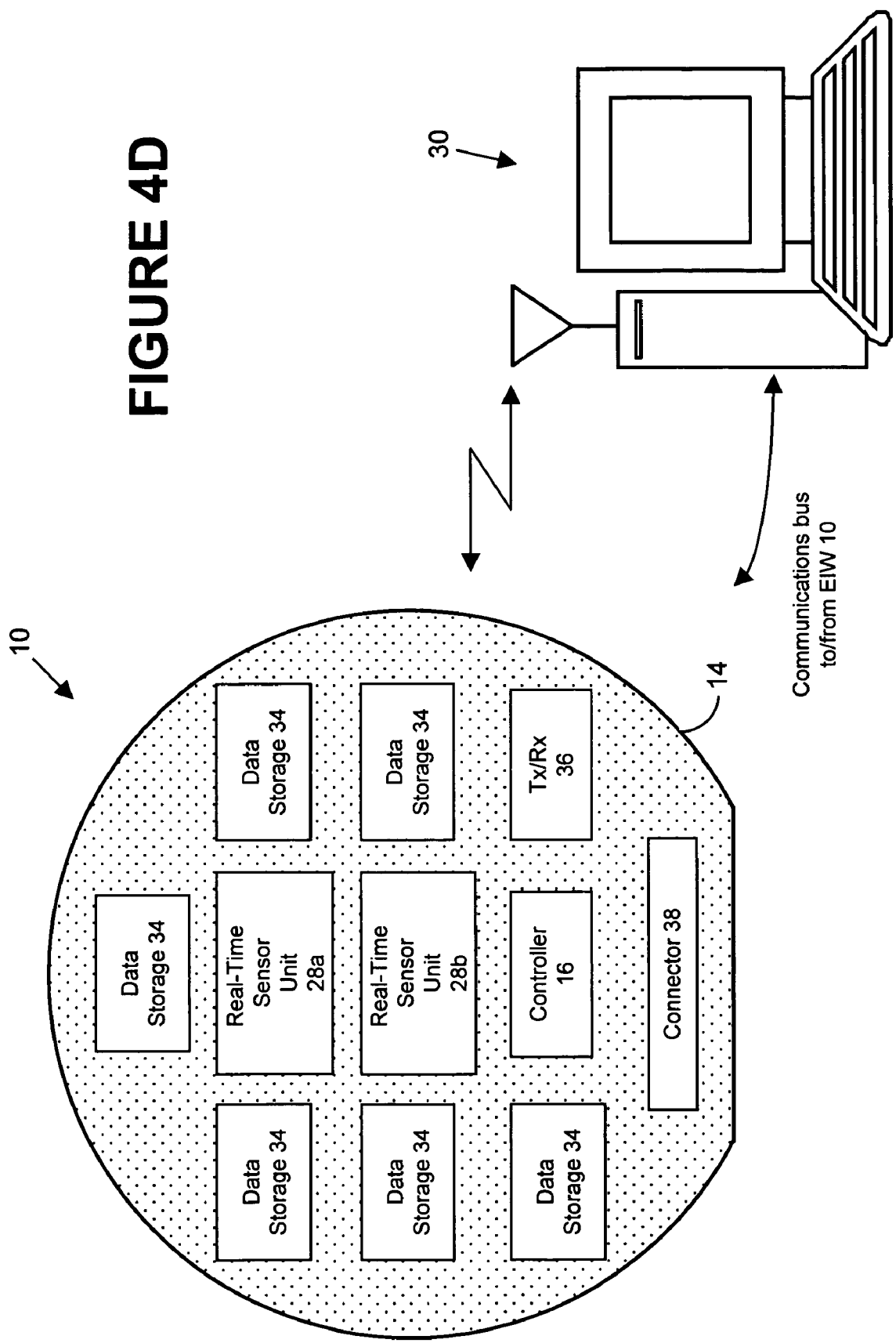

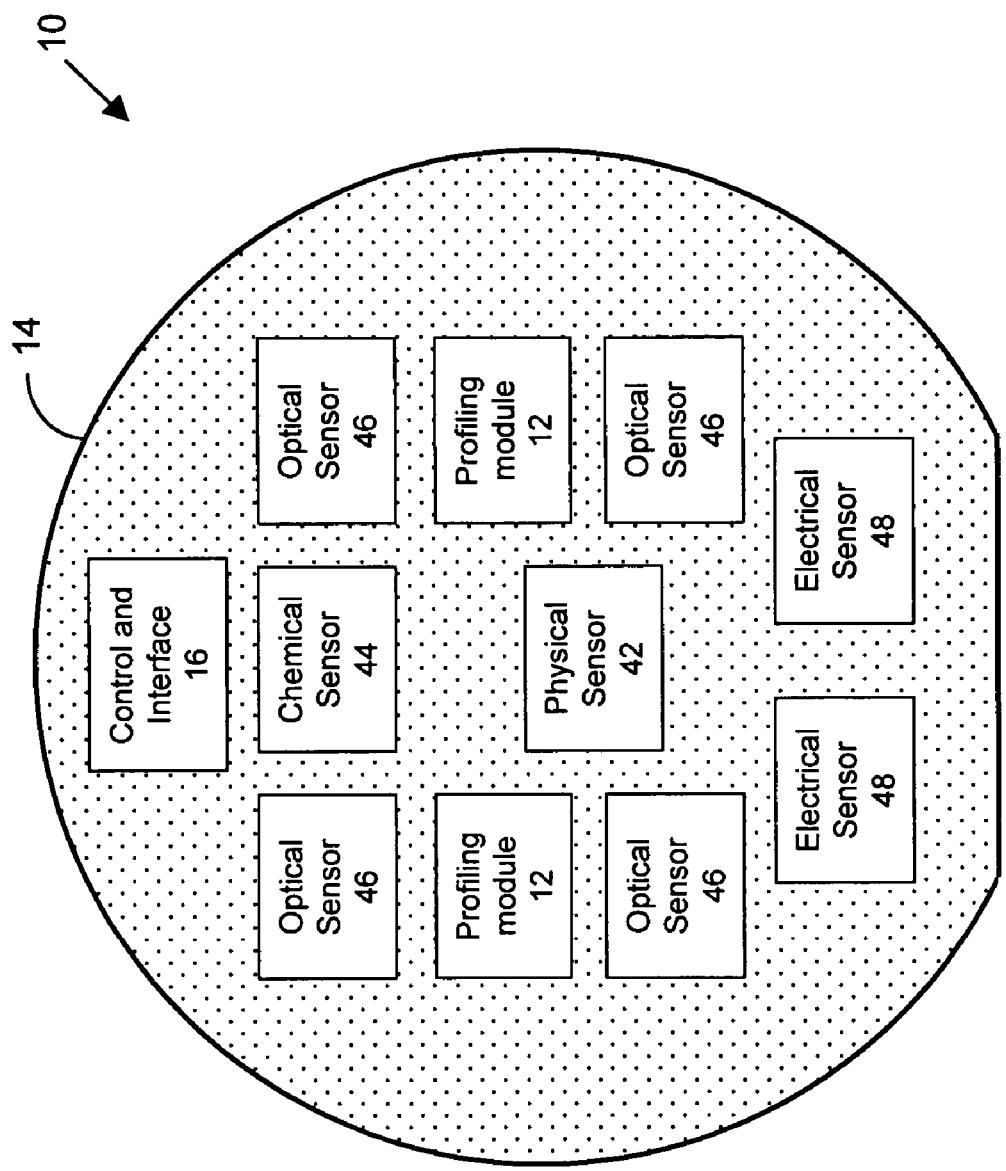

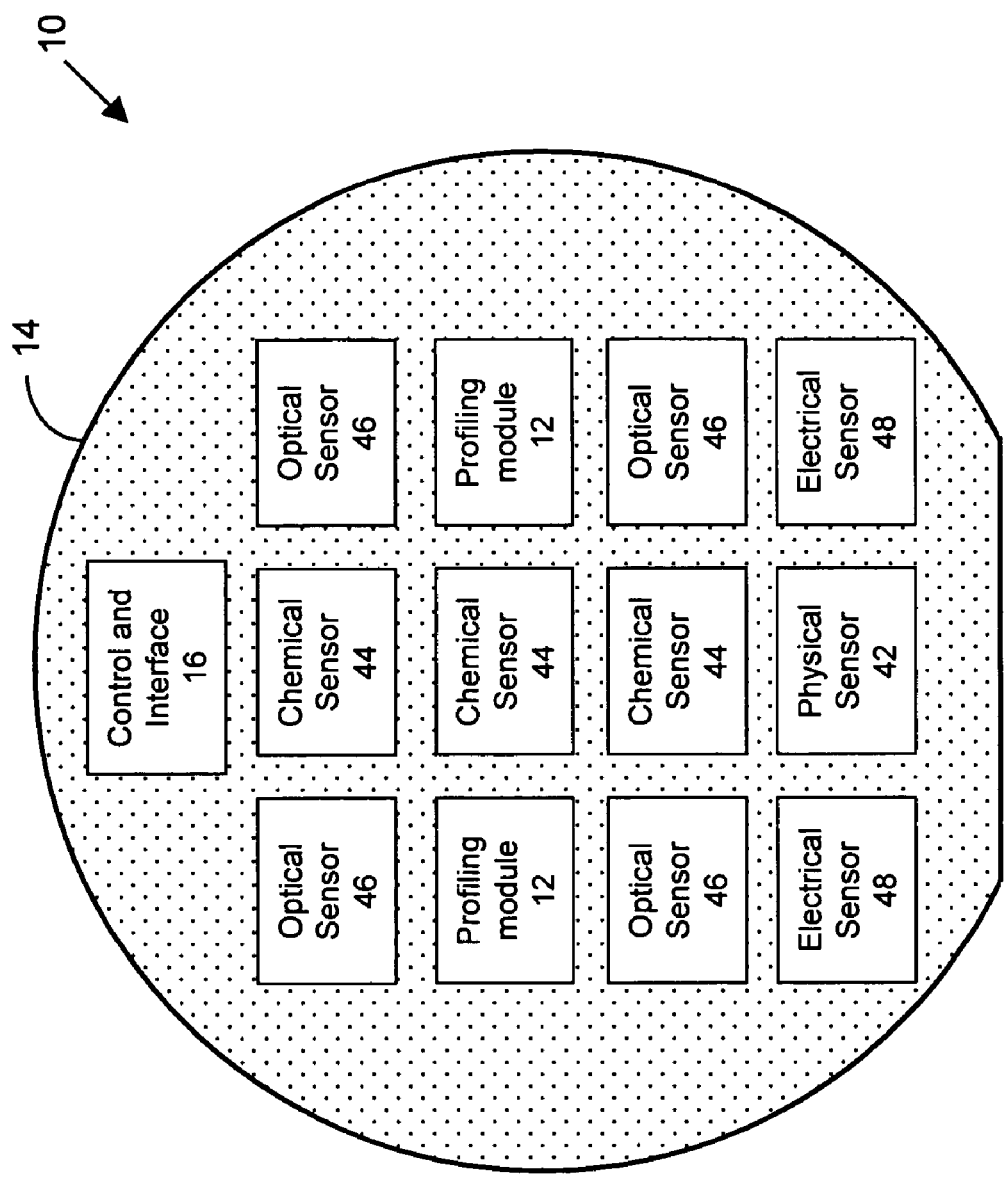

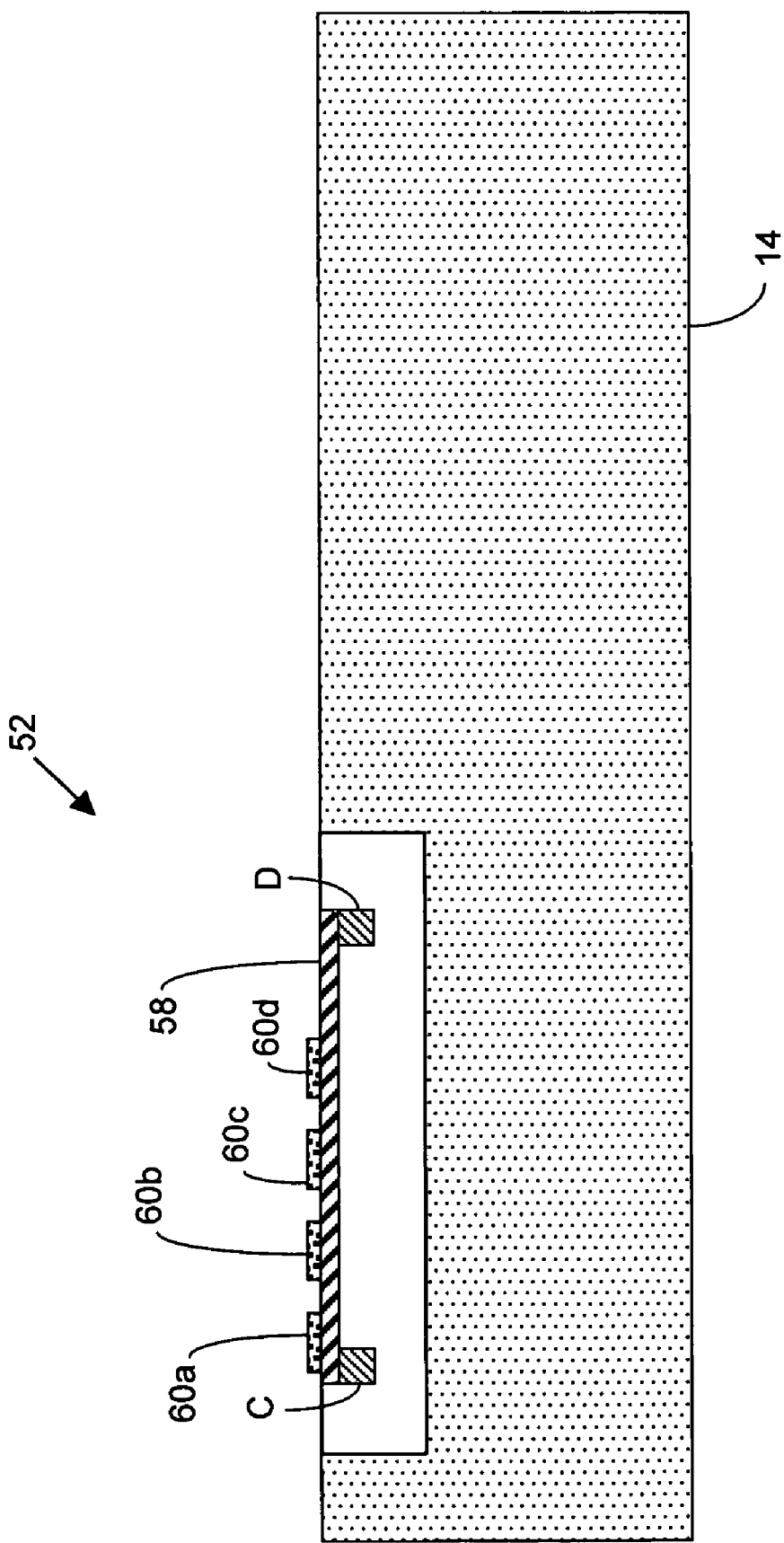

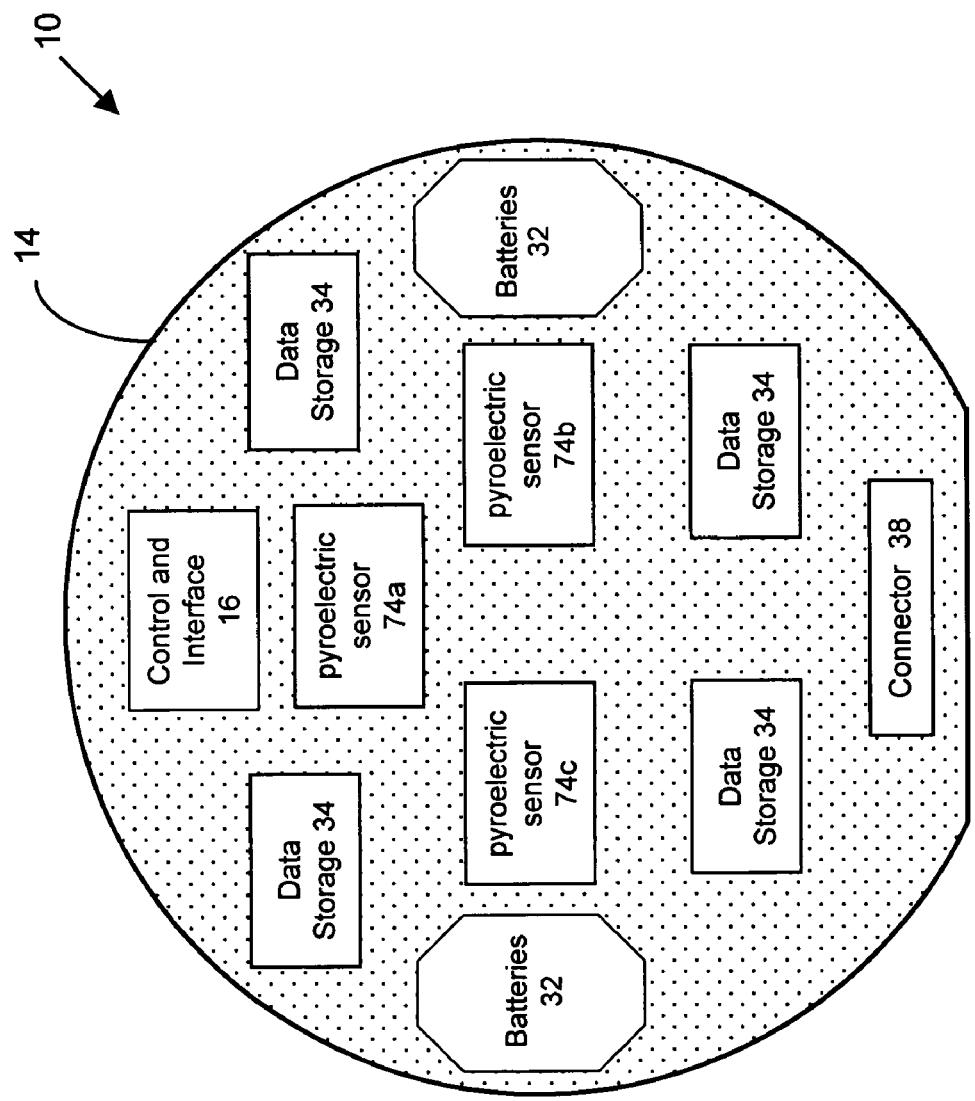

METHOD AND APPARATUS FOR MONITORING INTEGRATED CIRCUIT FABRICATION

CROSS-REFERENCE TO RELATED APPLICATIONS

This application is a divisional of application Ser. No. 10/756,718, filed Jan. 13, 2004, now U.S. Pat. No. 6,959,255, which is a divisional of application Ser. No. 10/677,563, filed Oct. 2,2003, now U.S. Pat. No. 6,807,503; the Contents of which are incorporated by reference herein in their entirety.

This application claims priority to U.S. Provisional Application Ser. No. 60/423,488, entitled "Method and Apparatus for Monitoring Integrated Circuit Fabrication using Equipment in Wafer (EIW)", filed Nov. 4, 2002. The contents of this provisional application are incorporated by reference herein in their entirety.

BACKGROUND

Integrated circuit fabrication generally consists of a series of process steps or stages, for example, photolithography, etch, strip, diffusion, ion implantation, deposition, and chemical mechanical planarization (also known as chemical mechanical polishing, or "CMP"). At each step or stage, inspections and measurements are conducted to monitor the equipment which performs the process as well as the overall process, individual processes, and interaction and integration among individual processes.

Typically supporting the integrated circuit fabrication process is a complex infrastructure of, for example, materials supply, waste treatment, support, logistics and automation. Integrated circuit fabrication processes tend to utilize one of the cleanest environments in the world.

Integrated circuits are typically made on or in a semiconductor substrate that is commonly known as a wafer. A wafer is a substantially round, thin disk, having diameters such as four inches to twelve inches, and thicknesses in the range of two to three quarters of a millimeter. During the fabrication process, materials or layers are added, treated and/or patterned on or in the wafer to form the integrated circuits.

With reference to FIG. 1, the equipment employed to fabricate integrated circuits may be classified, in a functional manner, into two categories:

Processing equipment ("PE"): this type of equipment creates physical or chemical changes to a wafer; for example, equipment used in performing photolithography, etch, strip, diffusion, ion implantation, deposition and/or chemical mechanical polishing ("CMP").

Monitoring equipment ("ME"): this type of equipment measures and/or analyzes certain parameters on a processed product or test wafer in order to, among other things, ensure the process(es) has behaved according to specification. That is, MEs measure, evaluate and/or analyze the integrity of the process(es). For example, MEs include equipment used in conducting defect inspection, surface profiling, optical or other types of microscopy. Notably, certain MEs may cause or require changes to measurement sample wafers. For example, an SEM may require a measurement sample wafer be cross-sectioned in order to analyze its profile. Indeed, these samples may be special test wafers, instead of product wafers.

Generally, conventional monitoring equipment consists of the following subsystems or components:

1. Source units—i.e., units that generate and direct the technique and mechanism of interrogation (for example, electromagnetic wave, charged particles, electrical voltages and currents, etc.) towards the measurement sample wafer. The technique of interrogation depends on the parameter being measured. For example, when measuring the smallest feature sizes made on an integrated circuit, known as Critical Dimension ("CD"), an electron beam may be used to resolve features as small as those used in integrated circuit manufacturing.

2. Sensing units—i.e., devices or circuitry that samples, senses, detects and/or measures the response of the measurement sample to the interrogation from/by the source unit. The sensing units may include, for example, temperature, light sensors, image sensors, charged particle sensors, voltage and current meters, and/or detectors. In the example of measuring CD using SEM, the electron beam reflected or scattered from the wafer is collected to form a high-resolution image of the features or profile on the wafer surface.

3. Analysis and user interface units—i.e., units that rely on a general purpose or specialized computer, algorithms and software to analyze information collected by the sensing units and present the results in a suitable format to, for example, process engineers or higher-level yield management and analysis software.

4. Wafer handling units—i.e., units that are responsible for handling the measurement samples, most likely in the wafer format, including, for example, loading, unloading, aligning, and conditioning wafers.

Given the number of different parameters that are measured or inspected in assessing the integrity of a process, there are many different types of MEs employed in a typical semiconductor manufacturing facility. The MEs may utilize different physical principles to detect, inspect or measure one or more parameters that may be used to characterize the process. For example, thin-film thickness measurement tools measure the thin films deposited on the wafer utilizing, for example, ellipsometry, reflectometry, or sheet resistance.

SUMMARY OF THE INVENTION

There are many inventions described and illustrated herein. In one aspect, the present invention embeds some or all of the functionalities and capabilities of one, some or all of MEs in a wafer or wafer-like object. In the present invention, the wafer or wafer-like object has the capability to sense, sample, analyze, memorize and/or communicate its status and/or experience.

These active capabilities may be implemented in various different ways. In one embodiment, the "active" wafer or wafer-like object according to the present invention may be disposed in a PE in substantially the same manner that a product wafer is sent into the same PE. The PE may process the "active" wafer or wafer-like object in the same or substantially the same manner as it would process a typical product wafer. Moreover, the "active" wafer or wafer-like object may exit the PE in the same or in substantially the same manner as a product wafer. The "active" wafer or wafer-like object is referred to herein as an Equipment-In-Wafer ("EIW").

In certain embodiments of the present invention, after the EIW exits the PE, it may be powered on or enabled to sense, sample, determine and/or provide certain parameters associated with the change(s) or modification(s) made to the EIW as a result of the previous process(es) (for example a deposition process). In addition, the EIW may analyze the effects of that processing, memorize and/or communicate information representative thereof to a processing unit (for example, a general purpose computer). For example, if an EIW is disposed in a PE implementing a chemical vapor deposition ("CVD") process and "experiences" that process, after the EIW is removed from the PE, the EIW may sense, sample, analyze, memorize and/or communicate the thickness of the layer deposited by the CVD process at one, some or multi-locations on the surface of the EIW. This information may be used to determine whether the CVD PE is performing properly, in specification or out of specification, and how and where it was in or out of specification. In this way, the EIW is providing, among other things, the functionality and capability of an ME that is designed to measure the thickness of the same CVD deposition layer.

In certain embodiments, the EIWs may perform its function while undergoing a given process within the PE. In this regard, the EIW may sense, sample, measure, detect, analyze, memorize and/or communicate its "experience" (i.e., the sampled, measured, detected and/or analyzed information) during the process step or stage, which may be the same or substantially the same as that experienced by a product wafer. For example, where the EIW is disposed in a PE performing a CVD process, the EIW may sense, sample, measure and/or detect the thickness of the deposited layer at one, some or all of locations on the substrate of the EIW. The EIW may sense, sample, measure and/or detect that thickness at one instance, at a plurality of predetermined or various points in time, or continuously throughout the process.

The EIW may also memorize the information and/or communicate that information externally (via, for example, wireless transmission techniques) for detailed analysis by, for example, a computer and/or the PE. This information may be employed to determine whether, for example, the CVD PE is working in specification or out of specification.

In one aspect, the present invention is a device, system and technique to shrink or reduce one, some or all ME into an EIW having suitable circuitry, structures, materials, capabilities and/or intelligence to perform one or some or all of those functions currently performed by conventional ME. In this way, capital equipment of at least part of the industry's infrastructure is reduced, minimized, and/or effectively or practically eliminated.

The EIW of the present invention may provide one, some or all of the following advantages:

In-situ, holistic system-level monitoring. In this regard, the EIWs may sense and/or memorize and/or communicate while the process is taking place, the process information collected is in-situ. Time-sequence recording. The process information may be collected at different time points during the process, thus it is possible to record the time-sequence of events.

Real-time or near real-time feedback. In certain embodiments, EIWs may collect information as the process is taking place and the information may be analyzed, in real-time, and provided to the PE, in real-time, for adjustment of process conditions to enhance and/or optimize the process results.

Seamless integration with many existing PE infrastructure. Since many PEs are designed to handle and process product wafers or other product substrates, and EIWs are made to have the same or substantially the same form factor, weight, and other mechanical and physical characteristics as a product wafer or product substrate, the introduction of EIWs in the manufacturing flow will often cause minimal changes, if any, to the existing manufacturing infrastructure.

Again, there are many inventions described and illustrated herein. This Summary is not exhaustive of the scope of the present invention. Moreover, this Summary is not intended to be limiting of the invention and should not be interpreted in that manner. While certain embodiments, features, attributes and advantages of the inventions have been described here, it should be understood that many others, as well as different and/or similar embodiments, features, attributes and/or advantages of the present inventions, which are apparent from the description, illustrations and claims— all of which follow.

BRIEF DESCRIPTION OF THE DRAWINGS

In the course of the description to follow, reference will be made to the attached drawings. These drawings show different aspects of the present invention(s) and, where appropriate, like structures, components, materials and/or elements in different figures will be labeled similarly. It is understood that various combinations of the structures, materials, components, circuitry, fluids, techniques and/or elements other than those specifically illustrated are contemplated and within the scope of the present invention.

FIGS. 4A–D are schematic representations of an EIW according to several embodiments of the present invention;

FIGS. 5A–E are schematic representations of an EIW, according to certain embodiments of the present invention, that measure a plurality of parameters;

FIG. 9 is a cross-sectional view of a sheet resistance EIW having a built-in or integrated conductive pad according to one embodiment of the present invention;

FIG. 16 is a block diagram representation of an EIW, including a plurality of pyroelectric sensors, according to several embodiments of the present invention;

DETAILED DESCRIPTION

Figure 1:
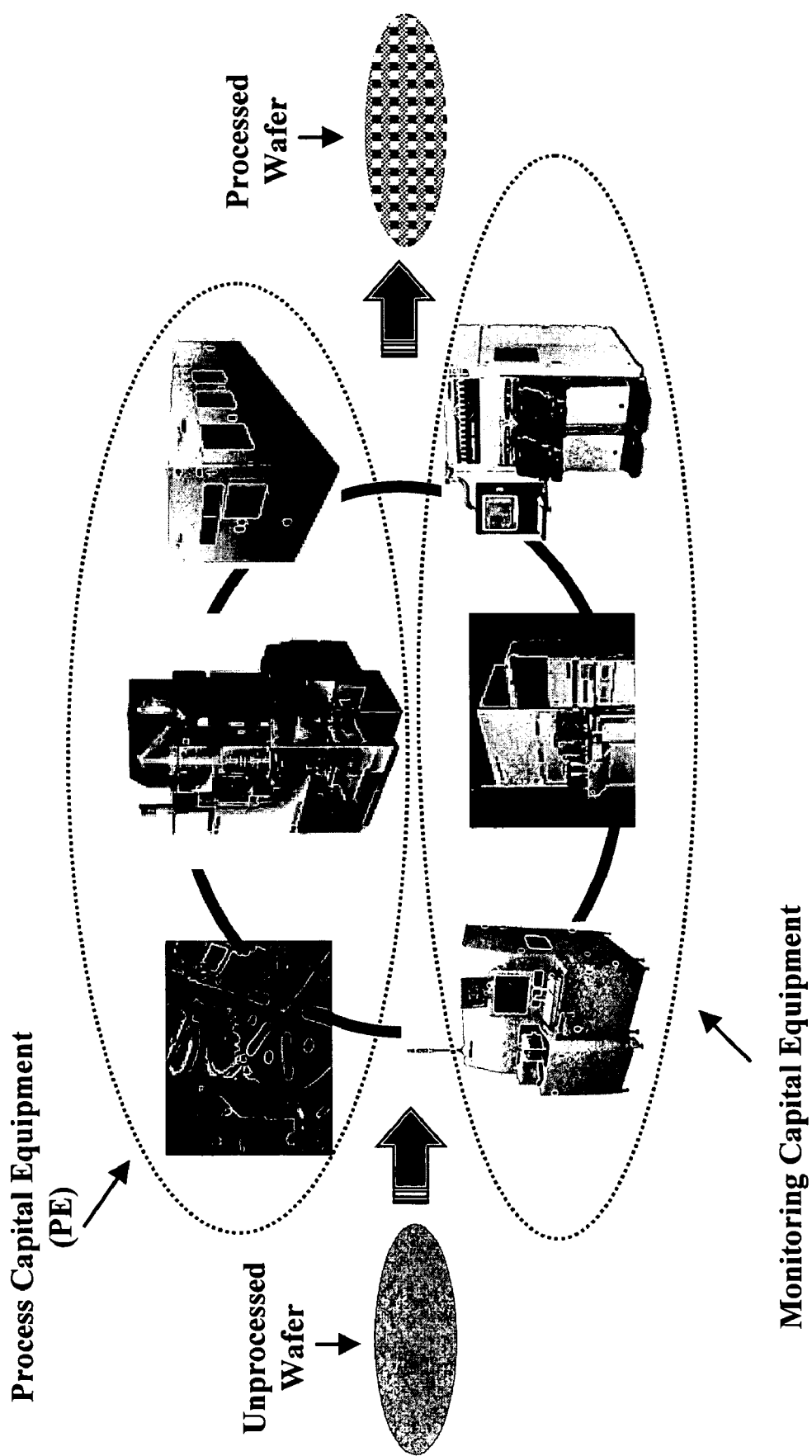
FIG. 1 is a high-level view of a typical integrated circuit manufacturing process.

In one aspect, the present invention(s) is an Equipment-In-Wafer ("EIW") having predetermined sources and/or sensors disposed and/or integrated on or in a wafer, a wafer-like substrate or a platform to sample, sense, detect, characterize, analyze and/or inspect certain parameters during a particular process(es) in the same or substantially the same environment as a product wafer (i.e., a wafer having actual integrated circuits fabricated thereon) would otherwise experience in processing or fabrication equipment, for example, integrated circuit processing or fabrication equipment.

In one embodiment, the EIW is a wafer or wafer-like object. When the EIW is a wafer-like object, the EIW may have a different physical form factor than a product wafer. The processing equipment, however, may handle such an EIW without adverse modification to its hardware and/or software. For example, where an EIW includes circuitry, sensors and/or sources to monitor a CVD process, the EIW may have the same or substantially the same planar size and shape as a product wafer, but may be (slightly) thicker. As such, the EIW "behaves" like a thick wafer and the deposition equipment may handle the EIW with little or no modification to the equipment.

In certain embodiments of the present invention, the EIW may include sources integrated on or in the wafer-like platform, but not integrated sensors. This type of EIW is known as a "Source-EIW". In this way, the complexity of the ME may be significantly reduced because the ME may only need sensors to recover the salient information. In addition, a Source-EIW includes sources that generate an interrogation signal(s) that is received, measured, sampled, sensed and/or recorded by a sensor (which may be internal or external). A Source-EIW may provide information that is not traditionally available because it includes sources located, for example, below the surface structure or the surface exposed to the process in order to monitor the process.

For example, in one embodiment, a Source-EIW may include an array of light-emitting elements (for example, VCSEL or LED) integrated into or onto the wafer-like platform. These sources may be employed to direct light into the wafer surface structure from "below" (or within the wafer-like platform). An associated ME may be used, in conjunction with this Source-EIW to sense, detect, sample and/or measure the light (after any scattering and/or interference) and analyze the surface layer(s) or structure(s), for example, spun-on photo resist.

In another embodiment of the present invention, the EIW may include sensors integrated on or in the wafer substrate, but not integrated sources. This type of EIW is known as a "Sensor-EIW". Like the Source-EIW, the Sensor-EIW may not only reduce the cost and complexity of the ME, but may also provide information that is traditionally unavailable.

For example, a Sensor-EIW may include image sensors integrated on or in the wafer-like platform. The Sensor-EIW may be placed into a lithography equipment (for example, an optical stepper or scanner) to directly sense, sample and/or measure the light intensity and image patterns of the aerial image that is otherwise projected on the surface of a product wafer. Notably, such a Sensor-EIW may be any image sensor or system described and/or illustrated in application Ser. No. 10/390,806, entitled "System and Method for Lithography and Mask Inspection" (hereinafter "the '806 application"), which is incorporated by reference herein in its entirety. Moreover, such a Sensor-EIW may perform, or be used or employed in, any method, technique and/or application described and/or illustrated in the '806 application.

The Sensor-EIW may also include circuitry and components that protrude from the surface, hence creating a portion that includes a non-flat surface topography. The circuitry and components are disposed on a wafer-like object that may be handled (automatically or manually) within the equipment. Thus, such an EIW includes a substrate that has a similar form factor and/or profile as a product wafer, may be handled in similar ways as a product wafer, and may be employed or disposed in the appropriate wafer processing equipment with minimal or no change to the configuration of the equipment.

Another example of a Sensor-EIW is an EIW having a plurality of sensors integrated into or onto the wafer substrate to measure, detect, and/or sample the concentration of a given chemical (for example, an etchant) used during a processing step(s). In addition to the concentration of the chemical, the sensors may also measure, detect, and/or sample the distribution of chemical concentrations on, across, or at selected or various locations on the surface of the wafer during processing.

An EIW according to another embodiment of the present invention may include source(s) and sensor(s), i.e., the combination of the subsystems, components, capabilities, and functionalities of a Sensor-EIW and a Source-EIW. In this way, the EIW is a more complete inspection, data collection and analysis mechanism.

Figure 2:
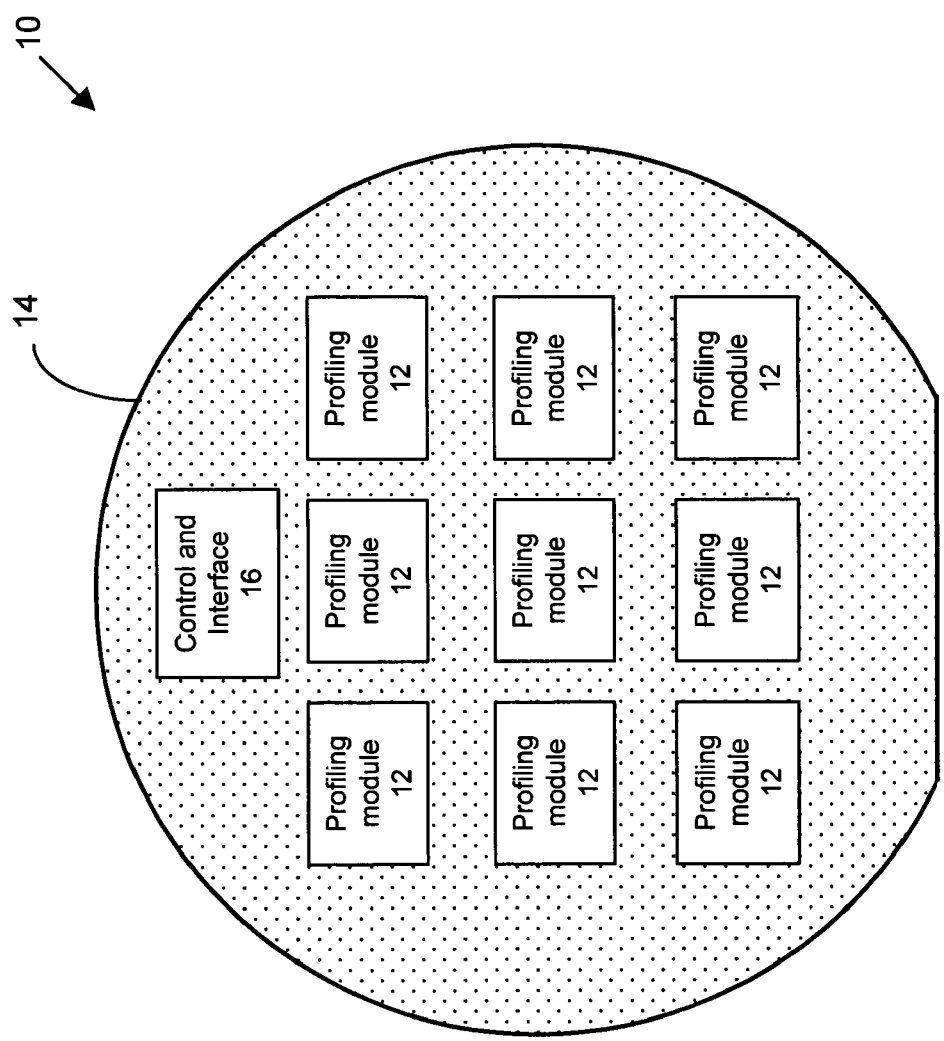
FIG. 2 is a schematic representation of a surface profile measurement EIW according to one embodiment of the present invention(s)
Figure 3A:
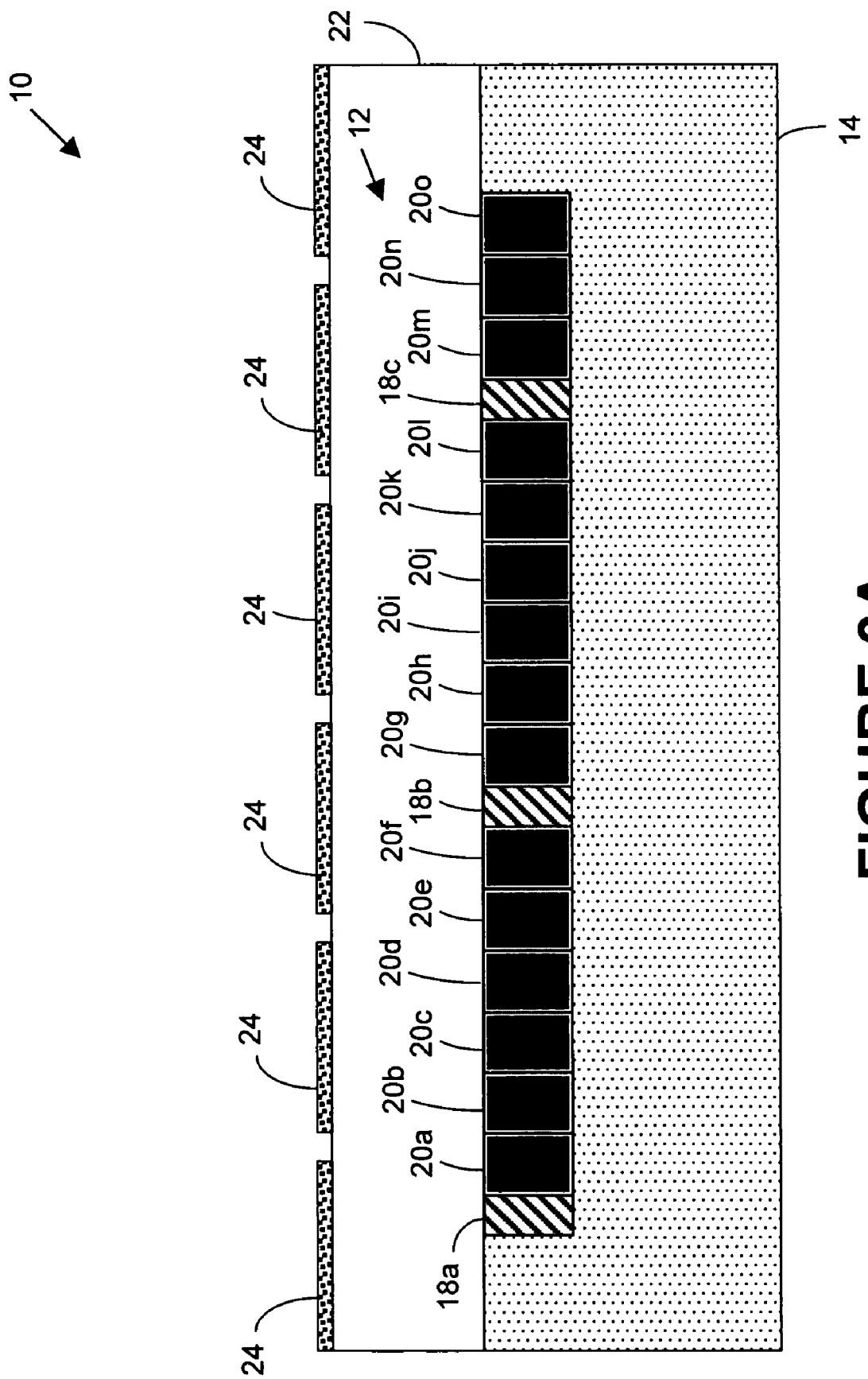
FIGS. 3A and 3B are cross-sectional views of a profiling module of the surface profile measurement EIW according to one embodiment of the present invention.
Figure 3B:
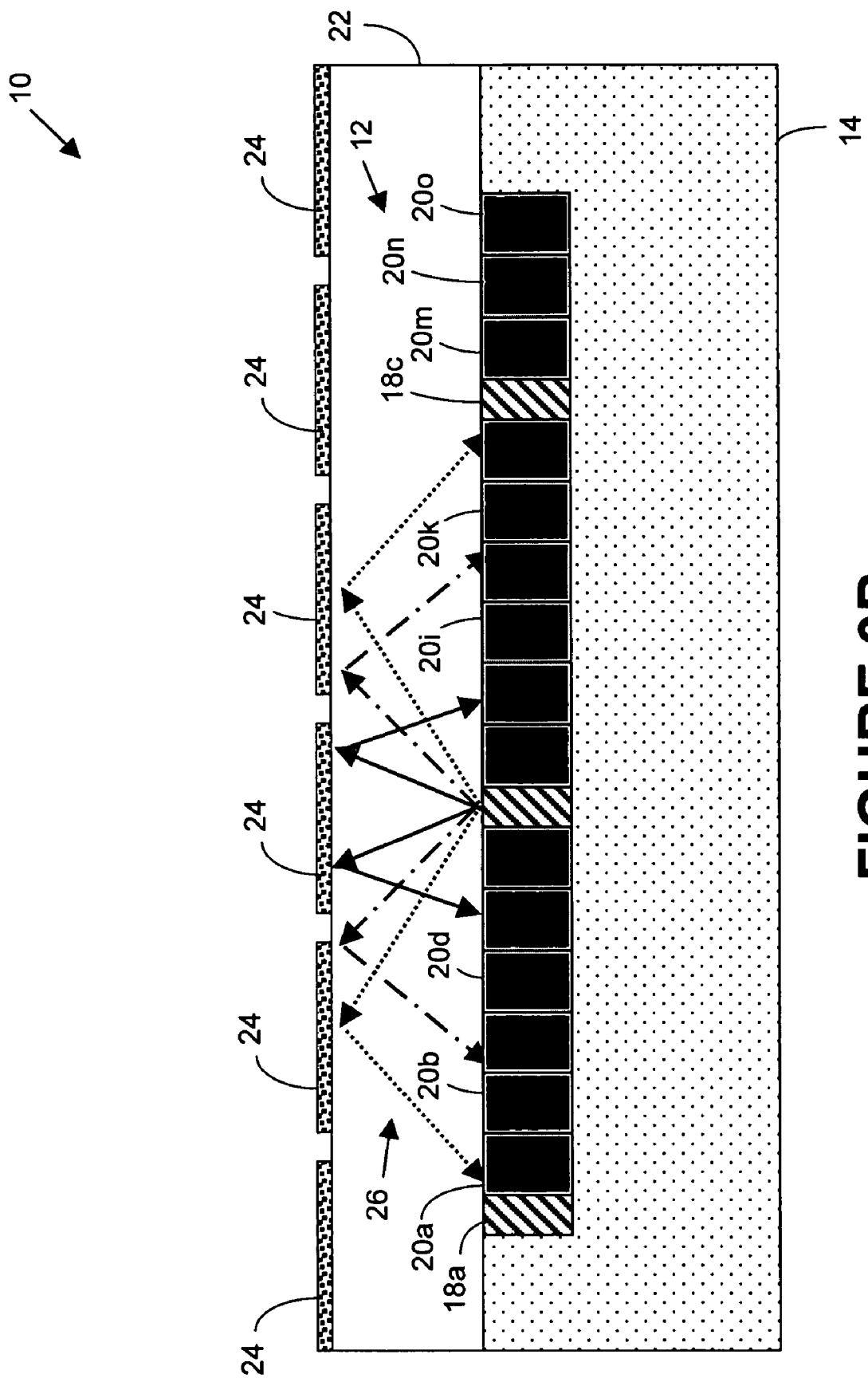
Figure 5A:
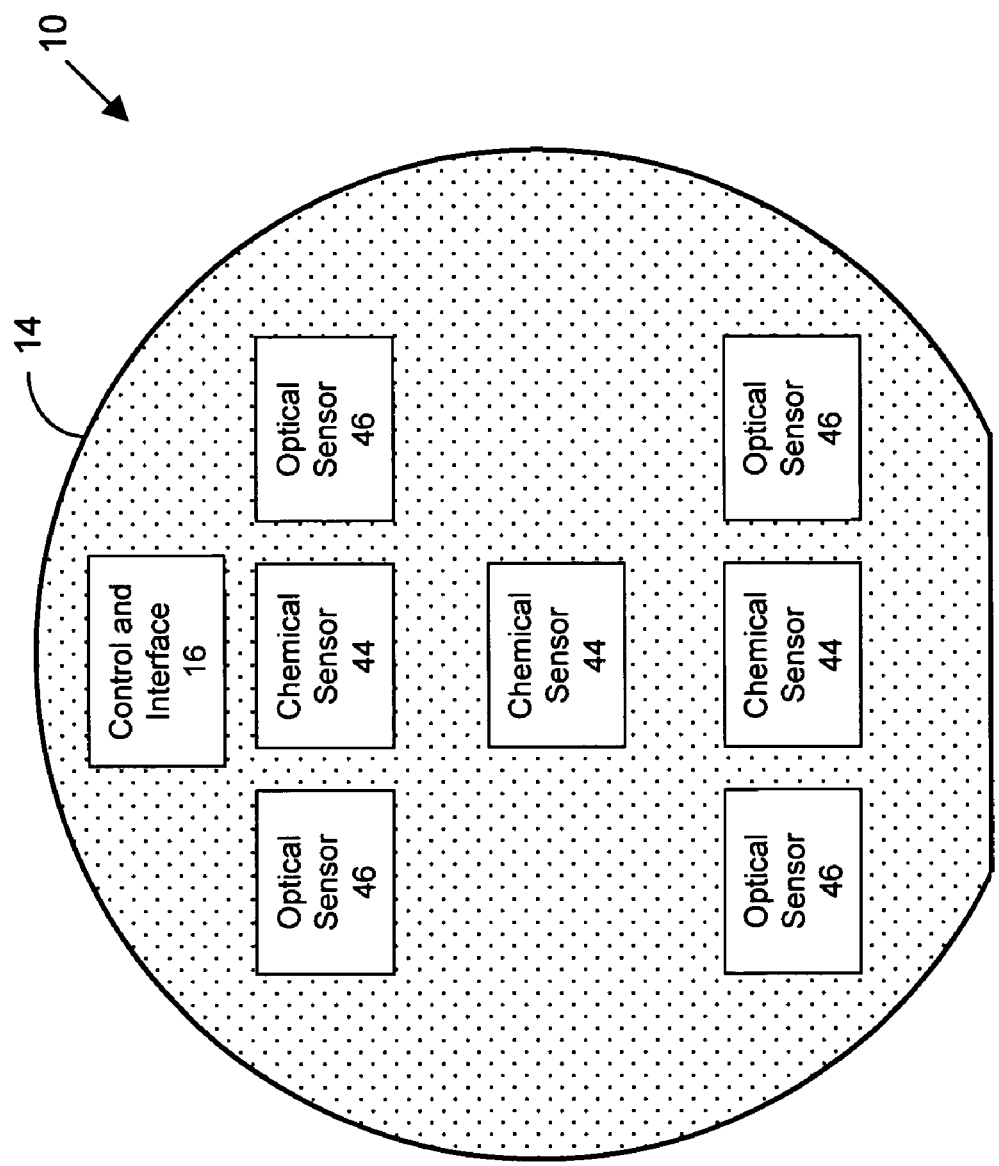
Figure 5D:
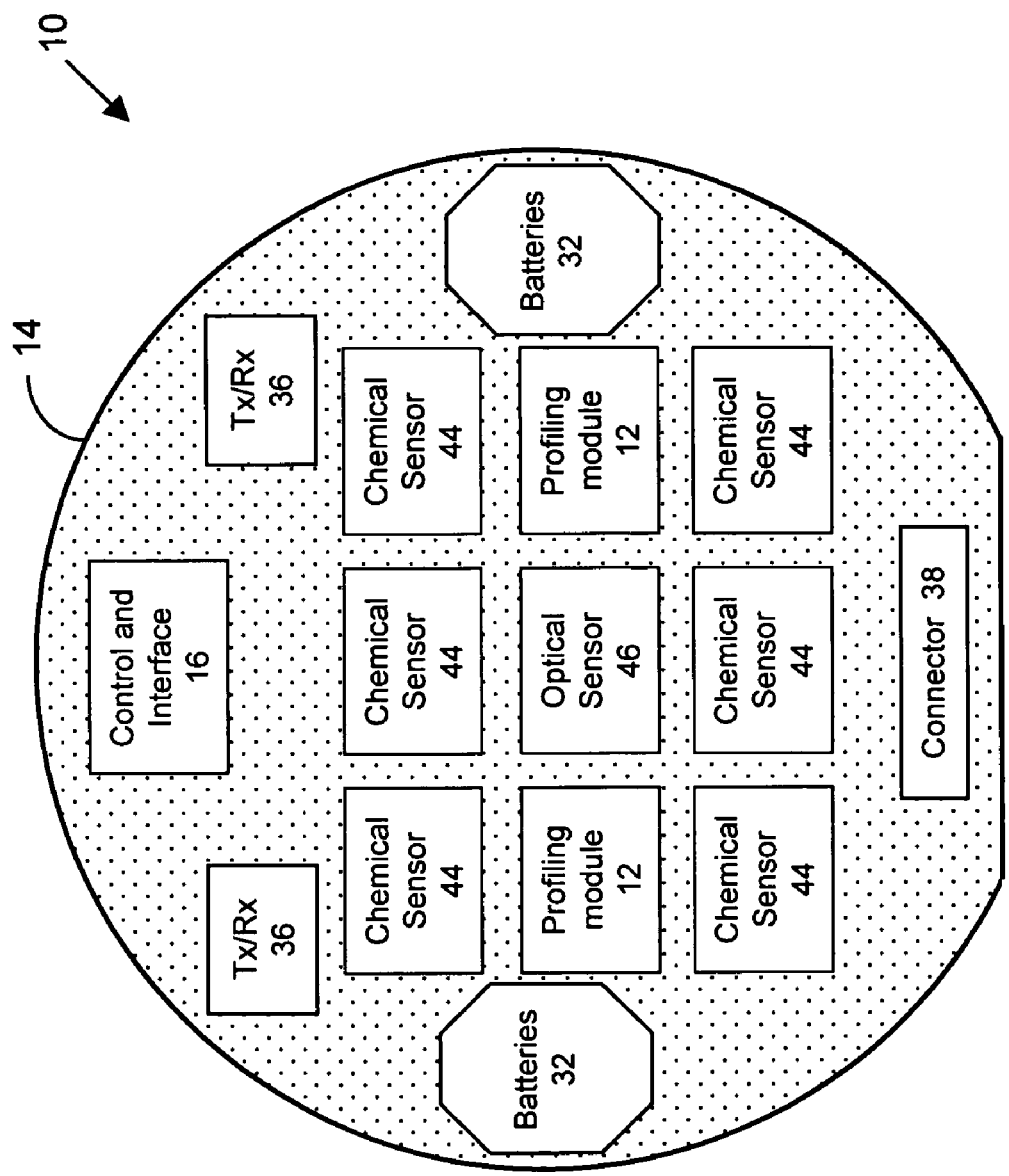
Figure 5E:
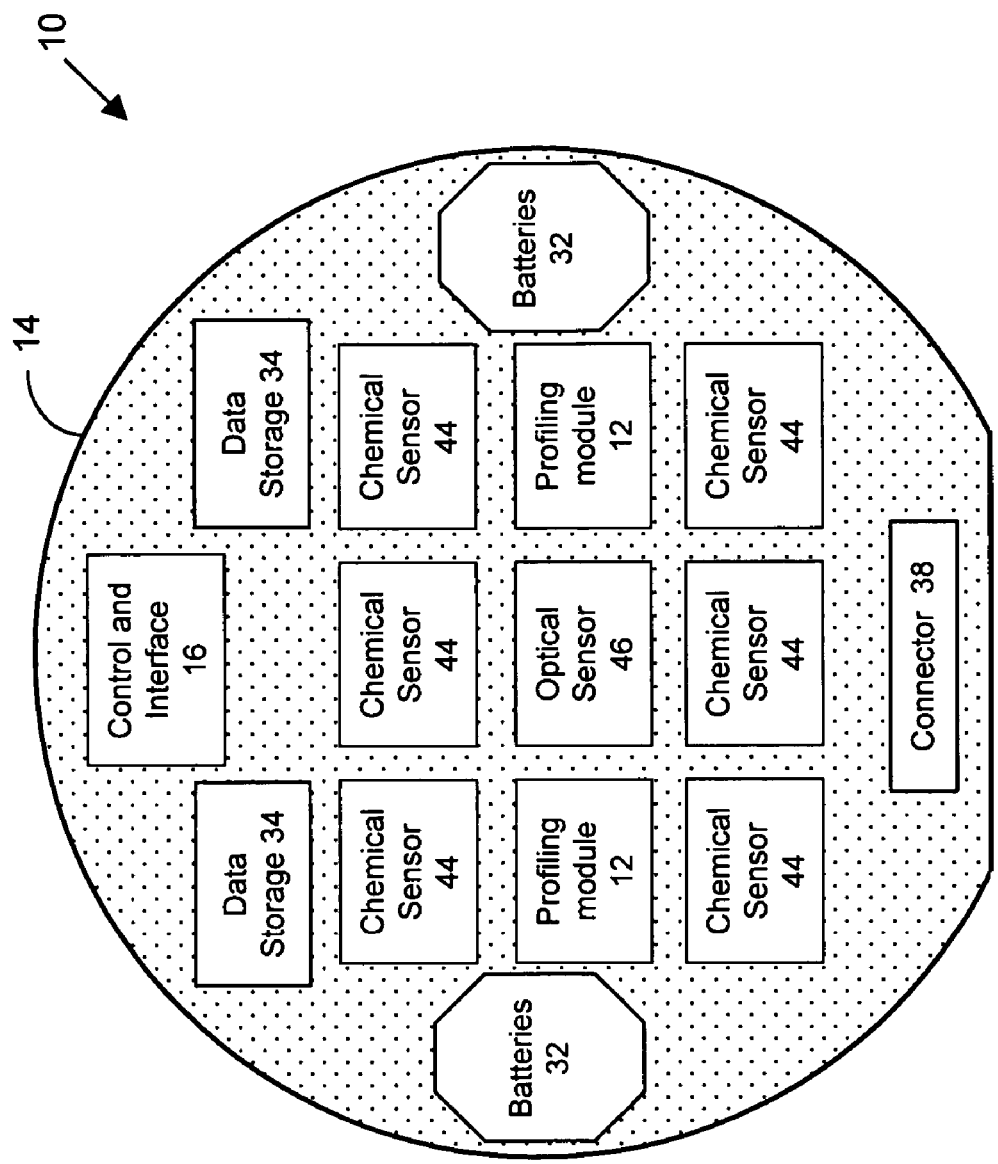

With reference to FIGS. 2, 3A and 3B, in one embodiment, EIW 10 accordi ng to one embodiment, includes one or more surface profile measurement modules 12 to collect, sample, detect and/or measure the profile of the surface of EIW 10, or a portion or portions thereof. The surface profile measurement modules 12 may be disposed on or in substrate 14. In addition, control and interface circuitry 16 may also be disposed on or in substrate 14. In this way, circuitry 16 may facilitate, monitor, initiate and/or control the sampling, detecting and/or measuring of the surface profile of EIW 10, or a selected or predetermined portion or portions thereof.

In one embodiment, surface profile measurement modules 12 employ light of different wavelengths or electromagnetic waves as a technique of interrogation. For example, EIW 10 may use light sources 18a–c (for example, vertical cavity surface emitting laser ("VCSEL") or light emitting diodes ("LED")) that may be integrated or packaged on or into substrate 14 of EIW 10. The EIW 10 of this embodiment may also include light sensors 20a–o (for example, CMOS image sensors, CCD image sensors or photodiodes).

The EIW 10 may also include a predetermined surface layer or structure 22 (for example, a medium that facilitates light propagation and/or scattering) to accept and/or receive an additional surface layer or structure 24 that is, for example, deposited by the PE during fabrication/processing. The additional surface layer (or structure) 24 deposited during fabrication may be monitored, analyzed, sampled and/or detected periodically, intermittently or continuously during and/or after deposition in order to characterize, analyze, detect, inspect, sample and/or sense the deposition process(es) and/or the PE under investigation.

With reference to FIGS. 3A and 3B, surface layer or structure 22 may be a layer of dielectric material (for example, $SiO_2$ or $Si_3N_4$ in the order of tens of microns thick) deposited or coated on or above light sources 18a–c and light sensors 20a–o. In operation, the surface layer or structure 22 provides a volume for light 26 from sources 18a–c to travel toward the surface, be reflected/scattered downward by surface layer or structure 24, and then be detected by sensors 20a–o. The positions of sources 18a–c relative to sensors 20a–o may be designed so that information of surface layer of structure 24 is sampled, sensed, detected, extracted, determined or analyzed from the intensity of light 26 measured, sampled, sensed and/or detected by sensors 20a–o.

The arrangement, placement, materials and types of sources 18 and/or sensors 20 may be suitably selected to enhance the operation of EIW 10 in a given or particular environment. Indeed, surface layer or structure 22 (for example, the dielectric medium) may also be suitably selected to accommodate a given situation or environment in which the EIW is to be implemented. For example, predetermined surface layer or structure 22 may be patterned to guide and/or shape the propagation of light 26 before light 26 is incident on surface layer or structure 24 and thereafter measured.

Further, a grating structure may be integrated into or onto surface layer or structure 22 so that the medium not only provides a volume for light travel, but also provides light diffraction. In this way, the light reflected from surface layer or structure 24 may be analyzed and/or measured using the additional information provided by the diffraction.

Moreover, in certain embodiments, EIW 10 may employ acoustic optical modulation ("AOM") techniques, wherein the refractive index grating may be dynamically changed. For example, where an AOM module is integrated into or onto EIW 10, control and interface circuitry 16 may be used to control the AOM module and, in response, drive a plurality of different acoustic waves to induce a plurality of different grating structures (for example, the period and amplitude of the grating). In this way, sensor(s) 20 may sense, sample, measure, collect and/or detect the response of the surface layer structure 24.

Furthermore, the predetermined surface layer or structure 22 (for example, a dielectric medium) may be comprised of multiple layers of the same or different materials. The composite dielectric structure may be patterned to provide further information regarding the surface layer or structure 24 that is deposited, formed, or modified on EIW 10 during the fabrication process under investigation.

In one embodiment, the intensity of the light output by source 18 may be varied, modified, changed and/or modulated (including the relative strength between the light source elements) to provide different illumination conditions to surface layer or structure 24. Moreover, in another embodiment, the relative intensities of the light output by the plurality of sources 18a–c may be varied, modified, changed and/or modulated to provide still different illumination conditions to surface layer or structure 24. The information collected, measured, detected and/or sampled by sensor(s) 20, under the illumination conditions, may be analyzed (for example, via an external or off-wafer computer using suitable analysis software or algorithms) to characterize the surface of layer or structure 24, for example, characterize the thickness and profile of the layer or structure 24 deposited, added, or modified during process under investigation.

With continued reference to FIGS. 2, 3A and 3B, in certain embodiments, EIW 10 may include a plurality of sources 18 and/or a plurality of sensors 20, for example, an array of sources and/or an array of sensors. The plurality of sources and sensors illustrated in FIGS. 3A and 3B may be replicated in the x- and y-directions to form 2D array(s). In this way, the EIW may collect, sample and/or measure a spatial distribution of the surface layer or structure 24.

It should be noted that the EIW structure referenced in FIGS. 2, 3A and 3B, can be easily modified to have either source-only or sensor-only, and hence creates corresponding "Source-EIW" and "Sensor-EIW", as described above. All other descriptions of the EIW (e.g., regarding layer 22) still apply. The advantages described above associated with "Source-EIW" and "Sensor-EIW" also apply.

EIWs Employing End-Point and/or Real-Time Modes

In several embodiments of the present invention, the EIW employs circuitry and techniques to implement an end-point mode and/or a real-time mode.

In an end-point mode, the EIW of the present invention experiences the same or substantially the same conditions, or undergoes the same processing, as a product wafer experiences during a PE process. After the process is completed, the end-result of the physical and/or chemical changes on the EIW is measured, detected, sensed, sampled, determined and/or analyzed. For example, after completion of a CVD deposition process, the sources and/or sensors may measure the thickness of a deposited layer of a dielectric layer (for example, silicon dioxide (SiO2)) or a conductive layer (for example, heavily doped silicon or aluminum). Thus, in the end-point mode, the sources and/or sensors measure, detect, sense, sample, determine and/or analyze the end-results of the process without measuring, detecting, sensing, sampling the parameter(s) (for example, temperature, pressure, light intensity, chemical composition, concentration and/or density, surface tension, stress, composition and/or profile, voltage, and/or current) or changes therein, during the process.

With reference to FIGS. 4A–D, in a real-time mode, EIW 10 may be used to monitor, measure, detect, sense, sample, determine, analyze and/or record a parameter(s) under investigation during the performance of the process (i.e., time-sequence of the measured parameter(s)), for example, a change of thickness of a deposited layer as a function of time. As such, real-time EIW 10 includes a real-time sensor unit 28 which is operational and/or functional while real-time EIW 10 is being "processed" by the PE. In this regard, EIW 10 may enable real-time sensor unit 28 (i.e., the source(s) and/or sensor(s)) to measure, detect, sense, sample and/or record the processing "experience" in real time. At the conclusion of the process step (or during the process step), EIW 10 provides data that reflects or is representative of the processing experience or sequence. The data (which may be of the actual parameter or a representation thereof) may be output to a computer, processor and/or controller 30 (via, for example, wired, wireless and/or optical techniques) and analyzed, for example, to reconstruct the time-sequence of the processing experience.

For example, an EIW having surface resist profile measurement sensor(s) and/or sources (and associated circuitry), may output (in real-time or the conclusion of the process) data that may be used to illustrate, describe and/or characterize a time sequence of the deposition and development of the resist profile. In certain embodiments, the time sequence may represent the entire processing time or portion thereof. Such information may provide process development engineers insight into the process, and hence may facilitate a better or more accurate or specific characterization and tuning of the process or PE.

With continued reference to FIGS. 4A and 4B, in one embodiment, EIW 10 includes components or circuitry that are powered, enabled or operational during the processes. In this regard, EIW 10 may receive power externally or may include a built-in or integrated power source resident on substrate 14 of EIW 10, for example, batteries 32, to turn-on, engage or enable resident and/or integrated sources and/or sensors. The batteries 32 may be rechargeable with a thin form factor to be embedded into EIW 10. To minimize the disruption to the PE, it may be advantageous to include an electrical power supply (for example, batteries 32) on or in EIW 10 so that EIW 10 is a more self-contained and/or self-sufficient device.

In other embodiments, electrical power may be provided either via wired or wireless techniques to EIW 10. For example, electrical power may be obtained from the PE.

In another embodiment, the real-time EIW includes data storage 34 and/or communications circuitry 36. Given that real-time EIWs are used to sense, sample, measure and/or collect discrete data or data which is representative of the time sequence of certain measurements, the data may be stored in the data storage 34, for example, a solid state memory such as DRAM or Flash, for later retrieval or transmission during data collection/acquisition. In addition, in certain embodiments, the data may be downloaded from the EIW in real-time (or nearly real-time) via a communications circuitry 36 to an external device, such as a computer or controller 30 or an external data storage device (not illustrated). This real-time (or near-real-time) communications link may be implemented using wireless, wired and/or optical techniques.

Where the EIW employs wired communication techniques, a socket or connector 38, disposed on the wafer-like substrate or platform, provides a mechanism for external communication (see, FIG. 4B). The socket or connector may be an electrical connector that includes signal, power and ground pins, where signals are transmitted by series of high and low voltages, using proprietary or non-proprietary protocols (for example, RS-232). In those embodiments where data storage 34 is employed, the stored data may be retrieved from the EIW via a communications link, which itself may be implemented using wireless, wired and/or optical techniques, like that in the description above.

It should be noted that additional circuitry may be implemented to accommodate bandwidth considerations of the wireless, wired and/or optical communications techniques. For example, communications between the EIW and an external device (for example, a computer) may be via optical, wired and/or wireless of a given bandwidth that may not be as high as the bandwidth of the data collection by the sensors. As such, suitable circuitry (for example, data compression circuitry 40 to compress the data and/or to buffer the data) may be implemented on or in EIW 10 to accommodate the given communications techniques.

In those embodiments where EIW 10 includes circuitry for real-time communication of for example, data which is representative of the time sequence of the measured parameter, EIW 10 facilitates real-time feedback—that is, real-time adjustment, tuning, and/or control of the process and/or PE. For example, where the EIW is employed to measure film thickness during CMP, EIW 10 may provide feedback, in real time, of film thickness distribution across the surface of substrate 14 of EIW 10. These embodiments may allow the PE to adjust the pressure for certain areas of the wafer, or stop processing when the polishing reaches or achieves a desired specification.

It should be noted that in certain embodiments, wireless communication methods may minimize disruption to the operation of the PE. This is particularly the case in those situations where the PE does not include a means of communication and where the EIW is under processing constraints that, as a practical matter, prohibit compromising the environment of those constraints.

In those embodiments facilitating real-time data acquisition and/or analysis, EIW 10 may be employed to enhance or optimize the yield of the PE as well as the quality, yield and cost of integrated circuits fabricated using that equipment. The control loop from the PE to sensor, then to computer (which process the data and/or determines corrective or responsive measures), then back to the equipment, is a type of control loop that facilitates enhancement or optimization of the process and/or the PE. In this regard, EIW 10 of this embodiment may allow or facilitate intermittent, periodic and/or continuous tuning and/or adjustment of the PE and/or the process. That is, the PE and/or the process may be tuned or adjusted when EIW 10 enters and exits the equipment as well as undergoes processing by that equipment.

It should be noted that some or all of the real-time data analysis may be performed by circuitry and devices resident on the EIW, for example by controller 16. As such, an external computer or controller 30, in this embodiment, maybe avoided. This may be especially useful when the data analysis is not computationally extensive.

Further, in another embodiment, some or all of the real-time data analysis may be conducted or performed by the PE equipment. In this embodiment, external computer or controller 30 and on-EIW data analysis capabilities may be unnecessary.

It should be further noted that the EIW may be enabled and/or equipped with circuitry to facilitate implementation of the real-time mode as well as end-point mode. In this way, both modes of operation and/or analysis are available.

EIW Having Multiple Sensors and/or Sources to Sample and/or Record Multiple Parameters With reference to FIGS. 5A–E, EIW 10 according to other embodiments of the present invention may include a plurality of different types of sensors that measure the same parameter(s) and/or different parameters, for example, sensors to measure, sense, sample and/or detect physical, chemical, optical and/or electrical parameters. Indeed, the sensors may be disposed in an array on substrate or platform 14 of EIW 10 or distributed in a predetermined or random pattern. For example, in a complex process such as CMP, it may be advantageous to monitor multiple parameters at the same time, including chemical composition and/or concentration, pressure applied on the wafer, and/or thickness of the remaining metal film. Moreover, it may be advantageous to provide multiple and/or different light sources (for example, a plurality of LED devices and/or a plurality of VCSEL arrays) to obtain similar or the same information.

It should be noted that the discussions of, for example, electrical power supply techniques and circuitry, as well as the communications link, techniques and circuitry, are fully applicable to this aspect of the present invention. For the sake of brevity, those discussions will not be repeated.

EIW Integration and Packaging

The EIW of the present invention(s) may be comprised a monolithic structure (i.e., circuitry, sensors and/or sources integrated within the wafer and manufactured on the same original wafer substrate), or comprised of discrete components (i.e., sensors, sources, circuit components) packaged and interconnected into or onto the wafer-like platform, or a combination thereof (i.e., a hybrid device where some of the circuitry, sensors and/or sources integrated within the wafer and some components integrated on the wafer).

A monolithic EIW includes electronics (i.e., sensors, sources and/or associated control, transmission and/or storage electronics) that are integrated within the substrate using, for example, VLSI or LSI integration techniques. Given the current state of technology, the power source (if any) and/or connector (if any) are more likely incorporated on the substrate as discrete components. Indeed, in one embodiment, the power source may be disposed in cavities, holes or cut-outs in the substrate in order to minimize the profile of the EIW. (See, for example, the '806 application, which, as mentioned above, is incorporated by reference herein in its entirety).

It should be noted that in discrete and hybrid approaches, which may be a preferred approach since it may reduce the complexity and cost of EIW 10, the substrate (or portions thereof) may be more like a printed circuit board that is shaped like a typical product wafer. As mentioned above, in the discrete or hybrid embodiments, certain electronics are individually and separately made. Those discrete components may be packaged or un-packaged before integration onto the substrate of the EIW. Indeed, in those circumstances where certain electronics of the EIW is comprised of discrete components, it may be advantageous to employ surface mount devices, unpackaged die and/or cavities, holes or cut-outs in the substrate in order to further minimize the profile of the EIW. Accordingly, in certain embodiments of the discrete-type and hybrid-type EIW, the EIW may be thicker than an actual product wafer, but may be within a thickness range that can be handled (manually or automatically) and processed by the processing equipment with little or no change to the equipment.

Thus, in sum, the EIW according to certain embodiments of the present invention includes a profile (for example, height and shape, and flatness, if pertinent) that facilitates implementation in PEs much like a product wafer and maintains a form or appearance, during processing, that is substantially similar to that of a product wafer. Moreover, the wafer-shaped platform or substrate may permit automated handling by a robotic loader of the processing equipment. Further, electrical power may be supplied to the sensor(s) and/or source(s) by a battery (rechargeable or otherwise) and/or the processing equipment; and data/command transmission may be accomplished using wired, wireless and/or optical techniques.

Reusable EIW

In certain embodiments, the EIW may be reused or reusable. In this regard, after use within a given process, the physical changes, if any, that the PE caused or created on or in the EIW may be "reversed". In this way, the EIW may be reused to characterize the same or different processes. For example, where an EIW had been employed to measure and/or inspect resist development processes, after data collection and analysis, the developed resist may be removed (for example, stripped away). In this regard, the resist would be removed thereby exposing the underlying surface of the EIW, which would remain intact during and after the resist removal process. As such, after the resist is removed, the EIW may be employed again, for example, to measure and/or inspect another spin-coated photo resist process.

In other embodiments, the EIW may be treated as a "consumable", and used only once or a few times and then discarded or recycled.

EIW Substrate, Platform or Workpiece 14

Many aspects of the invention have been (or will be) described in the context of integrated circuit manufacturing where the substrate is a semiconductor wafer. In other applications or industries, the substrate or workpiece of concern may take a different form factor and may be made from different materials. For example, in manufacturing flat panel displays, the substrate or workpiece may be a high quality glass plate. In manufacturing components of hard disk drives, the substrate or workpiece may be wafer-like, but comprised of materials other than those used in manufacturing integrated circuit. In printed circuit board (PCB) manufacturing, the substrate or workpiece may be a circuit board.

Thus, the present invention(s) may be implemented using a given substrate form-factors and/or materials of a particular application in which the invention is implemented. Such substrates may include one, some or all of the functionalities and capabilities described herein. Indeed, other functionalities and capabilities may be desired depending upon the particular application in which the invention is implemented.

As an example, an EIW according to the present invention may be implemented to analyze mask fabrication. Briefly, by way of background, in the integrated circuit industry, integrated circuits are fabricated on wafers (for example, made from silicon or other types of semiconductors such as gallium arsenide). An important step in the fabrication process is the manufacturing of masks. In optical lithography, a mask is a high quality glass (for example, quartz) with patterned chrome coated on one side. After mask fabrication, the chrome layer will contain the master copy of the circuit pattern (or portion thereof) to be duplicated on the product wafers.

In one embodiment of the present invention, an EIW, having one, some or all of the attributes/features described earlier, may be implemented in the mask or mask-shaped object to monitor the mask making process. In this regard, a mask or mask-like object is made with sensors, sources, and/or measuring/communication electronics integrated on or in the substrate of the EIW. The EIW of this embodiment may be described as a "Mask-EIW".

In one embodiment, the Mask-EIW is fabricated with thermal sensors disposed or integrated on or in a mask to monitor the temperature, temperature distribution, gradients and/or fluctuations during the manufacturing of a mask (for example, during electron-beam mask writing and/or during mask resist baking). In another embodiment, EIW may employ chemical sensors to detect, monitor and/or measure an etchant's concentration and/or the etchant's strength during a wet etching process.

In yet another embodiment, the Mask-EIW may include light sensor(s), or an array of light sensors, and electronics, communication and power such that it may be disposed on a chuck or onto the mask stage of a projection lithography system (for example, a stepper or scanner). This embodiment may be used to measure light intensity distribution and other parameters associated with the illumination or optical sub-system of the lithography equipment. In-situ tuning, enhancement and optimization may be achieved, as described above.

The present invention may be implemented using a plurality of sources and/or sensors and/or techniques to monitor the fabrication process or PE. As described below, there are many different types of sources and/or sensors (alone or in combination) that may be incorporated into or onto an EIW.

EIW Embodiment(s) to Monitor Conductive Film Thickness Using Sheet Resistance Measurement Techniques In one embodiment, the EIW may measure, detect, and/or sample the thickness of a material using sheet resistance. In this regard, sheet resistance (Rs) of a conductive film is defined as the resistance of a square-shaped area and may be expressed as:

$$Rs = \rho/d$$

where:
$\rho$=the resistivity of the conductive material, and
d=the thickness of the film.

Thus, for certain materials for which the resistivity is known, the film thickness may be determined using the sheet resistance.

Figure 6:
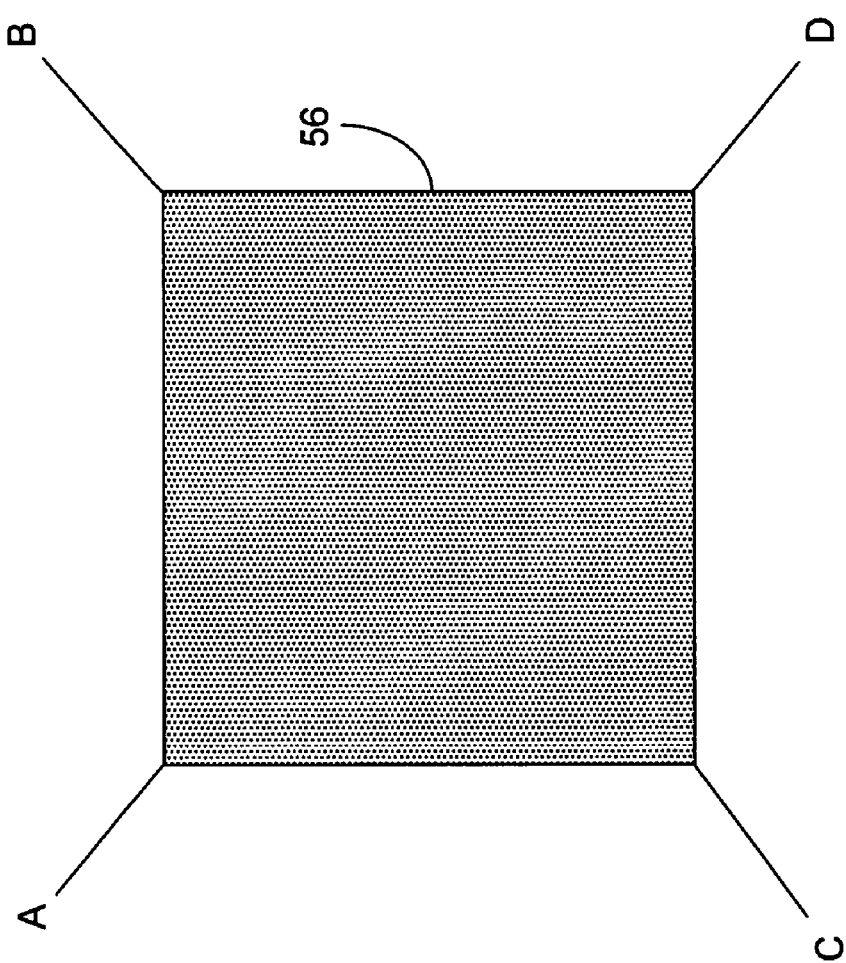
FIG. 6 is an exemplary van Der Pauw sheet resistance measurement structure.

For measuring sheet resistance, in one embodiment, the present invention employs the technique of van der Pauw [see, for example, van der Pauw, "A Method of Measuring Specific Resistivity and Hall Effect of Discs of Arbitrary Shapes," Philips Res. Repts. 13, 1–9 (1958), and, van der Pauw, "A Method of Measuring the Resistivity and Hall Coefficient on Lamellae of Arbitrary Shape," Philips Tech. Rev. 20, 220–224 (1958), incorporated herein by reference]. A common geometry for such a measurement has four electrical contacts at the four corners of a roughly square sample (see, for example, FIG. 6).

It is noted that the van der Pauw technique may be applicable for an arbitrary shaped sample provided the thickness of the sample is uniform or substantially or relatively uniform, the contact areas are small, and the contacts are all on the perimeter of the sample. In this case, van der Pauw demonstrated that:

$$\exp(-\pi R_{CD,AB}/RS) + \exp(-\pi R_{BD,AC}/RS) = 1$$

where:
$R_{CD,AB}$=the resistance determined by dividing the potential difference between C and D by the current going from A to B, and
$R_{BD,AC}$=the resistance determined by dividing the potential difference between B and D by the current going from A to C.

Using the measured resistance values $R_{CD,AB}$ and $R_{BD,AC}$, the sheet resistance may be determined by solving van der Pauw's equation/relation. With the known resistivity, the film thickness may be determined. It should be noted that the van der Pauw method is also commonly referred to as four-probe sheet resistance measurement technique.

Figure 7A:
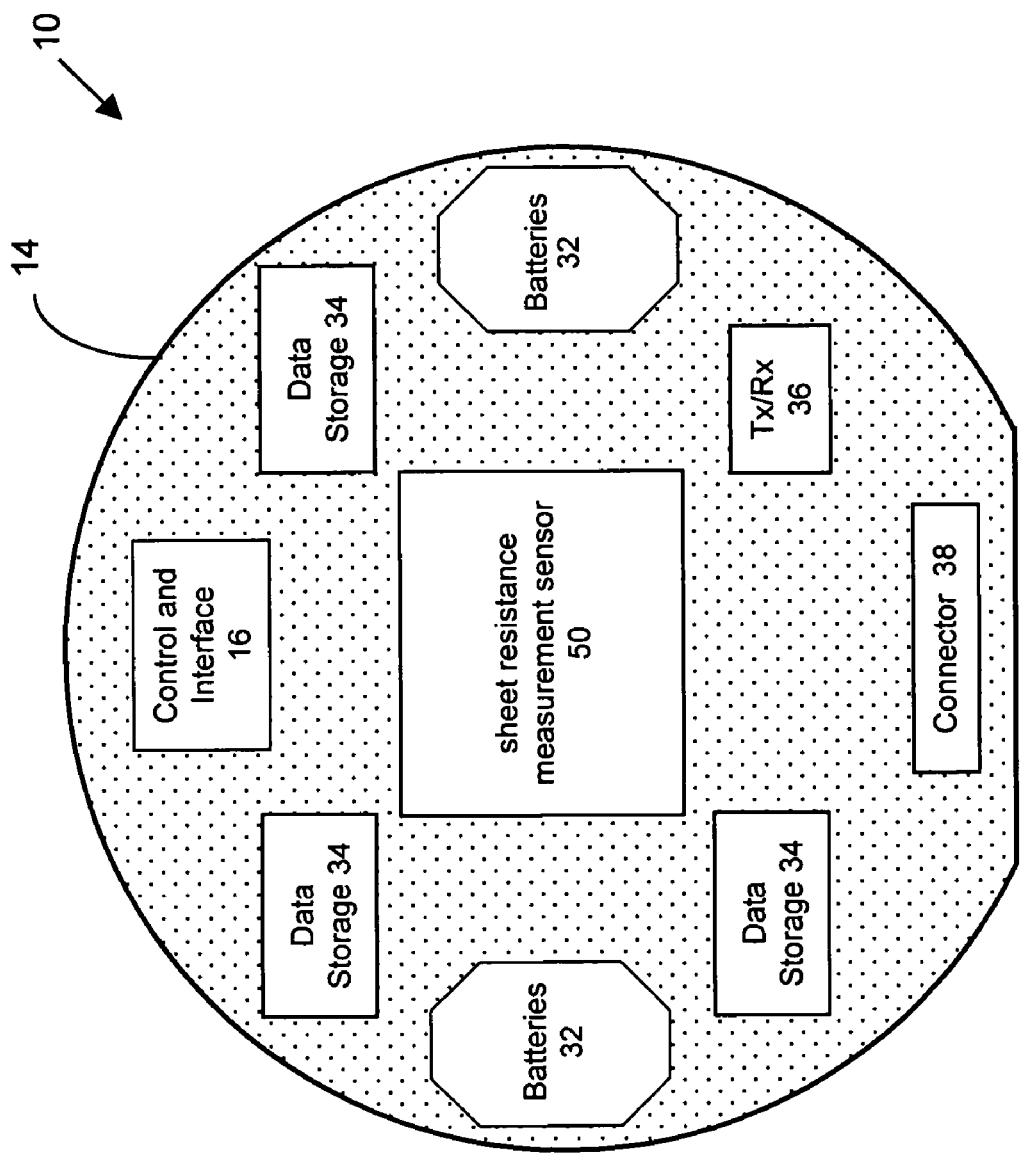
FIGS. 7A and 7B are schematic representations of an EIW for monitoring conductive film thickness, using a four-probe sheet resistance measurement technique, according to various embodiments of the present invention.
Figure 7B:
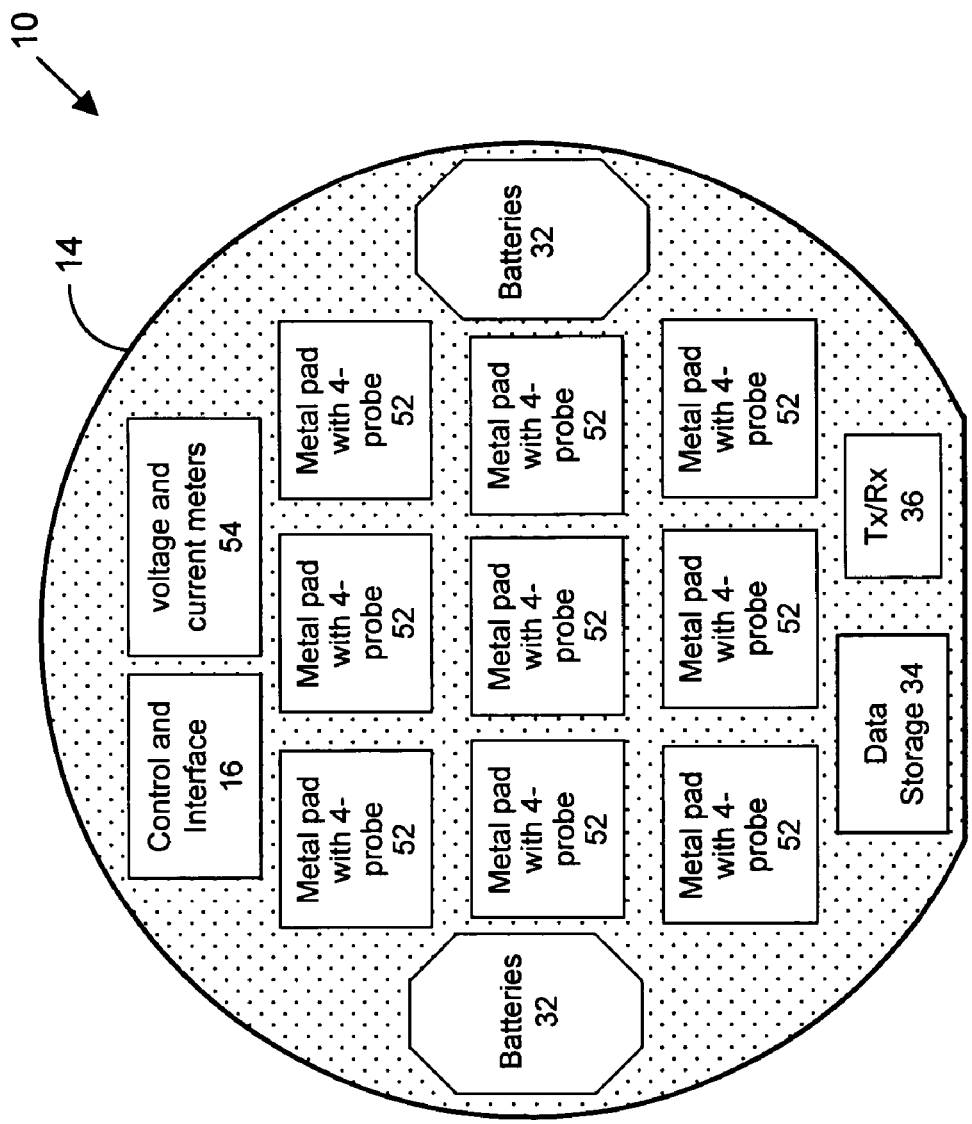

With reference to FIGS. 7A and 7B, EIW 10 may incorporate sheet resistance measurement techniques. In particular, with reference to FIG. 7B, EIW 10 may include a plurality of van der Pauw like structures, illustrated as Metal pad with four-probe 52. The EIW 10 of this embodiment may also include a power supply (for example, batteries 32), control and interface circuitry 16 to provide, for example, synchronization, clock generation, memory management, interface management, inter-chip communication, and/or calibration and compensation (for example, temperature compensation). The control and interface circuitry 16 may also include or consist of microprocessor, memory device, FPGA, DSP, and/or ASIC; wherein firmware may be resident therein.

The EIW 10 of this embodiment may also include measurement electronics, for example, voltage and current meters 54 having current source, current measurement, voltage measurement, and ADC/DAC circuitry/components. In addition, data storage 34 may reside on or in the substrate of EIW 10 to store the data measured, sampled, detected and/or collected during processing. The data storage 34 may be non-volatile memory like flash memory or volatile memory such as DRAM. The EIW 10 may employ wired, optical and/or wireless transmission techniques.

It should be noted that EIW 10 according to this embodiment, as with the other embodiments, may be tailored according to, for example, its desired use. That is, EIW 10 may contain some or all of the circuitry discussed above. For example, power and communications may be implemented in a variety of different manners (as described above). For the sake of brevity, those permutations and discussions will not be repeated. Moreover, the EIW of this embodiment may be a Source-EIW or a Sensor-EIW.

Figure 8:
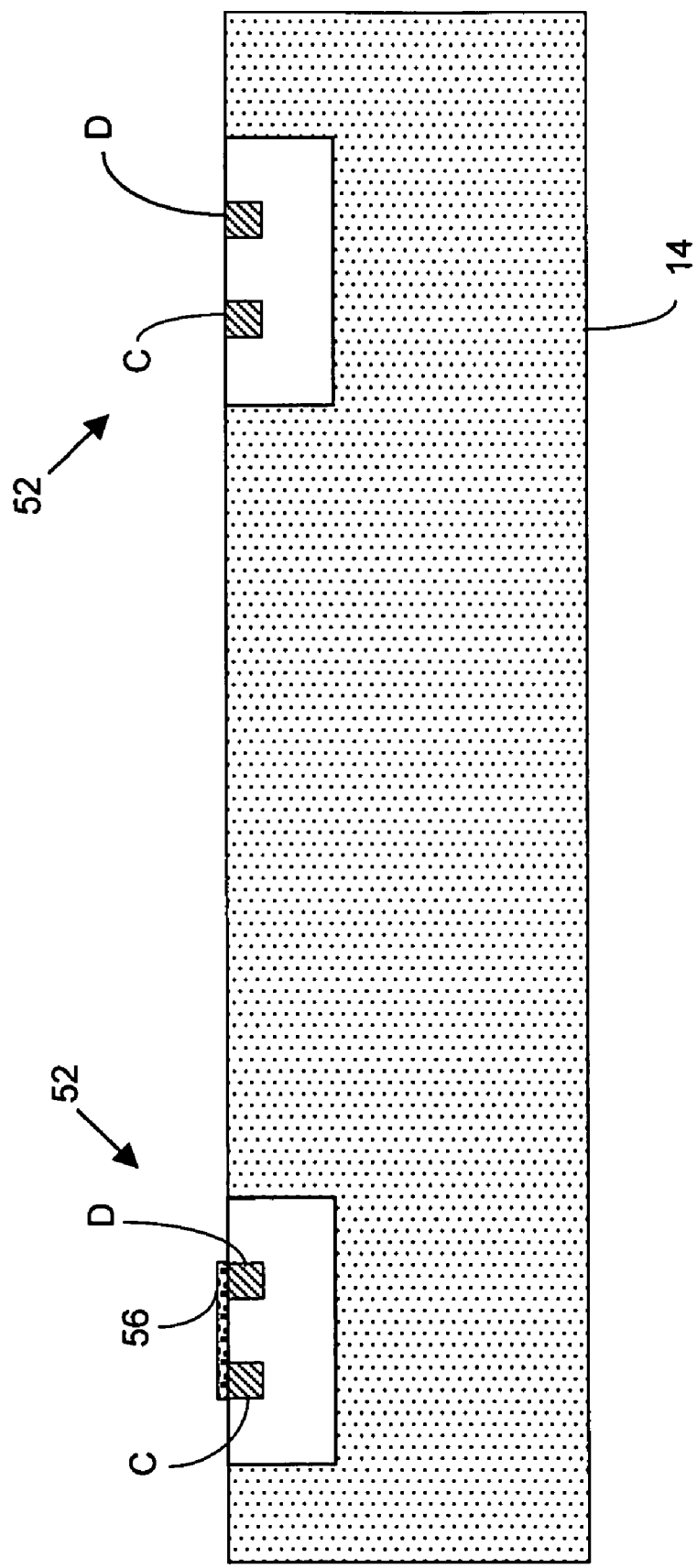
FIG. 8 is a cross-sectional view of a sheet resistance EIW according to one embodiment of the present invention.

With reference to FIG. 8, in one embodiment, EIW 10 of this embodiment may be fabricated using the four-probe structure 52 that is partially "buried" in substrate 14 but exposed on the surface of EIW 10. In this regard, electrode C and D are illustrated. Electrode A and B (not illustrated) may be implemented in the same manner. The conductive film 56 to be monitored is deposited on (or above) the surface of substrate 14 and is in electrical contact with electrodes A, B, C and D. In this way, the arrangement forms van der Pauw structure or four-probe structure 52.

During the deposition or polishing of conductive film 56, EIW 10 senses, samples, measures and/or detects the sheet resistance at predetermined, random, or periodic time intervals, and hence records and/or communicates the film's thickness and sequence of the film's thickness versus time. Indeed, the sheet resistance may be sampled, measured and/or detected periodically or continuously for a portion of or the entire deposition or polishing process. In this way, EIW may obtain information that provides a more complete characterization of deposition or polishing process.

With reference to FIGS. 9 and 10, in those instances where the forming of deposited material in shapes like a line(s)/space(s) or contact(s), in lieu of, or in addition to a pad structure illustrated in FIG. 8, it may be advantageous to employ integrated base pad 58 within or on EIW 10 to facilitate sampling, measuring and/or detecting the sheet resistance of the deposited material. In this regard, integrated base pad 58 may be "provided" by EIW 10 before deposition of additional material 60. The additional conductive material 60 is deposited on base pad 58 to form a desired pattern, which is in electrical contact with base pad 58.

It should be noted that any desired pattern(s) may be formed on the integrated base pad 58.

Figure 10B:
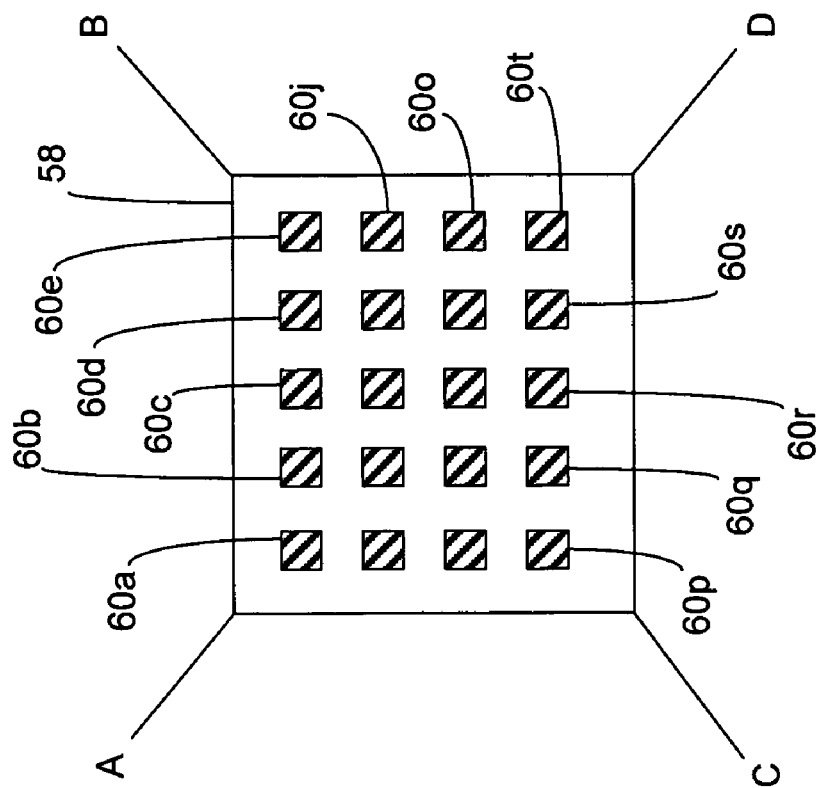
FIGS. 10A and 10B are a block diagram representation of an EIW for monitoring conductive film thickness, using a modified four-probe sheet resistance measurement technique, according to one embodiment of the present invention.
Figure 10A:
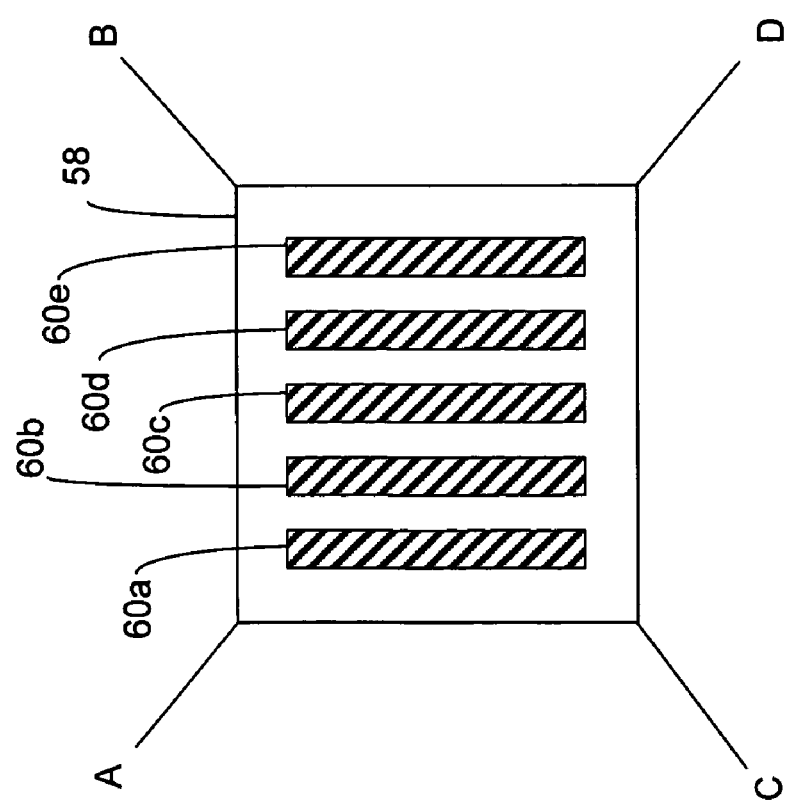

With continued reference to FIGS. 9 and 10, the relation between sheet resistance and film thickness may deviate from the van der Pauw equation expressed above. However, with a pattern and known resistivity of both pad 58 and deposited layer 60a–60d (FIG. 9), 60a–e (FIG. 10A) and 60a–60t (FIG. 10B), the relation between measured sheet resistance and the film thickness may be derived and/or numerically solved using first-principle equations (for example, Maxwell Equations).

It should be noted that there are many techniques of using a four-probe sensor to measure sheet resistance, all of which, whether now know or later developed, are intended to be within the scope of the present invention. For example, with reference to FIG. 11, four-probe technique is illustrated where a current is applied/supplied between electrodes A and B, and voltage drop is measured between electrodes C and D. The relation may be expressed as:

$$R_{CD,AB} = RS^*(L/W)$$

where $R_{CD,AB}$=the resistance determined by dividing the potential difference between C and D by the current going from A to B, L=the distance between C and D, and W=the line width of the conductive line.

It should be noted that there are many applications of EIW 10 that is configured to monitor sheet resistance. For example, the applications may include (1) monitoring film growth or deposition (for example, sputtering, CVD, LPCVD, and PECVD) process; and (2) monitoring polishing and lapping process (for example, CMP).

Figure 11:
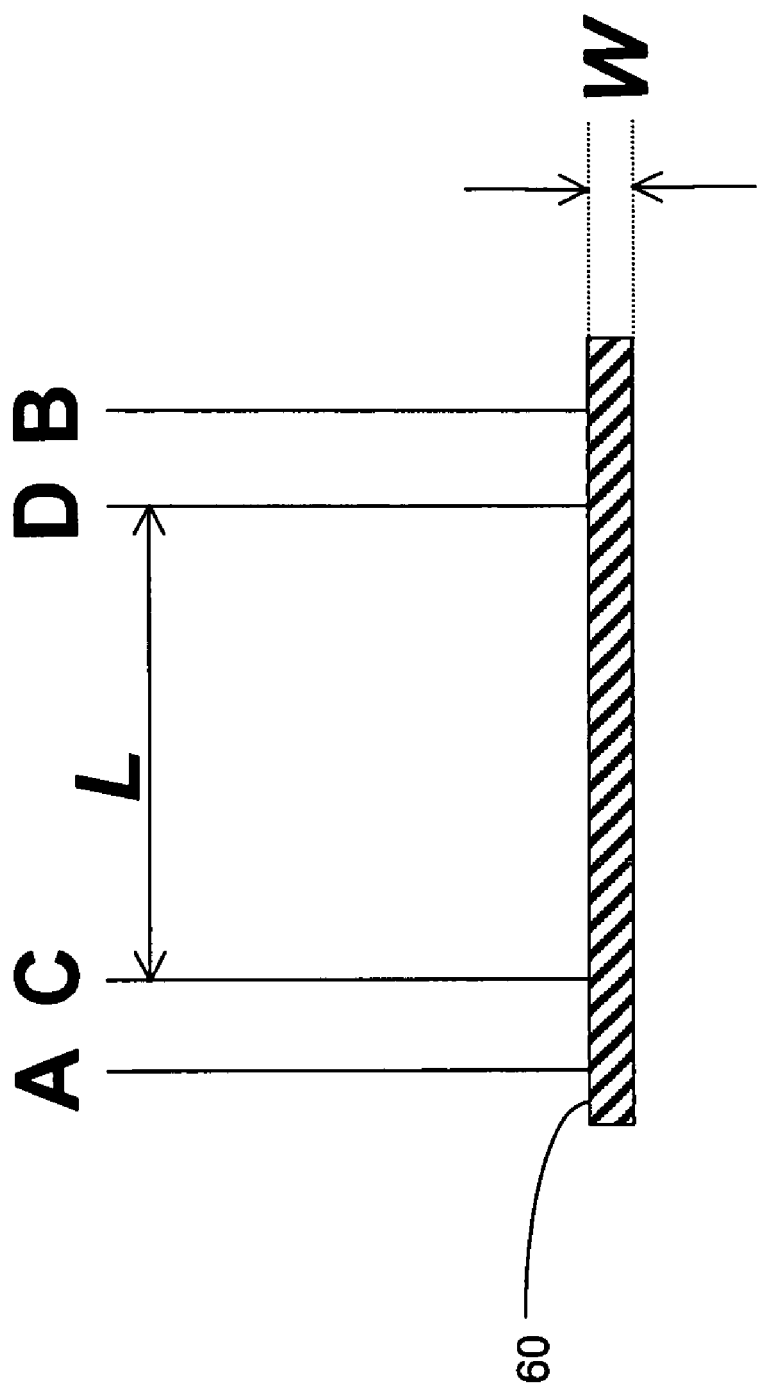
FIG. 11 is an exemplary four-probe linewidth measurement structure according to one embodiment of the present invention.

EIW Embodiment(s) to Characterize CD Uniformity and Distribution Using Conductive Film Techniques:

The embodiments of FIG. 11 may also be employed to sample electrical test structure for critical dimension ("CD") measurements. As described above, the relationship describing this structure may be expressed as:

$$R_{CD,AB} = RS^*(L/W)$$

As such, where the sheet resistance "Rs" is known (for example, from a van der Pauw located close to a test structure), and the line length "L" between C and D is known, the linewidth may be determined from the measurement of $R_{CD,AB}$. This technique is widely used in semiconductor manufacturing in measuring linewidth using electrical test.

Figure 12:
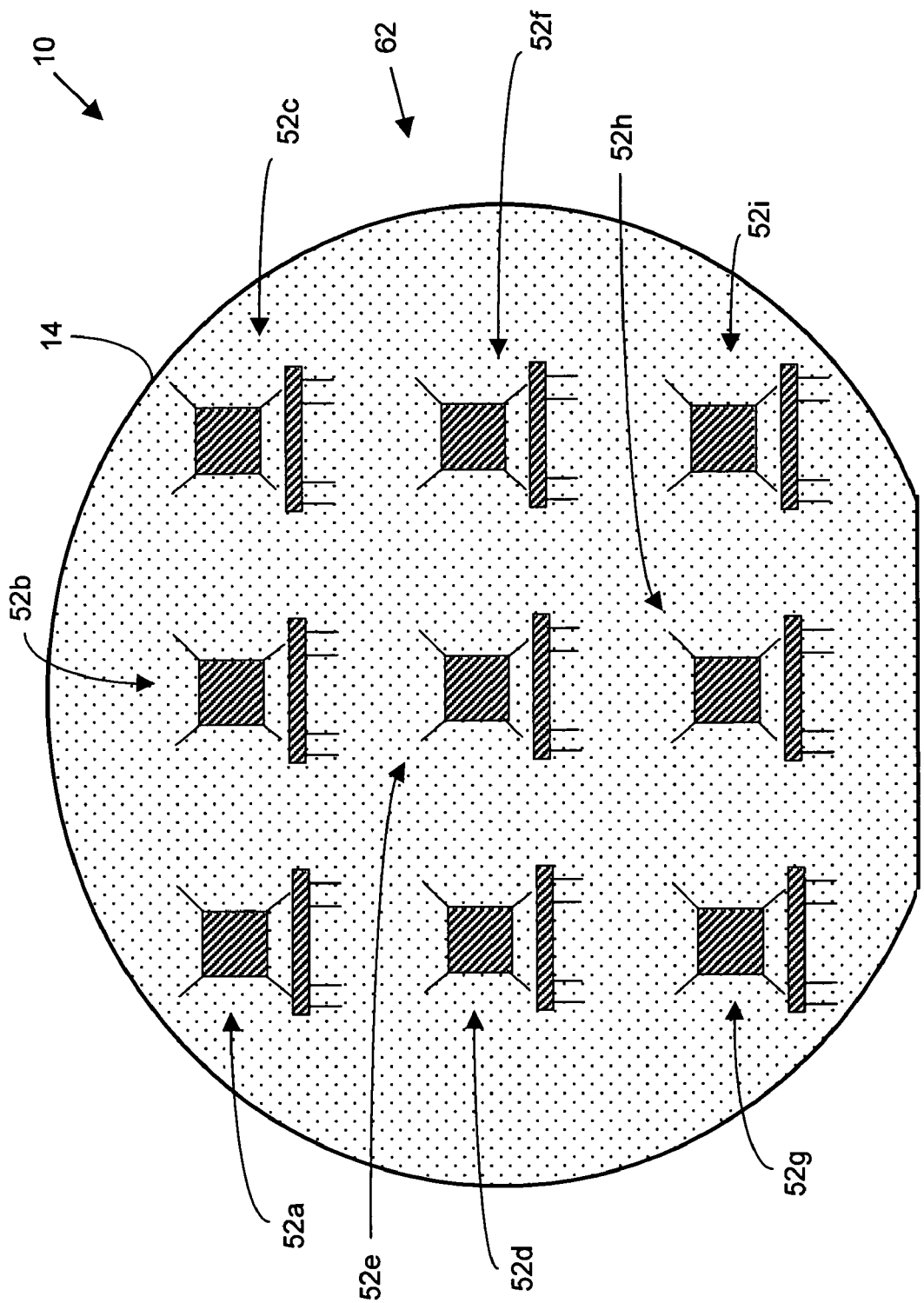
FIG. 12 is a block diagram representation of an EIW, including an array of sheet resistance measurement sensors, according to one embodiment of the present invention.

With reference to FIG. 12, EIW 10 may include the structure to determine linewidth measurement. The EIW 10 may include an electrical test structure at multiple locations, for example, an array 62 of metal pad with four-probe structures 52a–i, across substrate 14, together with associated metal pad with four-probe structure 52 located near to each linewidth test structure.

The EIW 10 may include integrated electrodes and/or electronics (current source, current and voltage meters, and control) as described above with respect to FIGS. 7A, 7B, 8 and 9. In operation, the PE creates or deposits additional conductive pad 60 that, together with the built-in electrodes (i.e., electrodes A–D), forms the electrical linewidth test structures. The EIW 10 may also sense, detect, sample and determine as well as characterize and/or analyze the linewidth distribution across the wafer after and/or during the process, as described above in conjunction with the embodiments of FIGS. 7A, 7B, 8 and 9.

Further, the location of the built-in electrodes (electrodes A–D) of EIW 10 may be predetermined and/or selected to measure CD for specific or selected portions or part(s) of a given product. For example, it may be desirable to monitor the linewidth of one, some or all of the lines associated with the transistors of a state of the art microprocessor (i.e., the given product). The information of the lines and associated linewidths to be measured may be employed to "layout" sensors 52a–g or EIW 10. That is, electrodes and the associated electronics of sensors 52a–g may be spatially positioned or located to measure the designated, one or more linewidths. In this regard, EIW 10 becomes a CD measurement tool that may be advantageously implemented in the manufacturing of a particular product or integrated circuit device (i.e., microprocessor). One advantage of doing so is that the designated EIW will provide information that reflects the actual circuits being designed and manufactured, which may not be available from measurements that uses only simplified test structures.

Additional EIW Embodiments

The EIW of the present invention may be implemented using a wide variety of sensor and techniques of sensing and/or sampling, for example, temperature sensors, pressure sensors, voltage sensors, ion sensors, photo sensors, and/or chemical sensors. Several of these sensors (and actuators) are based on solid-state technology, which may facilitate integration on or in the wafer or wafer-like platform of the EIW of the present invention. Such a configuration allows the EIW to maintain a profile that is well suited for implementation in current integrated circuit fabrication processes.

Many of these sensors are based on micro electromechanical systems (MEMS) technology. These sensors are typically manufactured from or on silicon wafers using processes that are similar to those used in integrated circuit manufacturing. As such, the EIW of the present invention may be implemented using MEMS sensors (and actuators) that are integrated into or onto a wafer or wafer-shaped substrate to perform process monitoring, measuring and/or sampling functions.

Thermal Sensors

Figure 13A:
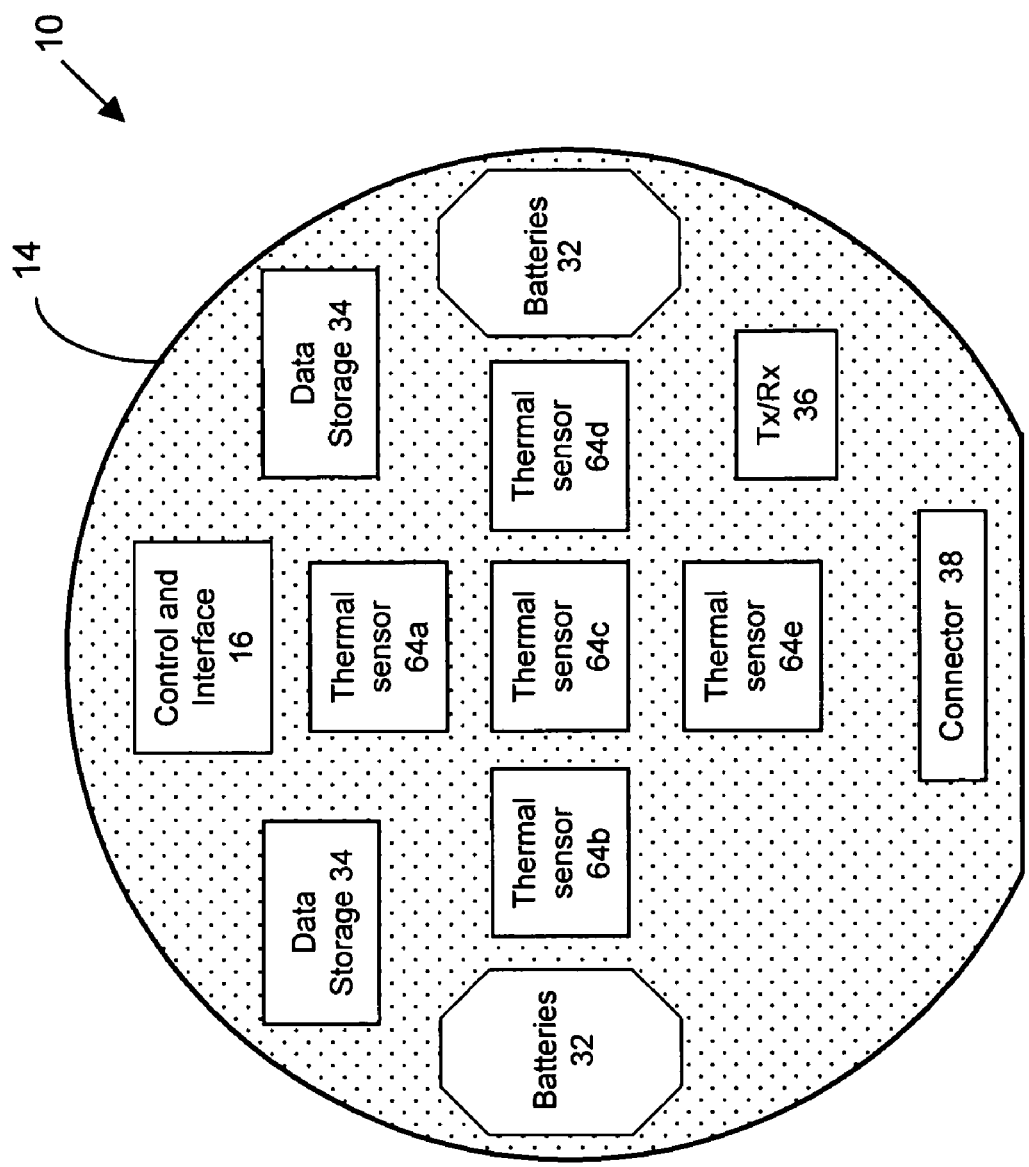
FIGS. 13A and 13B are block diagram representations of an EIW, including an array of temperature sensors, according to several embodiments of the present invention.
Figure 13B:
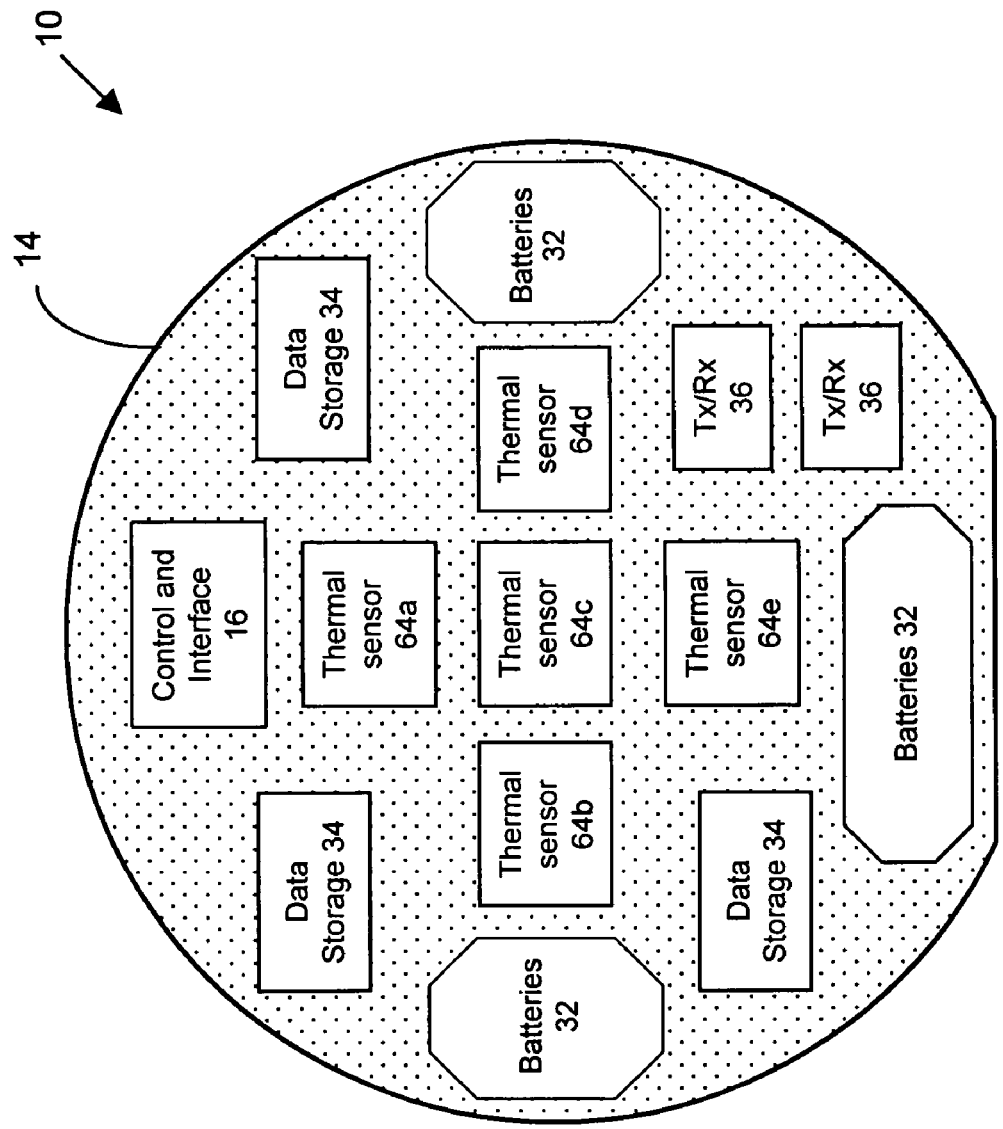

As mentioned above, an EIW according to one embodiment of the present invention may include thermal sensors. With reference to FIGS. 13A and 13B, thermal sensors 64a–e disposed or integrated on or in the substrate of EIW 10 may be employed to detect, sample, measure, and/or monitor the temperature distribution, gradients and/or fluctuations during manufacture of, for example, a mask. The thermal sensors may be, for example, thermocouples and thermoresistors (thermistors).

Thermocouples

Briefly, by way of background, when two dissimilar metals (for example, copper and iron) are brought together in a circuit, and the junctions are held at different temperatures, then a small voltage is generated and an electrical current flows between them.

Figure 14:
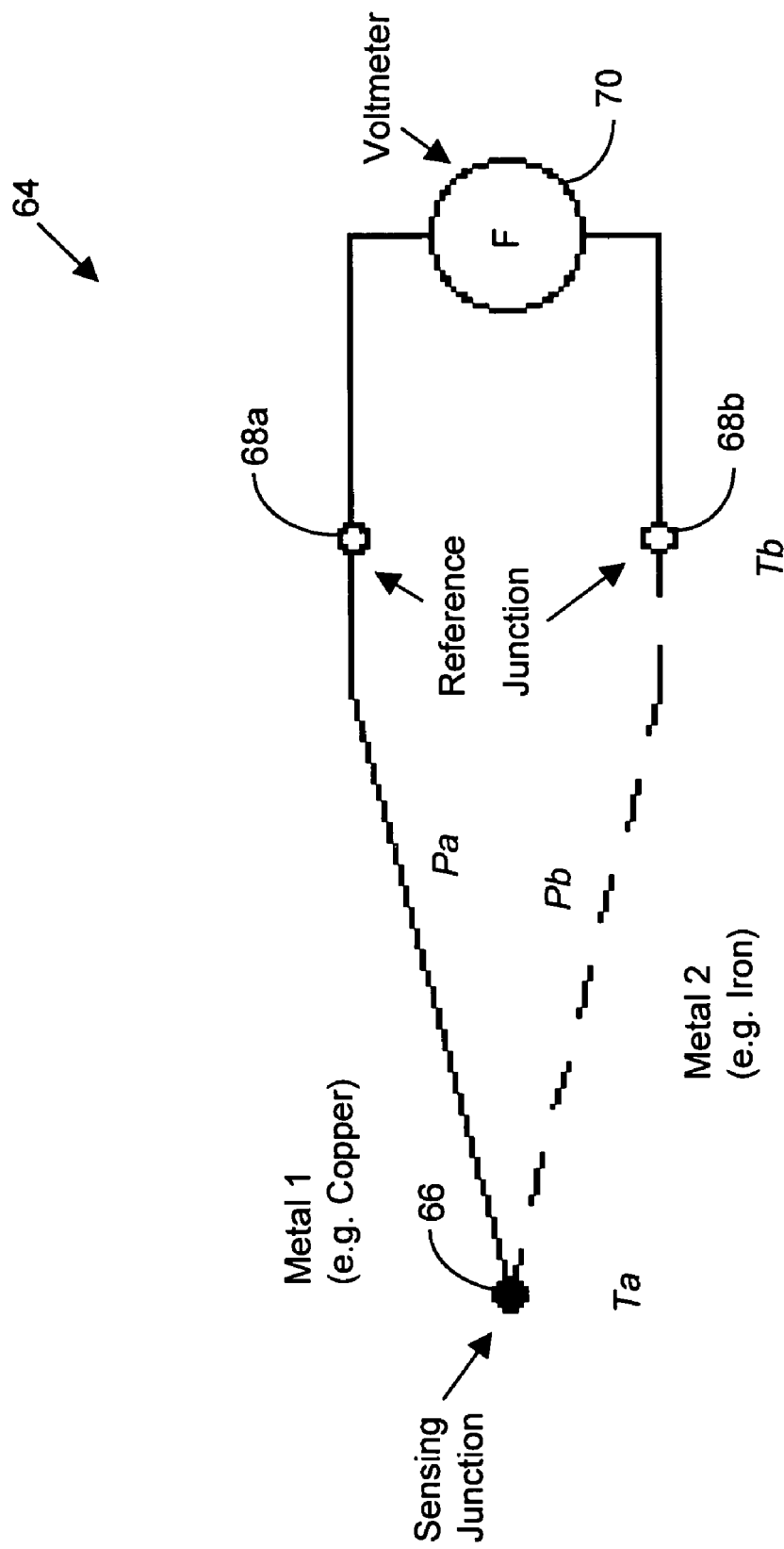
FIG. 14 is a schematic representation of a thermal couple according to one embodiment of the present invention

With reference to FIG. 14, thermal sensor 64 may include a thermocouple having a sensing junction 66, at temperature Ta, and a reference junction 68, at temperature Tb. A high resistance voltmeter 70 may measure, sense, sample and/or detect the voltage developed by the thermocouple.

The open circuit voltage (i.e. as measured by an ideal voltmeter with infinite input impedance) is related to the temperature difference (Ta–Tb), and the difference in the Seebeck coefficients of the two materials (Pa−Pb), and may be derived using the following equation:

$$V=(Pa-Pb)(Ta-Tb)$$

where "V" will typically be of the order of millivolts, or tens of millivolts, for metal thermocouples with temperature differences in the order of 200° C.

The thermocouples may also be comprised of semiconductor materials. Semiconductor materials often exhibit a better thermoelectric effect than metals. In one embodiment of the present invention, EIW 10 includes one or more semiconductor thermocouples is/are integrate or dispose on or in substrate 14. The thermocouples may be interconnected, for example, in series, to make a thermopile, which has a larger output voltage than an individual thermocouple.

It is noted, however, that the high thermal conductivity of silicon may make it difficult to maintain a large temperature gradient (Ta−Tb). As such, it may be advantageous to thermally isolate the sensing element from the bulk of the silicon wafer. This may be done by fabricating the device on bridges or beams machined and/or fabricated from silicon.

Thermoresistors

In one embodiment of the present invention, the thermocouples include thermoresistors. Briefly, by way of background, the electrical resistivity of metals varies with temperature. Above 200° C., the resistivity varies nearly linearly with temperature. In this approximately linear region, the variation of resistivity (r) with temperature (T) may be characterized as:

$$r=R(1+aT+bT^2)$$

where "R"=the resistivity of the material at a reference temperature (0° C.), and "a" and "b"=constants specific to the metal employed.

It should be noted that platinum is often employed because its resistance variation may be linear with temperature (i.e. "b" is particularly small).

It may be advantageous to employ a resistance bridge network to detect a change in resistance because metal thermoresistors generally have relatively small resistances, and their rate of change of resistance with temperature (temperature coefficient of resistance (TCR)) is not particularly large.

In one embodiment, the present invention may employ semiconductor thermoresistors (or thermistors) to sense, sample and/or detect temperature distribution, gradients and/or fluctuations of a given process (for example, manufacture of a mask). Semiconductor thermoresistors may be formed from metal oxides or silicon. Generally, semiconductor thermoresistors may not be as accurate or stable as metal (for example, platinum) thermoresistors. However, semiconductor thermoresistors tend to be less expensive to manufacture and may be more easily integrated into or onto the substrate of an EIW according to the present invention.

The temperature coefficient resistivity of a thermistor tends to be highly non-linear and negative, and quite dependent on the power being dissipated by the device. The resistivity is typically expressed relative to the resistivity at 25° C. with no power being dissipated by the device, and may typically range between 500 Ohms and 10M Ohms.

It should be noted that due to the negative TCR, the resistor may go into a self-heating loop: current flowing through the resistor heats the resistor, the resistivity drops, more current flows, its temperature increases. However, the large TCR permits the thermistors to be coupled directly to amplifier circuits without connection to a bridge configuration. Appropriate calibration techniques may be employed to address any nonlinearity considerations.

Notably, microengineering techniques may be used in a variety of ways to enhance thermal sensors. As mentioned above, such techniques may be used to thermally isolate the sensing element from the remainder of the device. Also, arrays of sensors may be implemented to provide signals that are larger than the signal from one sensor. In those instances where the sensor is small and thermally isolated, then its response time (the time the sensor takes to heat/cool in response to changes in the temperature of the environment) may be quite fast. With silicon based sensors there are advantages if electronics were integrated into or onto the integrated circuit (for example, calibration done on-chip, self-testing), wafer or substrate.

Thermal Flow-Rate Sensors

Figure 15A:
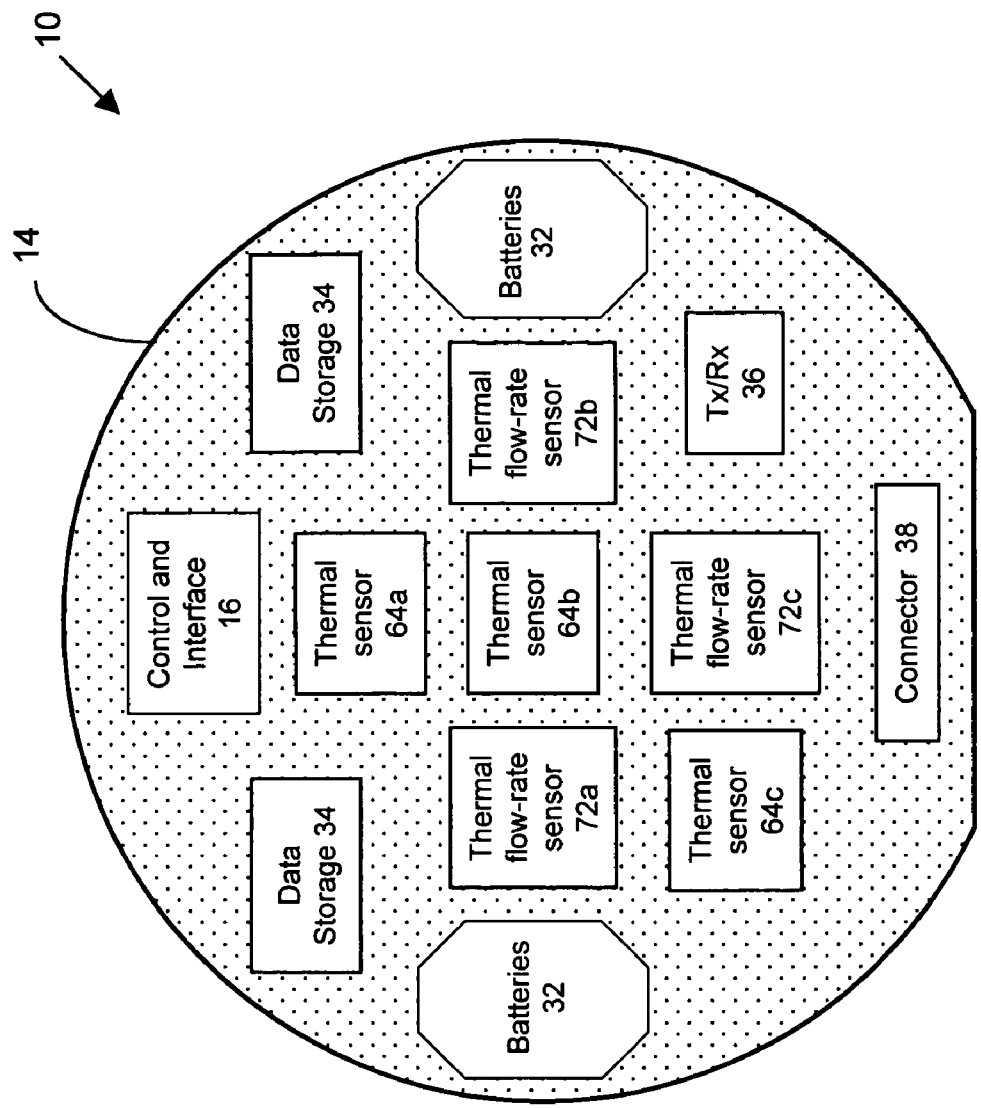
FIGS. 15A–C are block diagram representations of an EIW, including an array of thermal flow-rate sensors, according to several embodiments of the present invention.
Figure 15B:
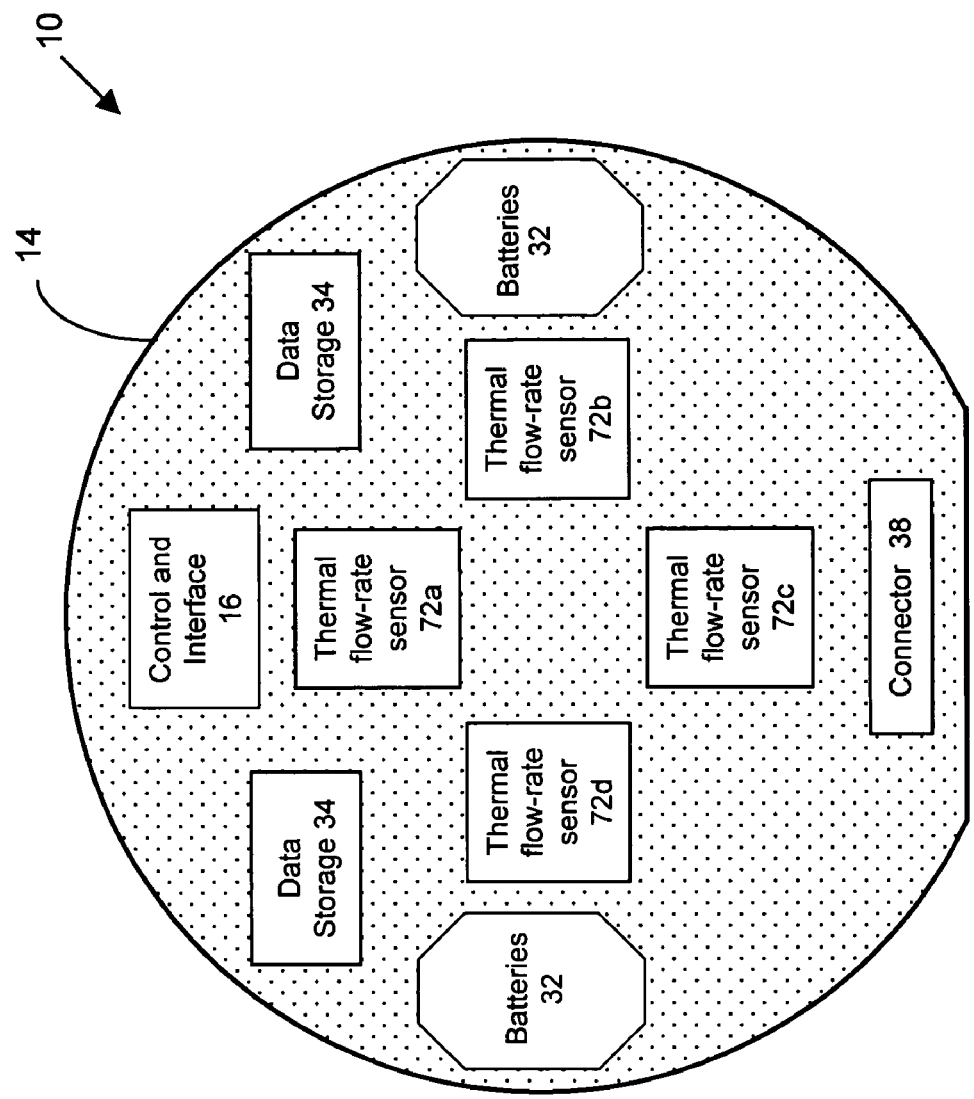
Figure 15C:
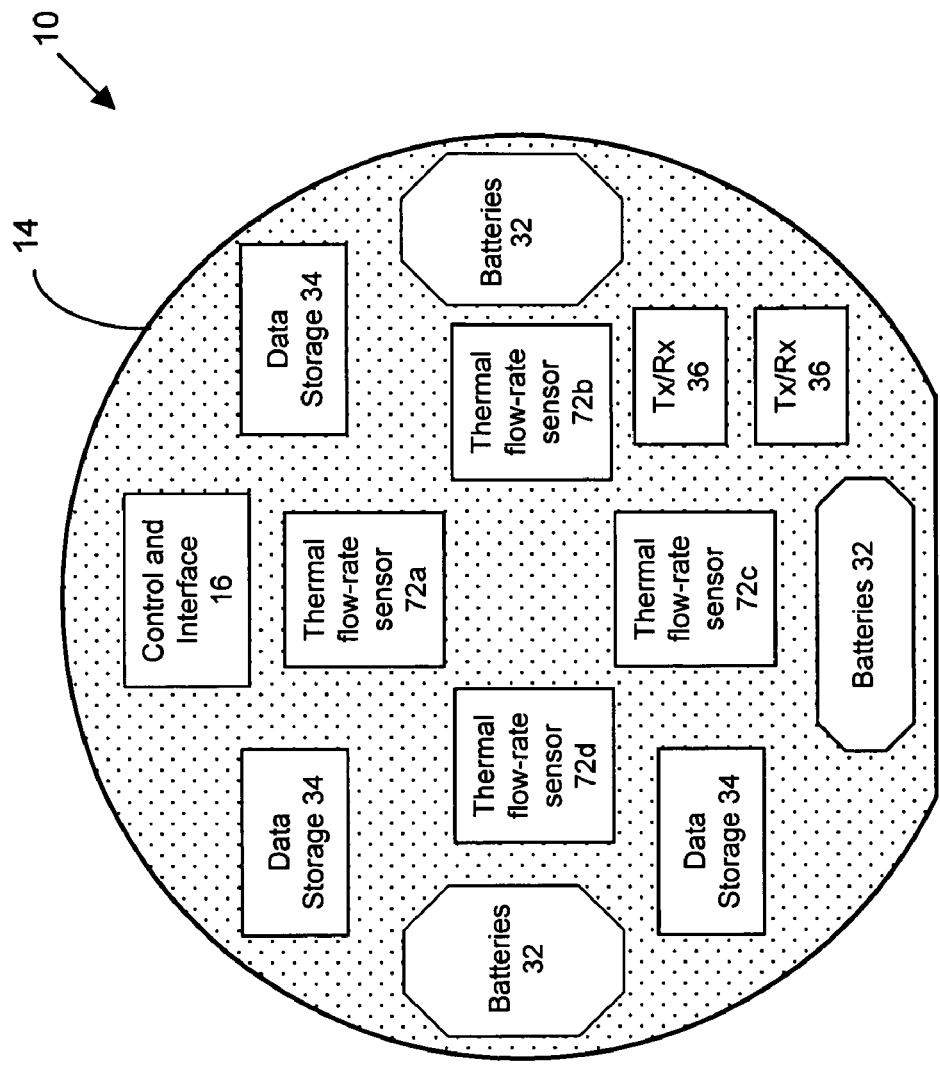

An EIW according to one embodiment of the present invention may include thermal flow-rate sensors. With reference to FIGS. 15A, 15B and 15C, thermal sensors 64, as described above, and/or thermal flow-rate sensors 72 may be incorporated into or onto substrate 14 of EIW 10 of the present invention to detect, sample, measure, and/or monitor the mass flow rate (in addition to temperature and temperature distribution) during a given integrated circuit processing step, for example, sputtering, chemical vapor deposition ("CVD") or plasma-enhanced CVD (PECVD).

There are a number of ways by which the rate of flow of gasses and liquids may be monitored using thermal sensors 64. All techniques and configurations to detect, sample, measure, and/or monitor the mass flow rate, whether now known or later developed, are intended to fall within the scope of the present invention provided such techniques and configurations may be implemented into or onto an EIW of the present invention. For example, in one embodiment, a first sensor may measure the temperature of a fluid as it enters the sensor and a second sensor may measure the temperature as it exists the sensor (after the fluid has been passed over a heating resistor). The temperature difference measured by the first sensor and the second sensor may be inversely proportional to the mass flow rate.

In another embodiment, EIW 10 employs a thermal sensor that is maintained at a constant temperature (using heating resistors, with thermal sensors for feedback control), and measures, detects, samples and/or senses the amount of power required to maintain the temperature. The required power may be proportional to the mass flow rate of material over the sensor.

Radiation Sensors

Pyroelectric Sensors

With reference to FIG. 16, in one embodiment of the present invention, EIW 10 may include one or more pyroelectric sensors 74 to sense, detect, measure and/or monitor incident thermal energy associated with electromagnetic radiation on the wafer in, for example, a process chamber. Briefly, by way of background, pyroelectric sensor(s) operate on the pyroelectric effect in polarized crystals (for example, zinc oxide). These crystals have a built-in electrical polarization level which changes in accordance with an amount of incident thermal energy.

Pyroelectric sensors 74 are generally high impedance devices. As such, pyroelectric sensors 74 are often buffered using field effect transistors. The pyroelectric sensors 74 may automatically zero to the ambient temperature. As such, under this circumstance, sensors 74 may respond to rapid fluctuations.

The EIW 10 having a pyroelectric sensor 74 may monitor incident thermal energy onto the wafer in, for example, a process chamber. An EIW according to this embodiment may be employed in, for example, baking (annealing) chambers and rapid-thermal-process (RTP) chambers.

It should be noted that crystals employed in pyroelectric sensors 74 often exhibit piezoelectric effects as well as pyroelectric effects. Accordingly, it may be advantageous to implement the crystals of sensor 74 on or in substrate 14 of EIW 10 in a manner that avoids strain on the crystals.

It should be further noted that the earlier discussions of, for example, electrical power supply techniques and circuitry, as well as the communications link, techniques and circuitry, are fully applicable to this aspect of the present invention. For the sake of brevity, those discussions will not be repeated.

Detailed description of the physics and implementations of pyroelectric sensors may be found in, for example, Microsensors, MEMS and Smart Devices, Gardner, et al., John Wiley & Sons, Incorporated, 2001, the entire contents of which are incorporated herein by reference herein.

Photoconductive and Photovoltaic Sensors

Figure 17:
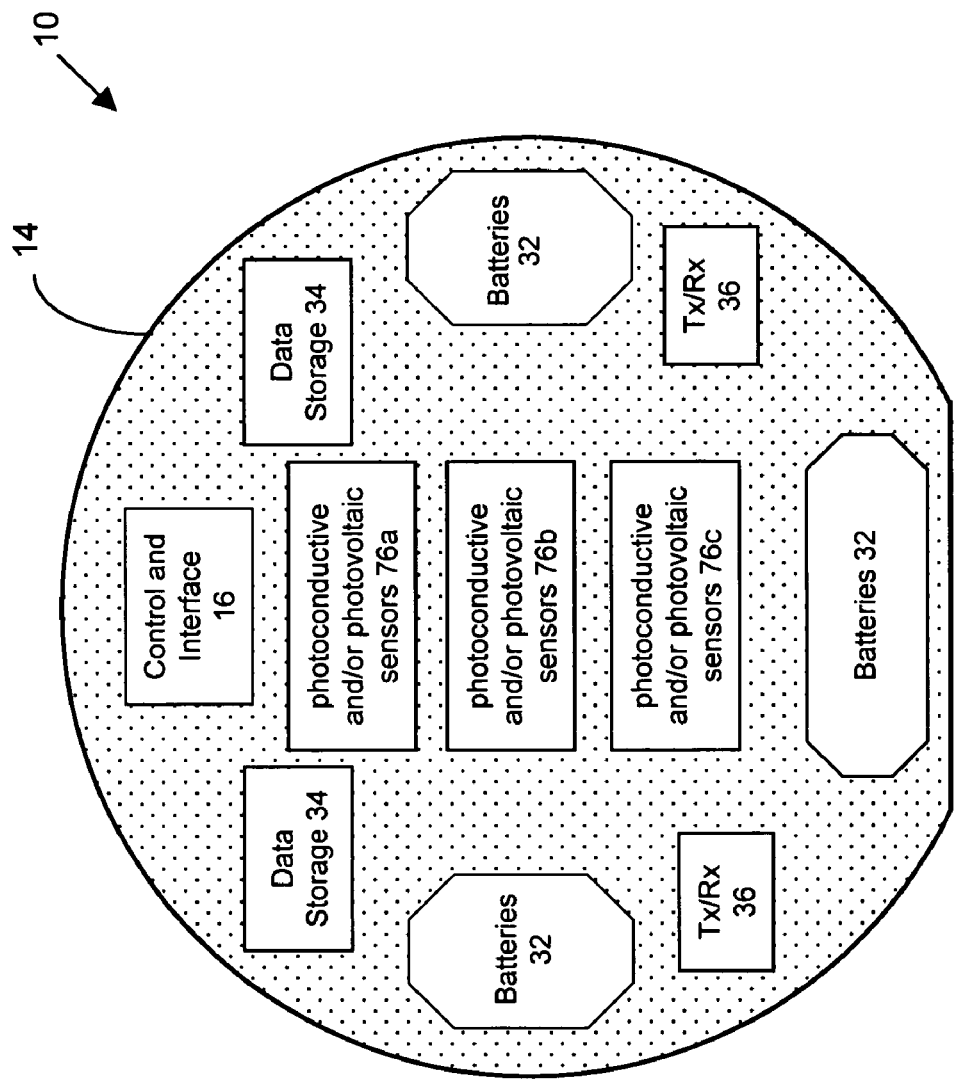
FIG. 17 is a block diagram representation of an EIW, including a plurality of photoconductive and photovoltaic sensors, according to several embodiments of the present invention.

With reference to FIG. 17, in one embodiment of the present invention, EIW 10 may include one or more photoconductive and/or photovoltaic sensors 76 to sense, sample, detect, measure and/or monitor radiation on the wafer. Briefly, photoconductive and photovoltaic sensors utilize the photoconductive and/or photovoltaic effects. Photoconductive materials become electrically conductive when exposed to radiation. Photovoltaic materials exhibit electrical voltage when exposed to radiation. Both types of devices may be manufactured in a solid-state form, and specifically MEMS format. A detailed discussion of the physics and implementations may be found in, for example, Microsensors, MEMS and Smart Devices, by J. W. Gardner et al., John Wiley & Sons, 2001, which, as mentioned above, is incorporated by reference herein.

It should be further noted that the earlier discussions of, for example, electrical power supply techniques and circuitry, as well as the communications link, techniques and circuitry, are fully applicable to these embodiments of the present invention. For the sake of brevity, those discussions will not be repeated.

Microantenna

In another embodiment of the present invention, EIW 10 may include one or more microantennas to sense, sample, detect, measure and/or monitor radiation on or at the surface of the wafer. Radiation antennas may be made in the solid-state and/or MEMS format to collect radiation energy and output an electrical signal. A detailed discussion of the physics and implementations may be found in, for example, Microsensors, MEMS and Smart Devices, by J. W. Gardner et al., 2001 (which, as mentioned above, is incorporated by reference herein in its entirety.

Mechanical Sensors

The EIW of the present invention may include one or more mechanical sensors to sense, sample, detect, measure and/or monitor many parameters including, but not limited to, acceleration, deceleration, displacement, flow rate of gas or liquid, force, torque, position, angle, pressure, and/or stress. These sensors may be based on MEMS technology. These parameters may be significant to processes of integrated circuit manufacturing—for example, in CMP, the force and the resultant pressure applied to the wafer surface, when polishing, is a significant parameter when determining the polishing rate. The uniformity of polishing rates across the wafer may determine the uniformity of the resultant thin film, which in turn has far-reaching effects on integrated circuit device performance and yield. In addition to the examples of the mechanical sensors described herein, those sensors described and illustrated in Microsensors, MEMS and Smart Devices, by Gardner et al., (which, as mentioned above, is incorporated herein by reference) may also be employed.

Pressure Sensors

Figure 18:
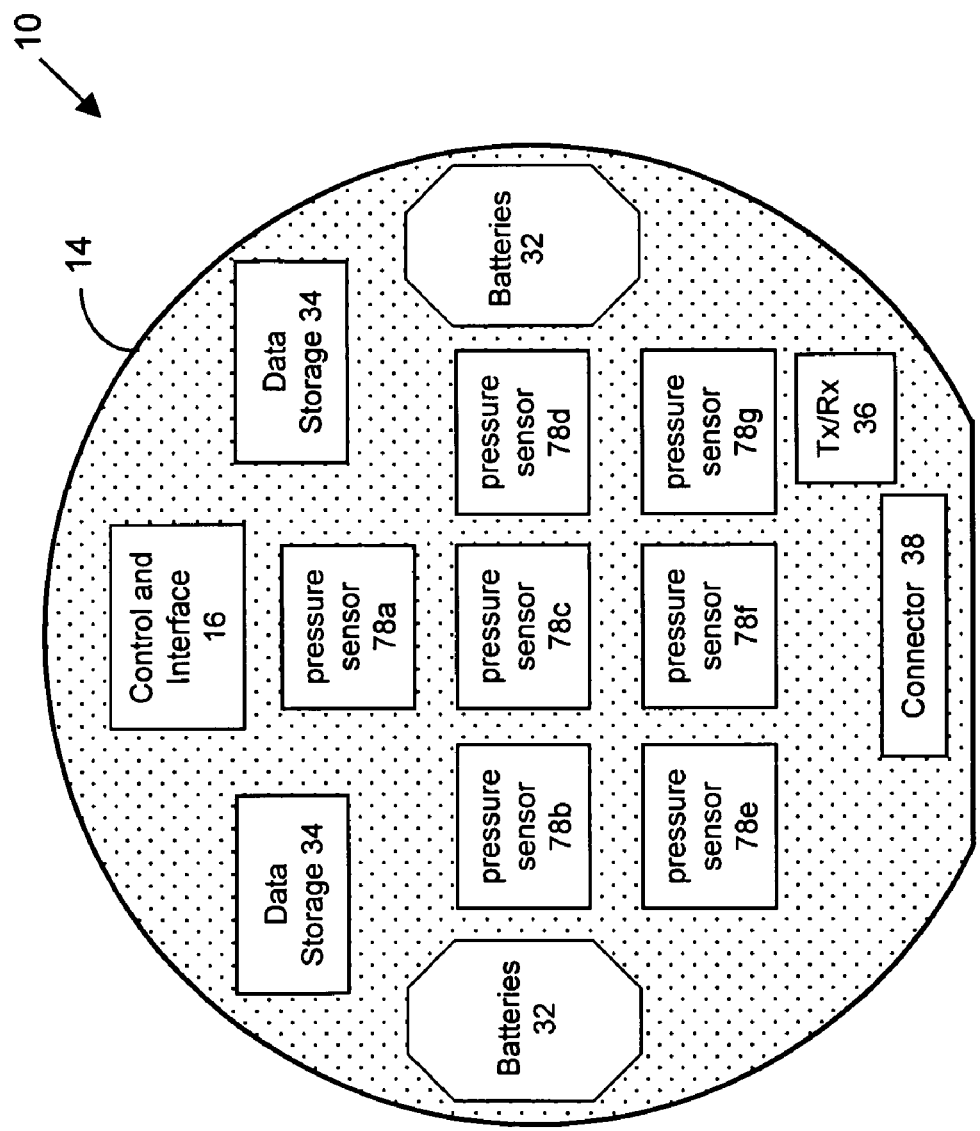
FIG. 18 is a block diagram representation of an EIW, including a plurality of pressure sensors, according to several embodiments of the present invention.

With reference to FIG. 18, in one embodiment of the present invention, EIW 10 may include one or more pressure sensors 78 to sense, sample, detect, measure and/or monitor certain processes, for example, a deposition process. Microengineered pressure sensors may be based on thin membranes. In this regard, on one side of the membrane is an evacuated cavity (for absolute pressure measurement), and the other side of the membrane is exposed to the pressure to be measured. The deformation of the membrane may be sensed, sampled, detected and/or monitored using, for example, piezoresistors or capacitive techniques.

Piezoresistors and Piezoelectric Sensors

The EIW 10, in one embodiment of the present invention, may include piezoresistors and/or piezoelectric pressure sensors to sense, detect, measure and/or sample stress, or stress related parameters or effects, caused, induced or experienced during certain processes, for example, during CMP processes or dry processes where the pressure of the gas is a controlled parameter of the process.

Briefly, by way of background, a change in resistance of a material with applied strain may be characterized as a piezoresistive effect. Piezoresistors may be fabricated in silicon; being just a small volume of silicon doped with impurities to make it an n-type or p-type device.

In operation, in response to a force applied to a piezoelectric material, a charge is induced on the surface of the material. The induced charge is proportional to the applied force. The force applied to the piezoelectric material may be determined by measuring, sampling, detecting or sensing the electrical potential across the crystal. Piezoelectric crystals may include zinc oxide and PZT (PbZrTiO3—lead zirconate titanate), which may be deposited and patterned on microstructures.

In one embodiment, piezoresistors are integrated into or onto substrate 14 of EIW 10 may be employed as a pressure sensor in order to sense, detect, sample and/or measure stress on or in the wafer caused by the particular process. Stress related information may be useful in characterizing the CMP process, since CMP relies on the pressure to realize the polishing effect. The EIW 10 of this embodiment of the present invention may also be useful in characterizing other process steps that rely on or impact the pressure on the wafer, for example, those dry processing steps where the gas pressure is critical and/or tightly controlled aspect of the process.

It should be further noted that the earlier discussions of, for example, electrical power supply techniques and circuitry, as well as the communications link, techniques and circuitry, are fully applicable to these embodiments of the present invention. For the sake of brevity, those discussions will not be repeated.

Capacitive Sensors

Figure 19:
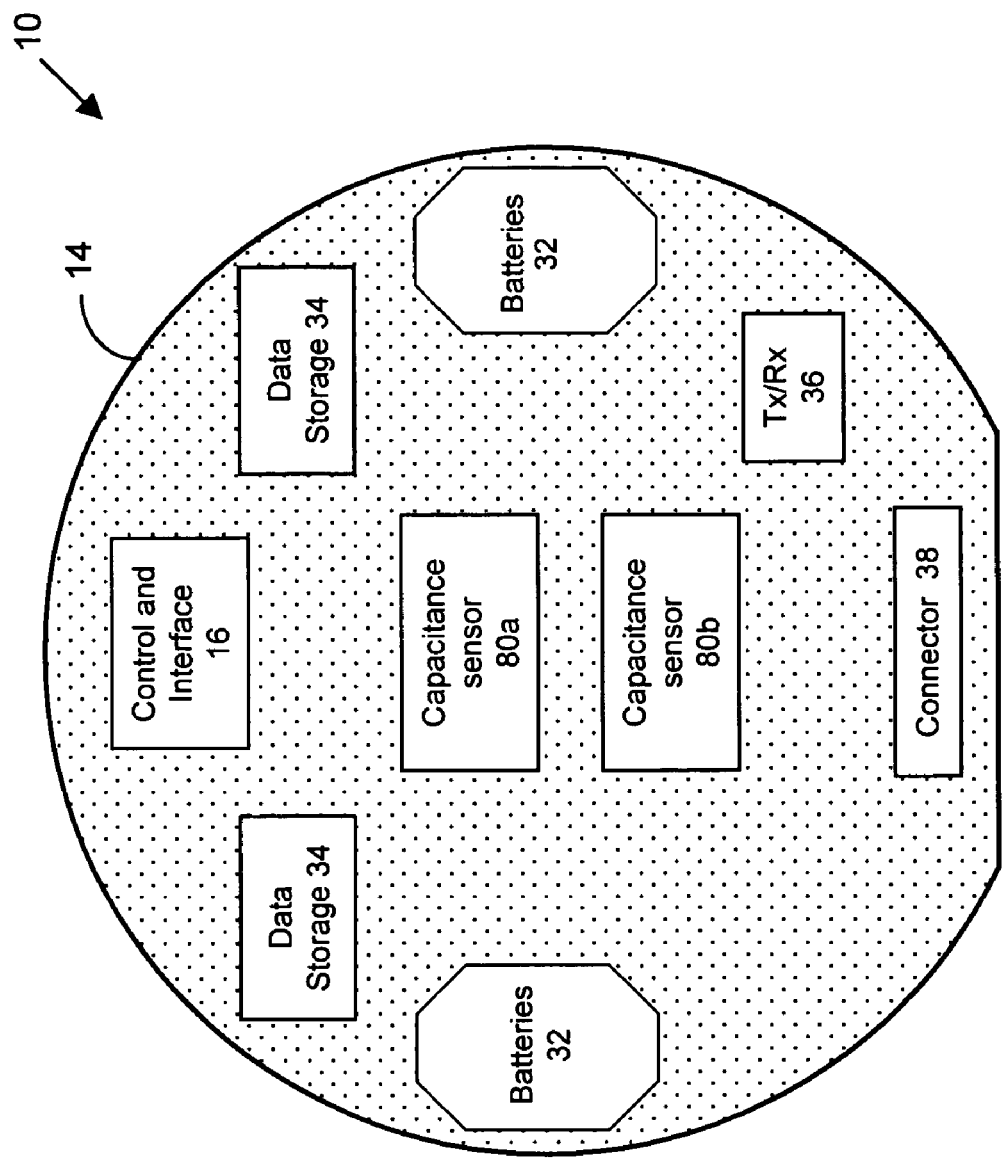
FIG. 19 is a block diagram representation of an EIW, including a plurality of capacitance sensors, according to several embodiments of the present invention.

With reference to FIG. 19, in one embodiment, EIW 10 may include one or more capacitor sensor 80 to sense, detect, measure and/or sample small displacements (microns—tens of microns) with relatively high accuracy (sub-nanometer) that may be caused, induced and/or experienced during processing. Briefly, by way of background, for two parallel conducting plates, separated by an insulating material, the capacitance between the plates may be expressed as:

$$C=\epsilon A/d$$

where
- A=the area of the plates,
- d=the distance between the plates, and
- ε=the dielectric constant of the material between the plates.

It should be noted that the expression above assumes the circumference of the plates is much larger than the distance between them, so affects at the edges of the plates may be neglected.

From the above relationship, it may be readily seen that the measured capacitance is inversely proportional to the distance between the two plates. Thus, by incorporating capacitor sensors 80 (and associated capacitance measuring circuitry 82) into or onto substrate 14 of EIW 10, EIW 10 may sense, detect, measure, sample and/or monitor displacements induced in semiconductor processing steps or stages. It should be noted that techniques to accurately measure capacitance are well known arts to those skilled in the art of electronics.

It should be further noted that the electrical power supply techniques and circuitry, as well as the communications link, techniques and circuitry, discussed above are fully applicable to this embodiment of the present invention. For the sake of brevity, those discussions will not be repeated.

Chemical Sensors

As mentioned above, EIW 10 of the present invention may include one or more chemical sensors 44 to sense, sample, detect, measure and/or monitor many different types of parameters relating to a change in the physical and/or chemical properties of a given layer or structure due to a physical and/or chemical reaction, as well as the chemical environment that a product wafer is otherwise exposed to (see, for example, FIGS. 5A, 5C, 5D and 5E). The chemical sensors 44 typically consist of a chemically sensitive layer, whose physical properties change when exposed to certain chemicals via physical or chemical reactions. These physical changes may be sensed or sampled by a sensing transducer. It should be noted that many types of chemical sensors may be implemented on or in the EIW of the present invention. As such, all chemical sensors that may be integrated on or in an EIW, whether now known or later developed, are intended to fall within the scope of the present invention. For example, the chemical sensors described and illustrated in, for example, Chemical Sensing with Solid-State Devices, Madou et al., Academic Press, 1989, may be implemented. The entire contents of Chemical Sensing with Solid-State Devices, Madou et al., Academic Press, 1989, are incorporated herein by reference herein.

Ion Sensitive Field Effect Transistor Sensors (ISFETs)

Figure 20:
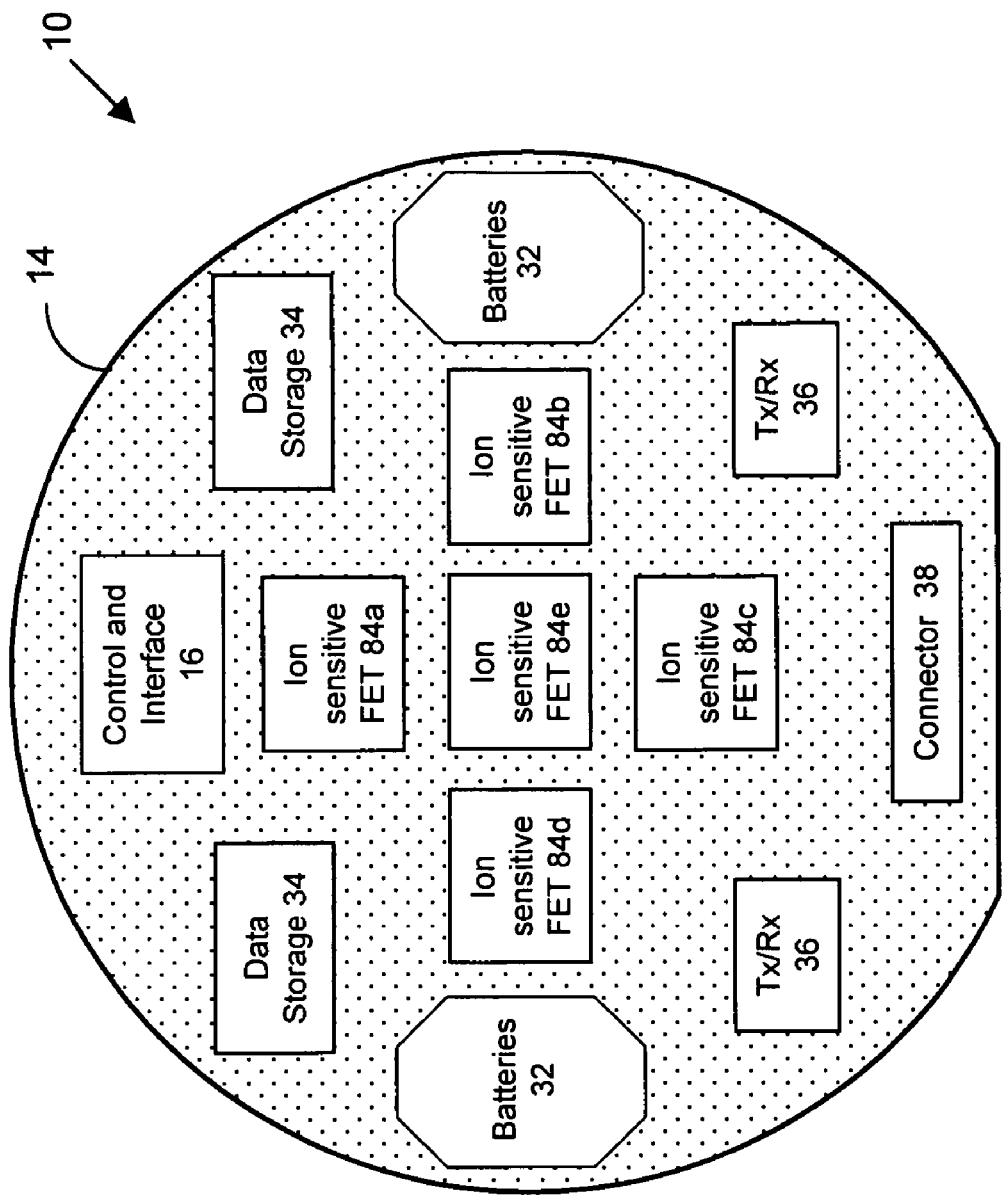
FIG. 20 is a block diagram representation of an EIW, including a plurality of ion sensitive FETs ("ISFETs"), according to several embodiments of the present invention.

In one embodiment of the present invention, chemical sensor 44 may be an ion sensitive field effect transistor. In this regard, with reference to FIG. 20, EIW 10 may include one or more ion sensitive field effect transistors 84 to sense, sample, detect, measure and/or monitor the concentration (activity level) of a particular ion in a solution. An ISFET is generally based on, or is similar or analogous in principal to, the enhancement mode metal-oxide-semiconductor field effect transistor (MOSFET) structure illustrated in FIG. 21.

Figure 21:
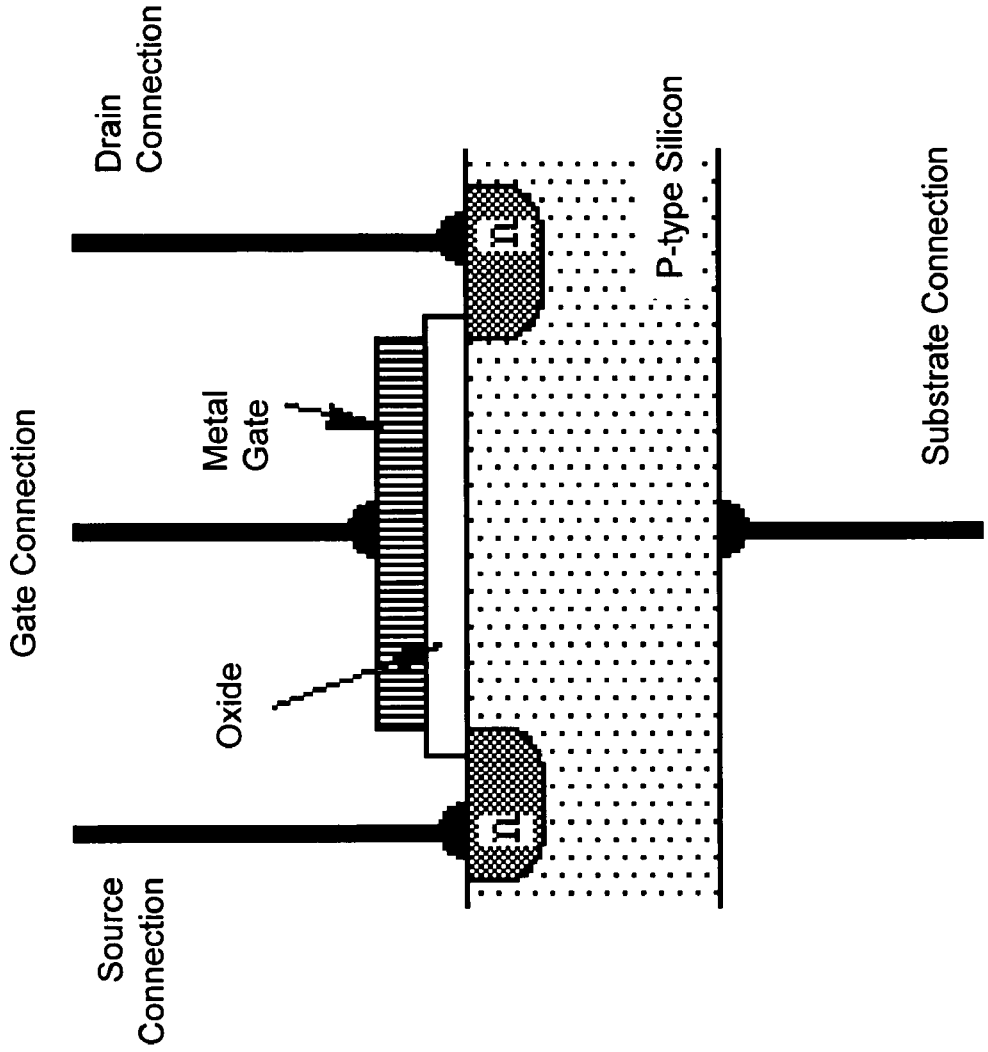
FIG. 21 is a cross-section view of an exemplary MOS-FET.

Briefly, by way of background and with reference to FIG. 21, a MOSFET includes a gate electrode, insulated from the semiconductor (silicon) wafer by a thin layer of silicon dioxide (oxide). The bulk of the semiconductor (i.e. the substrate) is doped with impurities to make it p-type silicon; in this material current is carried by positive charge carriers called holes (since they are, in fact, the absence of negatively charged electrons). On either side of the gate are small areas of silicon doped with impurities so that negatively charged electrons are the main carriers in these n-type silicon regions: the source and the drain; n-type and p-type silicon are used to form diodes; current will flow from p-type to n-type, but typically not the other way round. The bulk of the silicon substrate is connected to the most negative part of the circuit to prevent or limit the substrate's interference with the operation of the transistor (gate, drain, source).

In operation, a positive voltage is applied to the gate of the MOSFET. In response, holes from the region near the gate are repelled and electrons are attracted. This forms a narrow channel between the drain and source where the majority charge carriers are electrons. Current may then flow through this channel, the amount of current that flows depends on how large the channel is, and thus the voltage applied to the gate.

Figure 22:
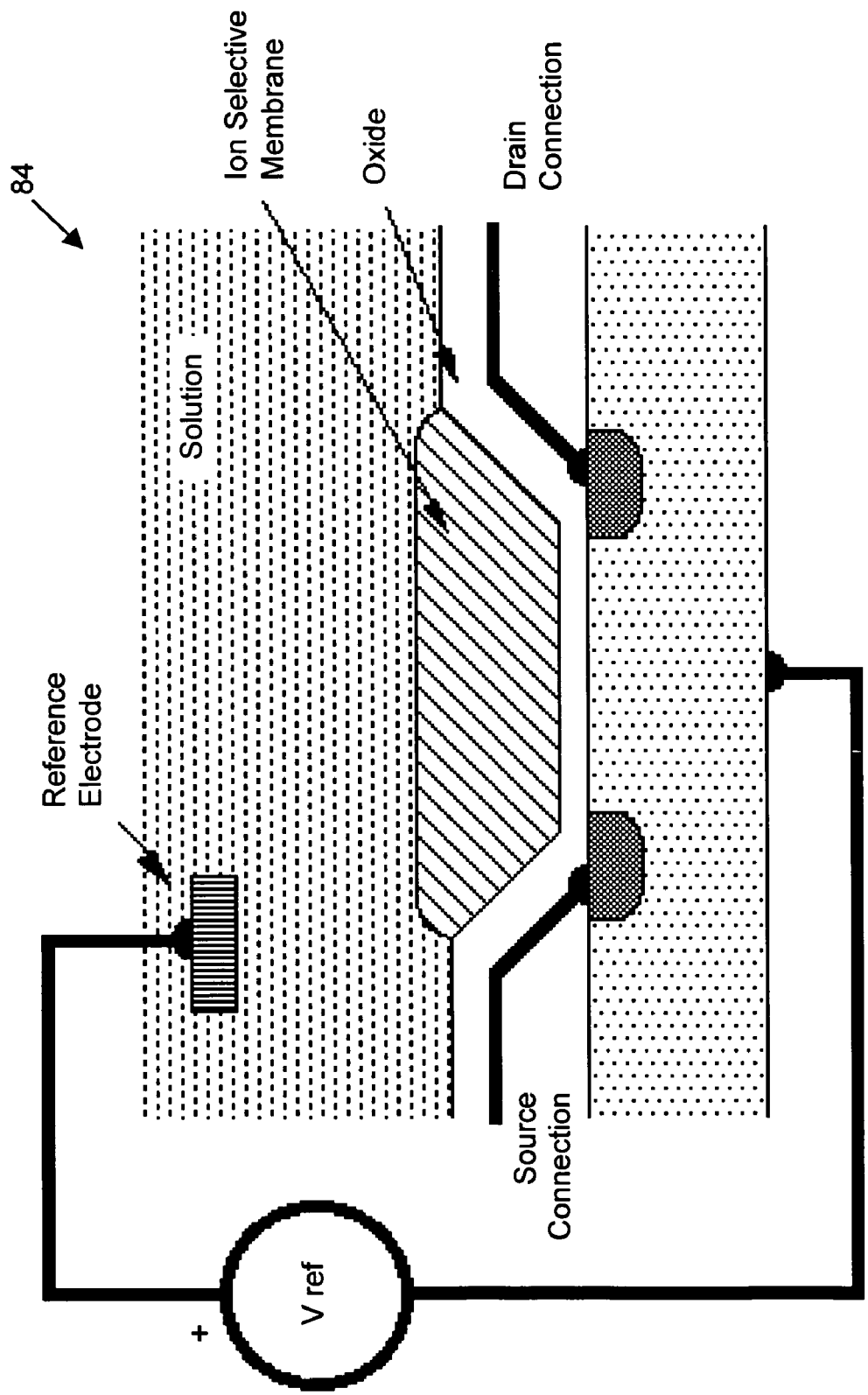
FIG. 22 is a schematic representation of an ISFET according to one embodiment of the present invention.

With reference to FIG. 22, ISFET 84 includes an ion selective membrane, a source and a drain. The gate of a MOSFET represents or is analogous to the ion selective membrane of the ISFET. The ISFET is immersed in a solution. Ions in the solution interact with the ion selective membrane. That is, when there is a high concentration of positive ions in the solution, a predetermined concentration of the positive ions will accumulate on or near the ion selective membrane, thereby forming a wide channel between the source and drain. With a low concentration of positive charged ions at or near the ion selective membrane, the channel will narrow due to the lower ion concentration.

In one embodiment, in order to ensure that the ISFET channel is biased to an optimum or sufficient size about which sensing may take place, the solution is maintained at a reference potential by a reference electrode. Generally, the reference potential is adjusted to maintain a constant current flowing from drain to source, so the ionic concentration will be directly related to the solution reference potential with respect to the substrate potential.

Notably, the ISFET 84 may be incorporated into or onto substrate 14 of EIW 10 to allow monitoring, sensing, sampling and/or detecting the ion concentration in a liquid solution, for example, wet-etching, resist development, and CMP processing.

MEMS Sensors/Structures and Techniques

MEMS sensors/structures may be employed to construct different type of sensors. It should be noted that many types of MEMS sensors/structures may be implemented on or in the EIW of the present invention. As such, all MEMS sensors/structures that may be integrated on or in an EIW, whether now known or later developed, are intended to fall within the scope of the present invention. For example, the MEMS sensors/structures described in Microsensors, MEMS and Smart Devices, Gardner et al., 2001 (which, as mentioned above, is incorporated by reference) may be implemented in the present invention.

Resonant Sensors

Figure 23:
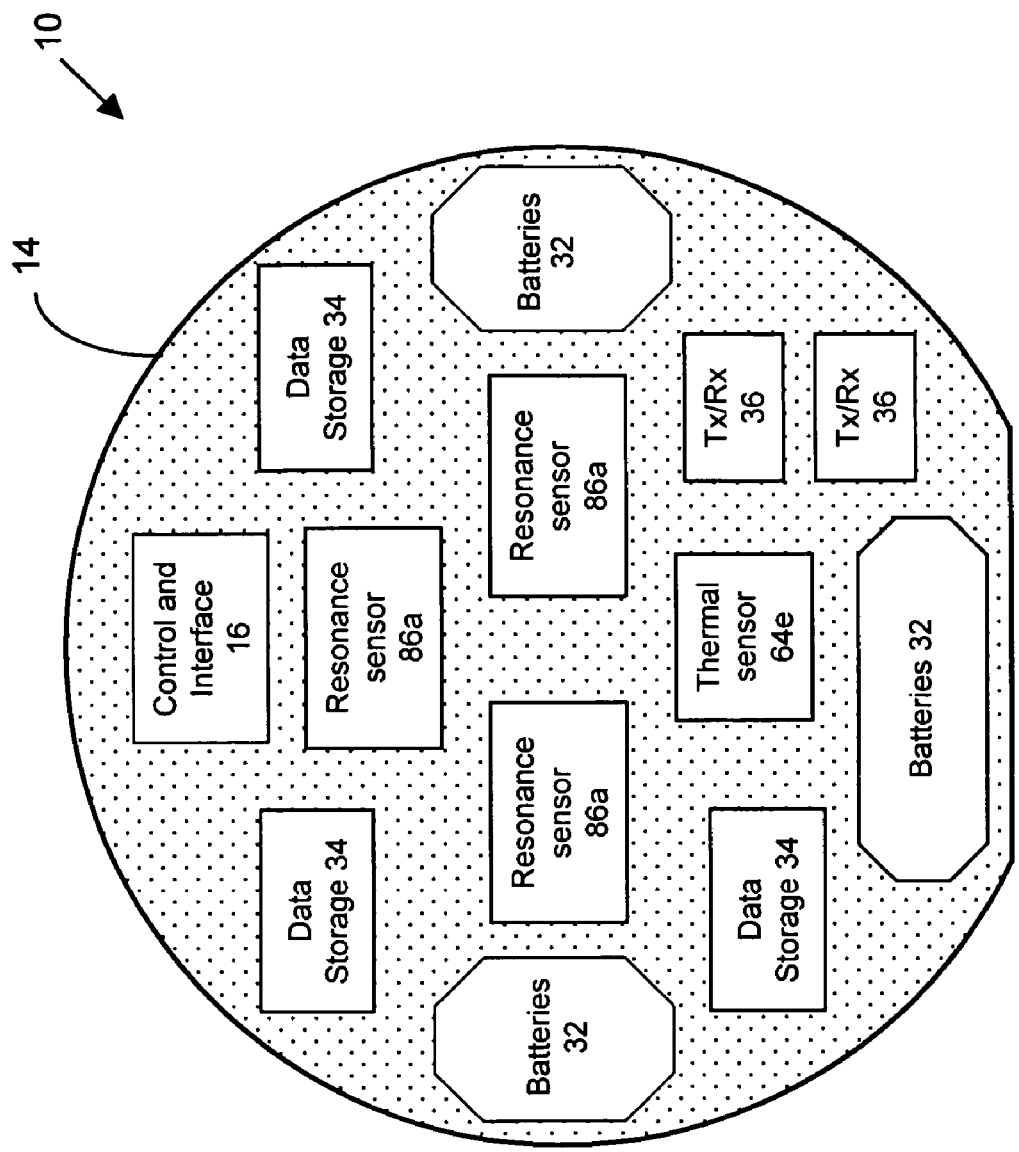
FIG. 23 is a block diagram representation of an EIW, including a plurality of resonant sensors, according to several embodiments of the present invention.

With reference to FIG. 23, in one embodiment of the present invention, EIW 10 may include one or more resonant sensors 86 to sense, sample, detect, measure and/or monitor the processing conditions in, for example, deposition processes. Briefly, by way of background, resonant sensors may be based on micromachined beams or bridges, which are driven to oscillate at their resonant frequency. Changes in the resonant frequency of the device may be monitored, detected and/or measured using, for example, implanted piezoresistors. Such changes may also be monitored, detected or measured using optical techniques as well.

Figure 24B:
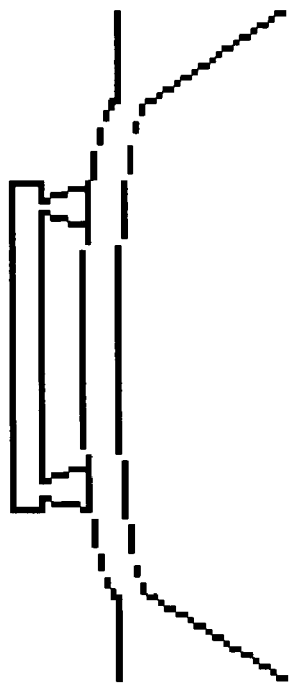
FIGS. 24A and 24B are cross-sectional views of resonance sensors according to certain embodiments of the present invention.
Figure 24A:
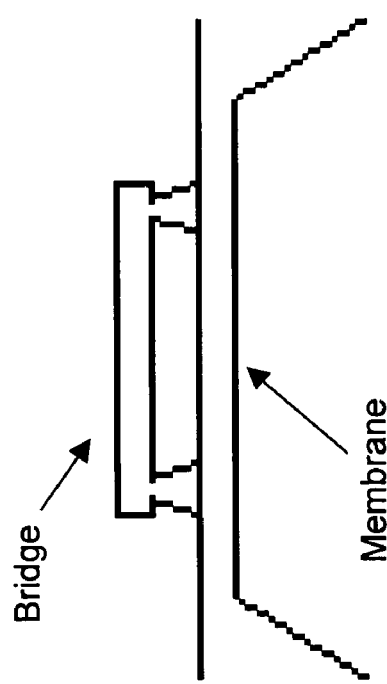

With reference to FIG. 24A, the resonant frequency of the bridge, which is driven to resonance on a thin membrane, is related to, for example, the force applied to it (between anchor points), its length, thickness, width, its mass, and the modulus of elasticity of the material from which it has been fabricated. In those instances where the membrane is deformed (see, for example, FIG. 24B), there is greater pressure on one side of the bridge than the other. As such, the force applied to the bridge changes and, as a result, the resonant frequency of the bridge changes. Therefore, resonant sensors may be employed to monitor deposition processes, wherein the deposited material on the bridge will change the bridge's mass, and hence change its resonance frequency, thereby allowing monitoring of, for example, the thickness of the deposited material.

Surface Acoustic Wave (SAW) Based Sensors and Actuators

Figure 25:
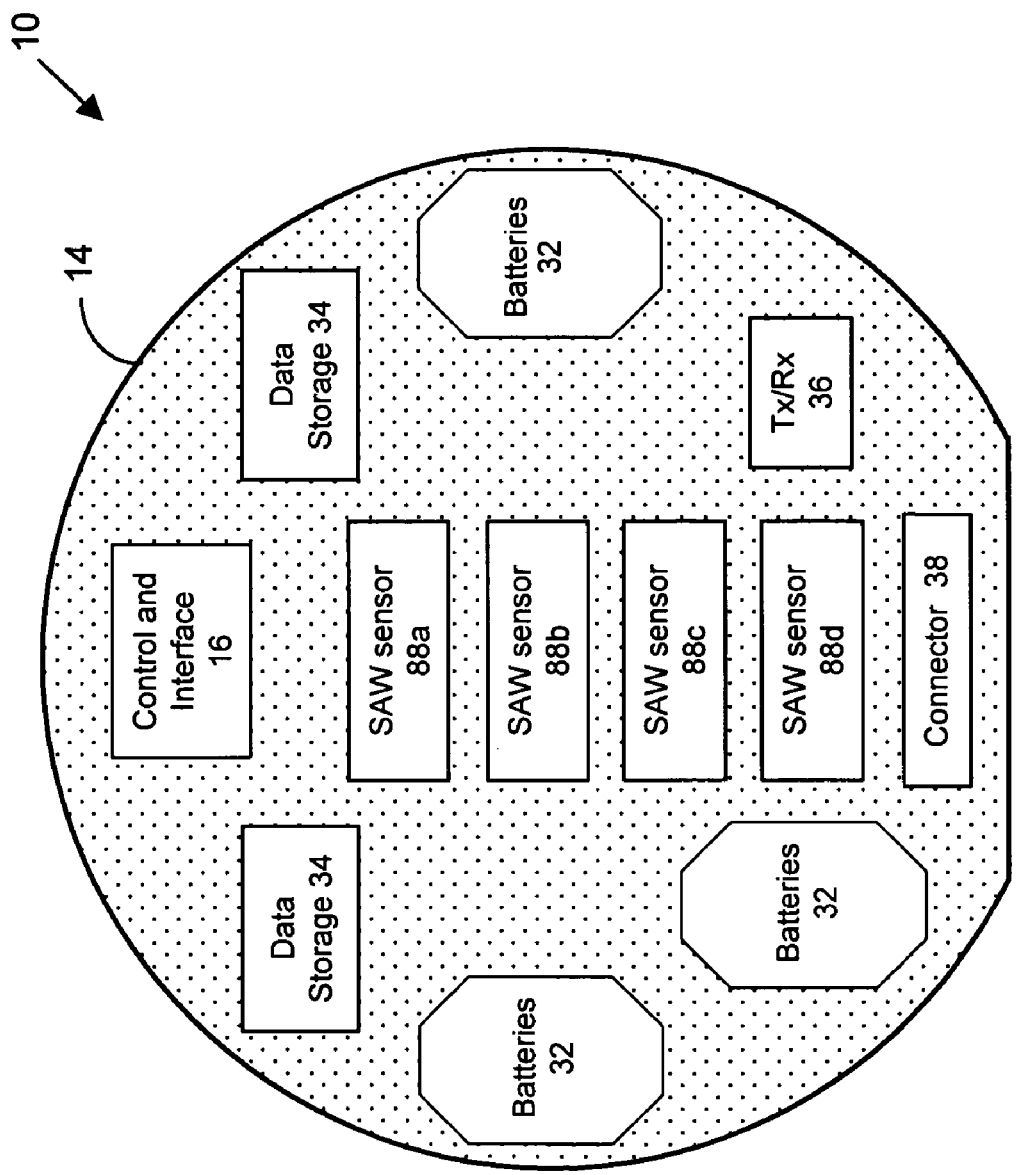
FIG. 25 is a block diagram representation of an EIW, including a plurality of SAW sensors, according to several embodiments of the present invention.

With reference to FIG. 25, in one embodiment of the present invention, EIW 10 may include one or more SAW sensors 88 to sense, sample, detect, measure and/or monitor the temperature, radiation and/or viscosity of materials and/or substrate 14 during a given process. Briefly, a surface acoustic wave is typically generated by radio frequency electrical signals via piezoelectric effects. There are many different sensors designed and built to sense different parameters detectable by SAW sensors 88. SAW sensors may be implemented using MEMS techniques and readily integrated into or onto EIW 10. SAW sensors 88 may be designed to sense parameters including, but not limited to, temperature, radiation and/or viscosity. A detailed discussion of SAW sensors may be found in, for example, Microsensors, MEMS and Smart Devices, Gardner et al., 2001, which, as mentioned above, is incorporated by reference.

It should be further noted that the electrical power supply techniques and circuitry, as well as the communications link, techniques and circuitry, discussed above are fully applicable to this embodiment of the present invention. For the sake of brevity, those discussions will not be repeated.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present invention.

Moreover, it should be noted that while the present invention(s) is described generally in the context of integrated circuit fabrication, the present invention(s) may be implemented in processes to manufacture other devices, components and/or systems including, for example, hard disk drives, magnetic thin-film heads for hard disk drives, flat panel displays, printed circuit board. Indeed, the present invention(s) may be employed in the fabrication of any devices, components and/or systems, whether now known or later developed, that may benefit from the present invention(s).

In addition, an EIW according to the present invention may include one, some or all of the sensors and/or sources described herein. Moreover, an EIW according to the present invention may include one or more of the same or different sensors and/or sources (and associated electronics). Indeed, implementing one type of sensor may provide information that permits or facilitates detection, sampling, measuring, and/or monitoring of more than one parameter (for example, temperature, pressure and/or fluid flow rate). Thus, all combinations and/or permutations of sensors and/or sources are intended to be within the scope of the inventions.

An EIW according to the present invention may include sensors and/or sources that are integrated into or onto the substrate, or disposed thereon (in the form of discrete devices), or combinations thereof. For example, an EIW, according to one embodiment of the present invention, may include an integrated pressure sensor(s) and discrete optical sensor(s).

Further, an EIW according to the present invention may be configured to simultaneously or serially sense, sample, detect, measure, and/or monitor information on the processing environment and/or processing progress during fabrication. For example, an EIW, according to one embodiment of the present invention, may (simultaneously or serially) detect, sample, measure, and/or monitor temperature and pressure using the same sensor or a plurality of the same or different sensors (one or more of the same or different sensors dedicated to temperature and one or more of the same or different sensors dedicated to pressure). In this way, such an EIW, addresses temperature and pressure operating parameters, which may be two critical processing conditions for certain processing steps.

Moreover, an EIW according to the present invention may be programmed to provide the sensed, sampled and/or detected data which is representative of, for example, the processing environment during the actual process, thereafter, or a combination thereof. For example, an EIW according to one embodiment of the present invention may detect, sample, measure, and/or monitor temperature and pressure of a given process using (1) a temperature sensor (or plurality of temperature sensors) that store data in the resident storage devices for later transmission and (2) a pressure sensor (or plurality of pressure sensors) that transmit data to an external device in real-time or near real-time. In this way, such an EIW, may provide certain critical information regarding a first operating parameter (for example, pressure) immediately (i.e., in real-time) while a second operating parameter (for example, temperature) is provided thereafter. Indeed, critical information regarding multiple parameters may be provided in real-time (or near real-time) while other parameters are provided after completion of the process under investigation.

Notably, the embodiments of the system, device, and components thereof (for example, the electrical source and communications layout, circuitry and techniques), as well as the methods, applications and/or techniques, that are described and illustrated in the '806 application, are incorporated by reference herein. For the sake of brevity, those descriptions and illustrations are not repeated herein.

Finally, it should be noted that the term "circuitry" or "electronics" may mean a circuit (whether integrated or otherwise), a group of such circuits, a processor(s), a processor(s) implementing software, or a combination of a circuit (whether integrated or otherwise), a group of such circuits, a processor(s) and/or a processor(s) implementing software. The term "circuit" may mean either a single component or a multiplicity of components, either active and/or passive, which are coupled together to provide or perform a desired function. The term "data" may mean a current or voltage signal(s) whether in an analog or a digital form. The phrases "to sample" or "sample(s)" or the like, may mean, among other things, to record, to measure, to detect, to monitor, and/or to sense.

What is claimed is:

1. A sensor unit for sensing an illumination parameter of photolithographic processing equipment that includes a mask stage and an illumination subsystem, the sensor unit comprising:
a substrate adapted to be disposed on or in the mask stage of the photolithographic processing equipment; and
a plurality of sensors including:
a first sensor, disposed on or in the substrate, to sample a light intensity of the illumination subsystem when the substrate is disposed on or in the mask stage; and
a second sensor, disposed on or in the substrate, to sample a light intensity of the illumination subsystem when the substrate is disposed on or in the mask stage.

2. The sensor unit of claim 1 wherein the first and second sensors responsively, continuously or periodically sample the light intensity of the illumination subsystem, respectively, while the sensor unit is disposed in the photolithographic processing equipment and undergoing processing.

3. The sensor unit of claim 1 further including at least one battery, disposed on or in the substrate, to provide electrical power to the first and second sensors.

4. The sensor unit of claim 1 further includes a data storage to store data which is representative of the light intensity sampled by the first and second sensors.

5. The sensor unit of claim 1 further including:
a data storage device to store data which is representative of the light intensity sampled by the first and second sensors;
communication circuitry, coupled to the data storage device, to provide the data which is representative of the sampled light intensity of the illumination subsystem to external circuitry; and
a power source, coupled to the first and second sensors and the data storage device, to provide electrical power to the first and second sensors and the data storage device.

6. The sensor unit of claim 1 further including a controller, coupled to the first and second sensors, to control when the first and second sensors sample the light intensity of the illumination subsystem.

7. The sensor unit of claim 1 further including a controller to determine a light intensity distribution of the illumination subsystem using the light intensity of the illumination subsystem sampled by the first and second sensor.

8. The sensor unit of claim 1 further including a controller to generate control signals to change the light intensity of the illumination subsystem of the photolithographic processing equipment in response to the light intensity of the illumination subsystem sampled by the first and second sensor.

9. A sensor unit for sensing an illumination parameter of photolithographic processing equipment that includes a mask stage and an illumination subsystem, the sensor unit comprising: a substrate adapted to be disposed on or in the mask stage of the photolithographic processing equipment; an array of light sensors, disposed on or in the substrate, to sample a light intensity of the illumination subsystem when the substrate is disposed on or in the mask stage; a controller to generate control signals to change the light intensity of the illumination subsystem of the photolithographic processing equipment in response to the light intensity of the illumination subsystem sampled by the array of light sensors; communication circuitry, coupled to the controller, to provide the control signals that change the light intensity of the illumination subsystem to external circuitry; and a power source, coupled to the array of light sensors, the controller and the communication circuitry, to provide electrical power to the array of light sensors, the controller and the communication circuitry.

10. The sensor unit of claim 9 further including a data storage device to store data which is representative of the light intensity sampled by the array of light sensors.

11. The sensor unit of claim 9 wherein the power source is at least one battery.

12. The sensor unit of claim 9 wherein the controller determines a light intensity distribution of the illumination subsystem using the light intensity sampled by the array of light sensors.

13. The sensor unit of claim 9 further including a temperature sensor, disposed on or in the substrate, to sample a temperature during operation of the photolithographic processing equipment.

14. The sensor unit of claim 9 further including a plurality of temperature sensors, disposed at a plurality of locations on or in the substrate, to sample a temperature at the plurality of locations during the operation of the photolithographic processing equipment.

15. A sensor unit for sensing an illumination parameter of photolithographic processing equipment that includes a mask stage and an illumination subsystem, the sensor unit comprising: a substrate adapted to be disposed on or in the mask stage of the photolithographic processing equipment; an array of light sensors, disposed on or in the substrate, to sample a light intensity of the illumination subsystem when the substrate is disposed on or in the mask stage; a controller to control when the array of light sensors sample the light intensity of the illumination subsystem; and a power source, coupled to the array of light sensors and the controller, to provide electrical power to the array of light sensors and the controller.

16. The sensor unit of claim 15 wherein the controller generates control signals to change the light intensity of the illumination subsystem of the photolithographic processing equipment in response to the light intensity of the illumination subsystem sampled by the array of light sensors.

17. The sensor unit of claim 15 wherein the controller determines a light intensity distribution of the illumination subsystem using the light intensity of the illumination subsystem sampled by the array of light sensors.

18. The sensor unit of claim 15 wherein the power source is at least one battery.

19. The sensor unit of claim 15 further including a plurality of temperature sensors, disposed at a plurality of locations on or in the substrate, to sample a temperature at the plurality of locations during the operation of the photolithographic processing equipment.

20. The sensor unit of claim 15 further including a data storage device to store data which is representative of the light intensity sampled by the array of light sensors.

21. The sensor unit of claim 20 further including communication circuitry, coupled to the data storage device, to provide the data which is representative of the light intensity sampled by the array of light sensors to external circuitry.

22. The sensor unit of claim 21 wherein the communication circuitry provides the data to external circuitry during operation of the photolithographic processing equipment.

* * * * *